United States Patent
Cheng et al.

(10) Patent No.: US 11,937,478 B2
(45) Date of Patent: Mar. 19, 2024

(54) MULTI-COLORED MICROCAVITY OLED ARRAY HAVING DBR FOR HIGH APERTURE DISPLAY AND METHOD OF FABRICATING THE SAME

(71) Applicant: Avalon Holographics Inc., St. John's (CA)

(72) Inventors: Jiaqi Cheng, St. John's (CA); Jordan Peckham, Portugal Cove-St. Philips (CA)

(73) Assignee: Avalon Holographics Inc., St. John's (CA)

( * ) Notice: Subject to any disclaimer, the term of this patent is extended or adjusted under 35 U.S.C. 154(b) by 325 days.

(21) Appl. No.: 17/378,300

(22) Filed: Jul. 16, 2021

(65) Prior Publication Data
US 2023/0019355 A1    Jan. 19, 2023

(51) Int. Cl.
*H10K 59/30*    (2023.01)
*H10K 50/852*   (2023.01)
*H10K 71/00*    (2023.01)
*H10K 59/12*    (2023.01)

(52) U.S. Cl.
CPC ........... *H10K 59/30* (2023.02); *H10K 50/852* (2023.02); *H10K 71/00* (2023.02); *H10K 59/12* (2023.02); *H10K 59/1201* (2023.02)

(58) Field of Classification Search
CPC ....... H10K 59/30; H10K 71/00; H10K 50/852
See application file for complete search history.

(56) References Cited

U.S. PATENT DOCUMENTS

| | | |
|---|---|---|
| 6,366,017 B1 | 4/2002 | Antoniadis et al. |
| 7,510,455 B2 | 3/2009 | Suzuki |
| 10,133,136 B2 | 11/2018 | Guo |
| 10,333,106 B2 | 6/2019 | Ohsawa et al. |
| 10,340,480 B1 | 7/2019 | Peckham |
| 10,468,622 B2 | 11/2019 | Shin et al. |
| 10,748,881 B2 * | 8/2020 | Kim .................. H01L 25/0756 |
| 10,790,473 B2 | 9/2020 | Park et al. |
| 2005/0249972 A1 | 11/2005 | Hatwar et al. |
| 2005/0280362 A1 | 12/2005 | Shore et al. |
| 2008/0111474 A1 | 5/2008 | Sung et al. |
| 2009/0078945 A1 | 3/2009 | Koo |
| 2010/0053043 A1 | 3/2010 | Sakamoto |
| 2010/0187988 A1 | 7/2010 | Forrest et al. |
| 2014/0191202 A1 | 7/2014 | Shim et al. |
| 2017/0243928 A1 | 8/2017 | Yang |
| 2017/0279069 A1 | 9/2017 | Guo et al. |
| 2019/0198816 A1 | 6/2019 | Park et al. |

(Continued)

FOREIGN PATENT DOCUMENTS

CN          103441136 A    12/2013

Primary Examiner — Michael Jung

(57) ABSTRACT

A microcavity pixel design and fabrication method for an organic light emitting diode (OLED) array with a high aperture ratio suitable for a light field display. This is achieved by laterally overlapping intermediate electrodes and optical filler layers, reducing the lateral spacing. The OLED layers in the design have a uniform white OLED stack, allowing each layer to be deposited across the OLED array, simplifying fabrication. The optical path length for each subpixel's optical microcavity is optimized through the thickness of the optical filler layers, allowing the white OLED stack to be uniform, reducing fabrication complexities.

24 Claims, 34 Drawing Sheets

(56) References Cited

U.S. PATENT DOCUMENTS

| | | |
|---|---|---|
| 2020/0144548 A1 | 5/2020 | Xia |
| 2020/0153204 A1* | 5/2020 | Hatzilias ............. H01S 5/18347 |
| 2020/0287165 A1 | 9/2020 | Peckham et al. |
| 2021/0057670 A1 | 2/2021 | Wong et al. |
| 2021/0091269 A1* | 3/2021 | Oszinda .................. H01L 33/38 |
| 2022/0037415 A1* | 2/2022 | Lin ........................ H10K 71/00 |
| 2022/0140018 A1 | 5/2022 | Liu et al. |
| 2022/0262981 A1* | 8/2022 | Shakoor ................ H01L 33/005 |

* cited by examiner

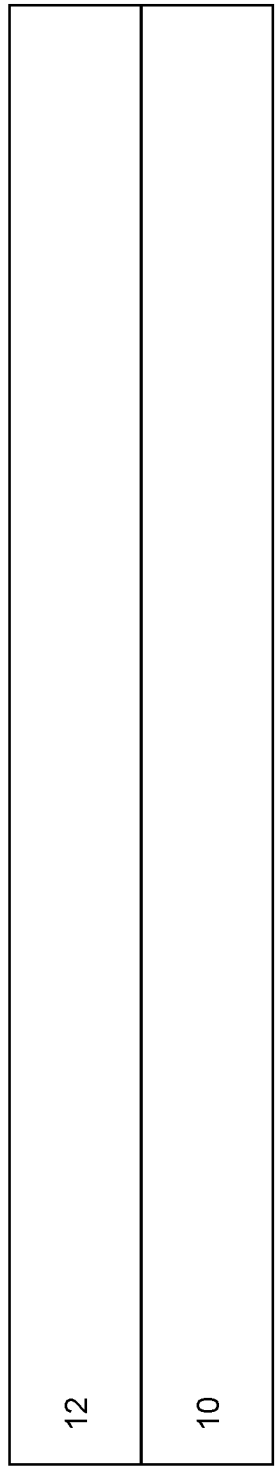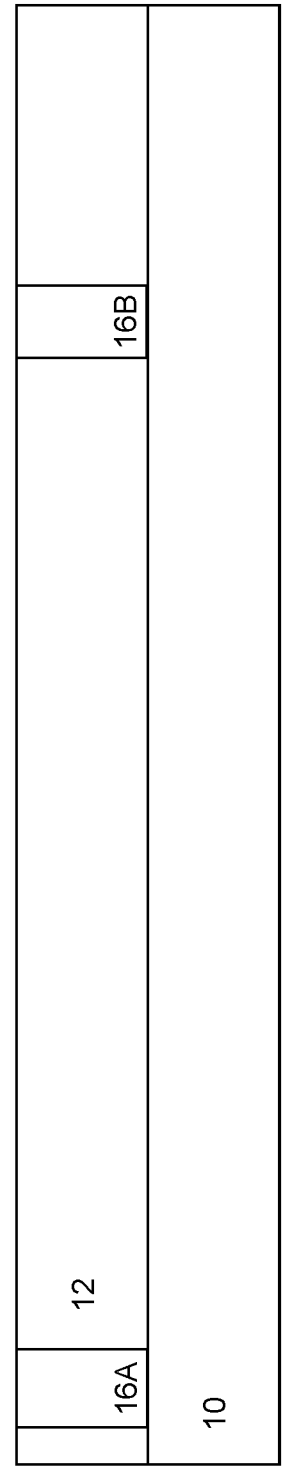
FIG. 10A
FIG. 10B

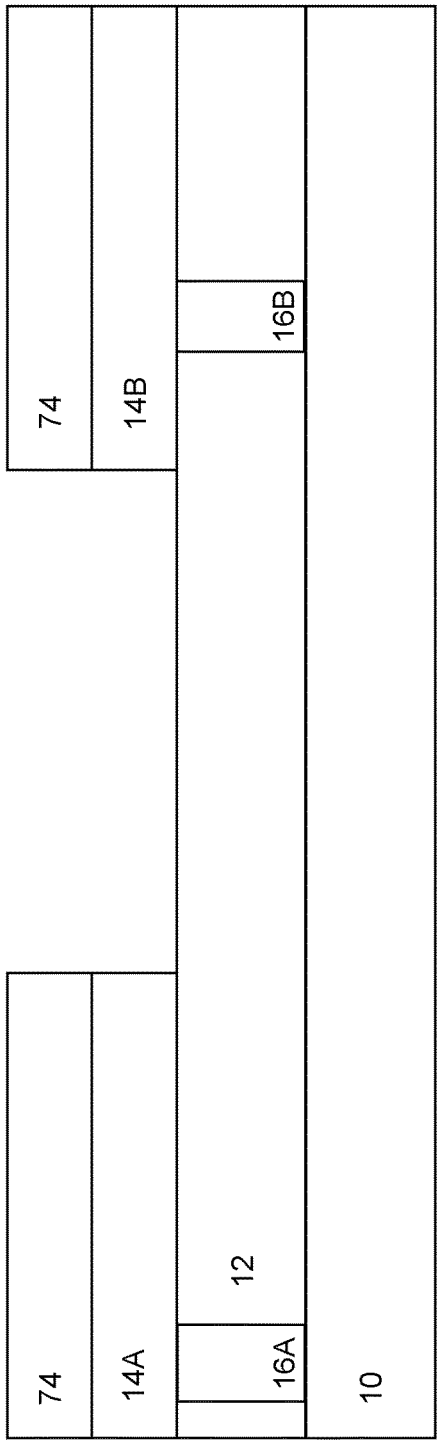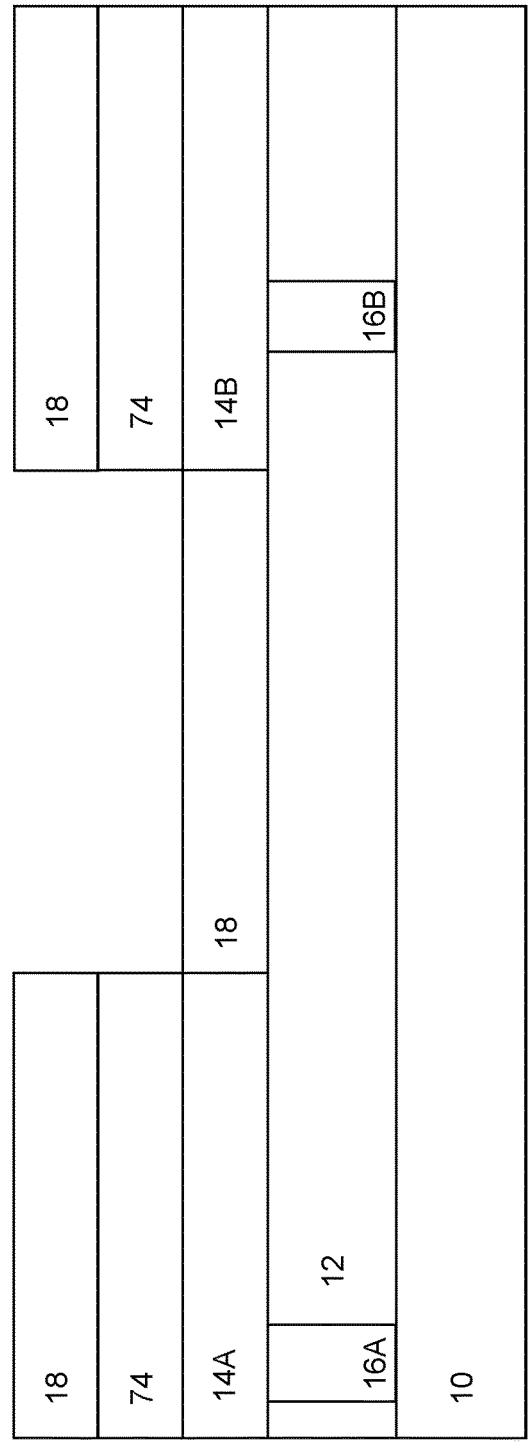
FIG. 10E
FIG. 10F

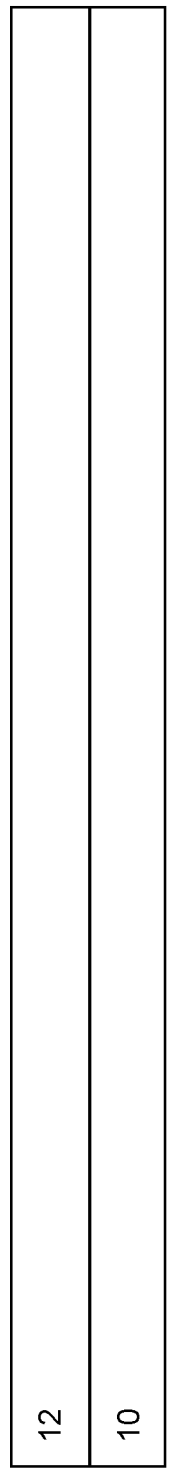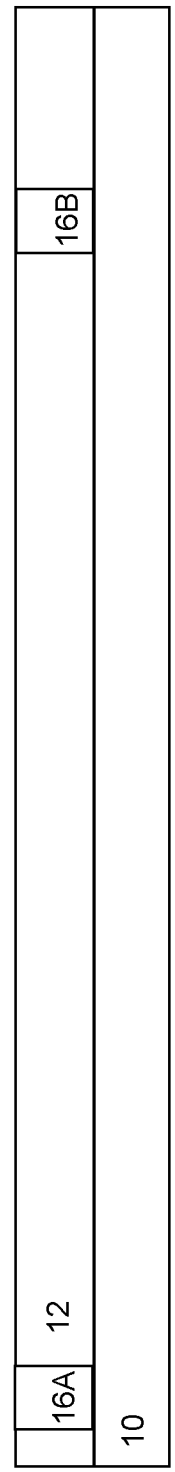
FIG. 11A
FIG. 11B

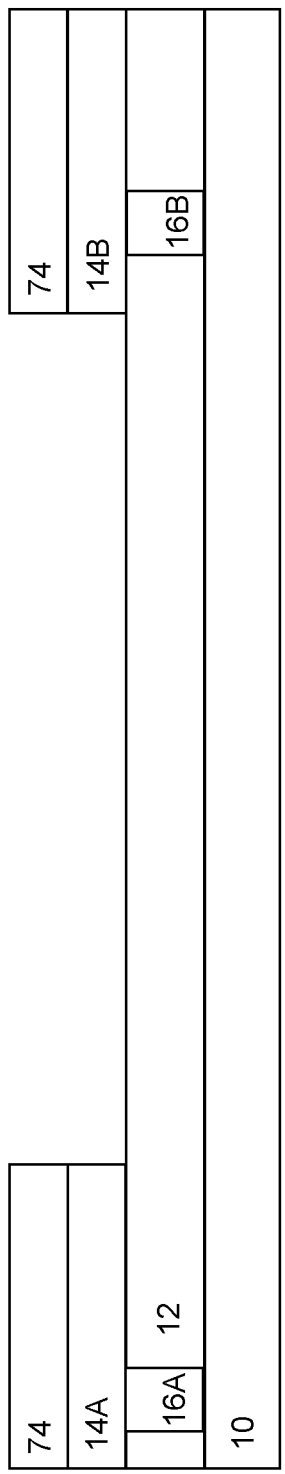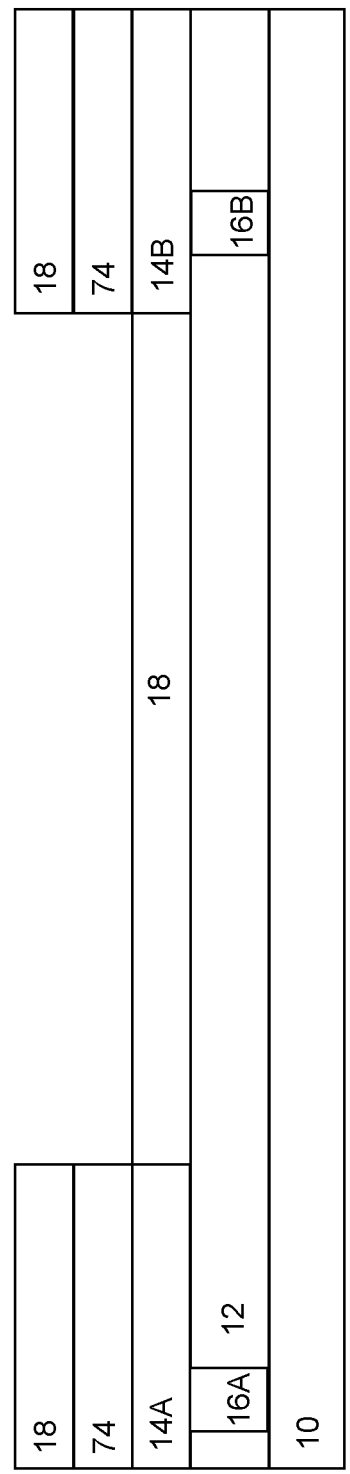

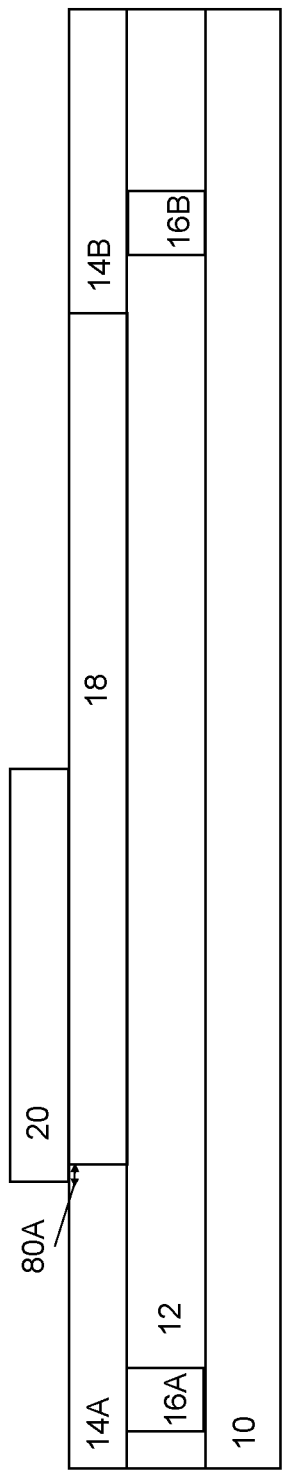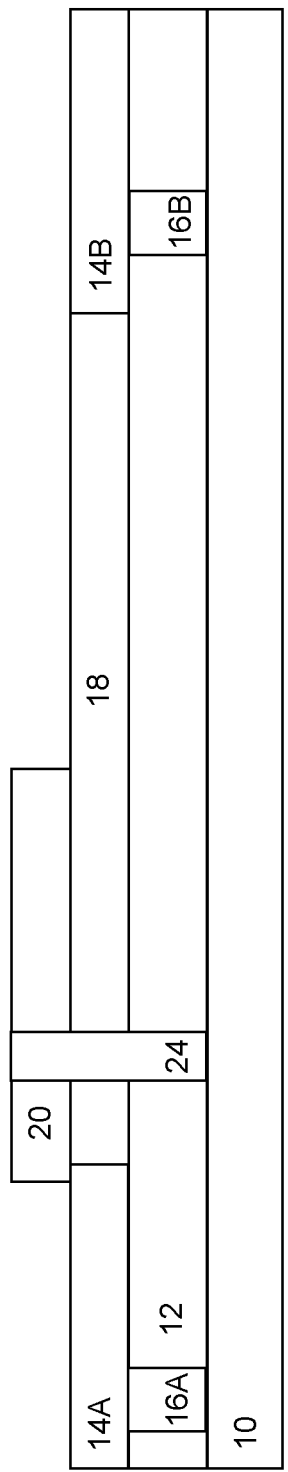
FIG. 11I
FIG. 11J

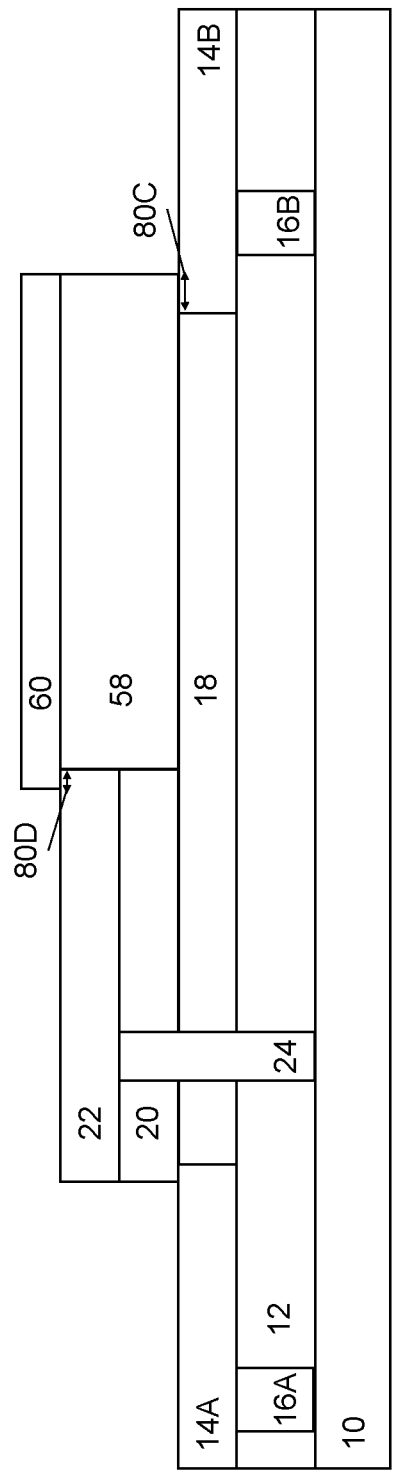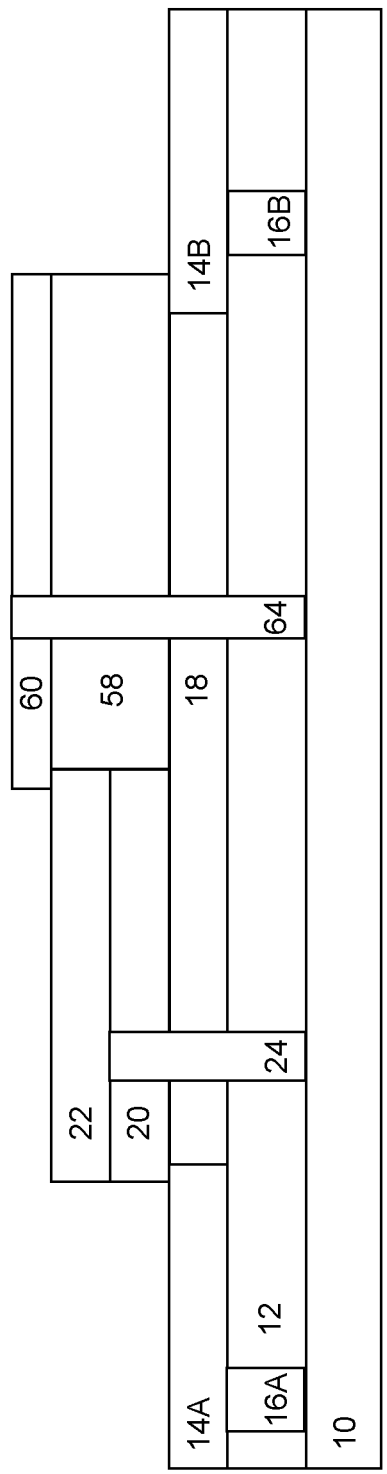

FIG. 11T

MULTI-COLORED MICROCAVITY OLED ARRAY HAVING DBR FOR HIGH APERTURE DISPLAY AND METHOD OF FABRICATING THE SAME

FIELD OF THE INVENTION

The present disclosure relates to a patterning design and fabrication method for an organic light emitting diode (OLED) device with a high aperture ratio, suitable for a light field display.

BACKGROUND OF THE INVENTION

Light field displays provide multiple views, allowing a user to receive a separate view in each eye. While current displays in this category provide an interesting viewing experience, a captivating light field display requires a very high pixel density, very low angular separation between views, and a large viewing angle. It is desired that a user experiences smooth transitions between viewing zones, while maintaining an independent and perceivable view from the adjacent views. A fundamental requirement in achieving these viewing parameters is controlling the output characteristics of the emission source. Organic light-emitting diodes (OLEDs) bound in a microcavity allow control of the spectral bandwidth and output angle of the resulting light.

One method for controlling the output characteristics of light is through the use of a microcavity. A microcavity is formed between two mirrors or reflective surfaces, which can be, for example, a metal anode, a metal cathode, or a layered stack of non-absorbing materials, which can be a distributed Bragg reflector (DBR). The mirror serves to reflect light in a range of wavelengths while generally preserving the physical characteristics of the incident light. Two main design variables affecting the output characteristics of a microcavity are the reflectance of the top and bottom surfaces (i.e. opposing mirrors) and the optical path length, A. The wavelength of the light output by such an OLED structure is dependent, in part, upon the optical path length of the microcavity. The optical path length can be manipulated by adjusting the thickness and/or number of the layers that comprise the microcavity.

When manufacturing OLEDs at the size suitable for a light field display, challenges arise when depositing organic layers separately to achieve the thickness required for each color's desired optical path length. One challenge for manufacturing OLEDs that are suitable for a light field display is to achieve a high aperture ratio with pixels smaller than 10 μm using available manufacturing capabilities. The aperture ratio of a pixel is the ratio of the light emitting area of the pixel to the total area of the display. A high aperture ratio can be achieved by maximizing the light emitting area of each pixel on the display. This decreases gaps in the display area, thereby increasing the image quality of the light field display. It is particularly challenging to achieve a high aperture ratio when fabricating high resolution displays with small pixel sizes.

United States Patent Application Publication US2021/0057670 to Wong et al. describes an array of light-emitting OLED pixels. The pixels disclosed use multiple transparent, or substantially transparent, dielectric layers on each anode. The thicknesses of the dielectric layers are designed to optimize emission of the desired color of light for that pixel. The white OLED layers are formed in a single deposition step for the OLED array, and the lateral spacing between each anode results in a reduced aperture ratio.

U.S. Pat. No. 10,790,473 to Park et al. describes an OLED device designed to achieve a high aperture ratio. The high aperture ratio is achieved by first connecting the reflecting electrode and transparent electrode of the anode at the corner of the subpixel regions. Each subpixel has a microcavity structure, minimizing the pixel defining layer between subpixels. The spacing between the subpixels is not preferable for a light field display as the light emitting area for the display is not maximized.

High aperture ratios are preferred for near eye displays, such as virtual reality (VR) displays, augmented reality (AR) displays, micro displays, and light field displays. There remains a need for a micron sized OLED pixel array design and method of fabrication that achieves a high aperture ratio at a high display resolution suitable for a light field display.

This background information is provided for the purpose of making known information believed by the applicant to be of possible relevance to the present invention. No admission is necessarily intended, nor should be construed, that any of the preceding information constitutes prior art against the present invention.

SUMMARY OF THE INVENTION

It is an object of the present disclosure to provide an optical microcavity pixel device comprising an organic light emitting diode (OLED) and a photolithography patterning method that achieves a micron sized pixel that when patterned in an array achieves an aperture ratio greater than 70%. It is another object of the present disclosure to provide a method of OLED array patterning that is capable of producing a light field display with a resolution greater than 1,000 ppi (pixels per inch). The optical microcavity pixel array comprises a distributed Bragg reflector (DBR) on a substrate and two or more subpixels comprising a semi-transparent or fully transparent electrode, and a series of semi-transparent or fully transparent optical filler layers. It is another object of the present disclosure to provide an optical microcavity pixel design structure wherein semi-transparent or fully transparent electrodes arranged on the DBR have a lateral overlap to reduce lateral spacing, which increases the aperture ratio of the light field display. Limiting, reducing, or eliminating the lateral spacing between the colored electrodes can be achieved using a layered series of semi-transparent or fully transparent filler layers interposed between the overlapping electrodes of a first and second color, a second and third color, a first and third color, or any combination thereof. The filler layer thickness is designed to tune the optical cavity of each pixel, thereby dictating the color generated by the optical microcavity pixel device. It is another object of the present disclosure to provide a method to reduce the complexity of the fabrication process of a high aperture OLED array.

In an aspect there is provided an organic light emitting diode device comprising: a substrate; a distributed Bragg reflector (DBR) on the substrate; a first color electrode on the DBR defining a first color microcavity, the first color electrode connected to the substrate through a first via; a first optical filler layer on the DBR adjacent the first color electrode; a second optical filler layer on the first optical filler layer and partially overlapping the first color electrode at an overlap region; a second color electrode on the second optical filler layer defining a second color microcavity, the second color electrode connected to the substrate through a second via; a white organic light emitting diode (OLED)

stack on top of the first color electrode and the second color electrode; and a top electrode on top of the white OLED stack.

In an embodiment, the second color electrode partially overlaps the first color electrode.

In another embodiment, the first color microcavity has a first color optical path length between the DBR and the top electrode through the first color electrode and the second color microcavity has a second color optical path length between the DBR and the top electrode through the second color electrode.

In another embodiment, the first color optical path length and the second first color optical path length are tuned to provide desired first color and second color pixels, respectively.

In another embodiment, the first optical filler layer and the second optical filler layer comprises a transparent polymer.

In another embodiment, the first optical filler layer and the second optical filler layer comprises a transparent inorganic dielectric.

In another embodiment, the device further comprises a pixel definition layer insulating the first color electrode from the second color electrode.

In another embodiment, the pixel definition layer comprises one or more of an inorganic insulating dielectric and an organic material.

In another embodiment, the substrate is a thin film transistor (TFT) substrate.

In another embodiment, the device further comprises a second DBR on top of the top electrode.

In another embodiment, the top electrode is a cathode and the bottom electrode is an anode.

In another embodiment, the top electrode is an anode and the bottom electrode is a cathode.

In another embodiment, the device further comprises, on top of the second color electrode and under the white OLED stack: a third optical filler layer on the first optical filler layer defining a third color microcavity; a fourth optical filler layer on the third optical filler layer, the fourth optical filler layer partially overlapping the second color electrode; and a third color electrode on the fourth optical filler layer and partially overlapping the second color electrode, the third color electrode connected to the substrate through a third via.

In another aspect there is provided a method for fabricating a multi-colored microcavity organic light emitting diode (OLED) array, the method comprising: depositing a distributed Bragg reflector (DBR) on a substrate; depositing a first color electrode on the DBR defining a first color microcavity, the first color electrode connected to the substrate through a first via; depositing a first optical filler layer on the DBR adjacent the first color electrode; depositing a second optical filler layer on the first optical filler layer partially overlapping the first color electrode at an overlap region; depositing a second color electrode on the second optical filler layer defining a second color microcavity, the second color electrode connected to the substrate through a second via; depositing a white organic light emitting diode (OLED) stack on top of the first color electrode and the second color electrode; and depositing a top electrode on top of the white OLED stack.

In an embodiment of the method, the white OLED stack is deposited over the entire OLED array.

In another embodiment of the method, the white OLED stack is deposited using thermal evaporation, spin casting, or inkjet printing.

In another embodiment of the method, the top electrode is deposited using thermal evaporation or sputtering.

In another embodiment, the method further comprises depositing a pixel definition layer insulating the first color electrode from the second color electrode.

In another embodiment of the method, the pixel definition layer is deposited using sputtering, spin coating, thermal evaporation, chemical vapor deposition, atomic layer deposition, or spin casting.

In another embodiment, the method further comprises depositing a second DBR on the top electrode.

In another embodiment of the method, the first color electrode, the second color electrode, and the top electrode are deposited using sputtering, thermal evaporation, or spin coating.

In another embodiment of the method, the first optical filler layer and the second optical filler layer are deposited using sputtering, thermal evaporation, chemical vapor deposition, or atomic layer deposition.

In another embodiment of the method, the DBR is deposited using sputtering, thermal evaporation, chemical vapor deposition, or atomic layer deposition.

In another embodiment, the method further comprises, prior to depositing the white OLED stack: depositing a third optical filler layer selected for a third color on top of the first optical filler layer, the third optical filler layer overlapping the first color electrode; depositing a fourth optical filler layer selected for a third color on top of the third optical filler layer, the fourth optical filler layer overlapping the second color electrode; and depositing a series of third color electrodes on the fourth optical filler layer.

BRIEF DESCRIPTION OF THE DRAWINGS

These and other features of the invention will become more apparent in the following detailed description in which reference is made to the appended drawings.

FIG. 10A illustrates step 1 of the proposed two color OLED array patterning process for depositing a DBR.

FIG. 10B illustrates step 2 of the proposed two color OLED array patterning process for forming vias for the first color electrode through the DBR.

FIG. 10E illustrates step 5 of the proposed two color OLED array patterning process for a photolithography step, which partially exposes the embodiment to UV light thereby partially removing the photoresist through etching.

FIG. 10F illustrates step 6 of the proposed two color OLED array patterning process for depositing a first optical filler layer.

FIG. 11A illustrates step 1 of the proposed three color OLED array patterning process for depositing a DBR.

FIG. 11B illustrates step 2 of the proposed three color OLED array patterning process for forming vias for the first color electrode through the DBR.

FIG. 11E illustrates step 5 of the proposed three color OLED array patterning process for a photolithography step, which partially exposes the embodiment to UV light thereby partially removing the photoresist through etching.

FIG. 11F illustrates step 6 of the proposed three color OLED array patterning process for depositing a first optical filler layer.

FIG. 11I illustrates step 8 of the proposed three color OLED array patterning process for depositing a second optical filler layer.

FIG. 11J illustrates step 9 of the proposed three color OLED array patterning process for forming a via for the second color electrode through the DBR, the first optical filler layer, and the second optical filler layer.

FIG. 11Q illustrates step 15 of the proposed three color OLED array patterning process for depositing a fourth optical filler layer.

FIG. 11R illustrates step 16 of the proposed three color OLED array patterning process for forming a via for the third color electrode through the DBR, the first optical filler layer, the third optical filler layer, and the fourth optical filler layer.

FIG. 11T illustrates a top view of step 17 of the proposed three color OLED array patterning process.

DETAILED DESCRIPTION OF THE INVENTION

Definitions

Figure 1A:
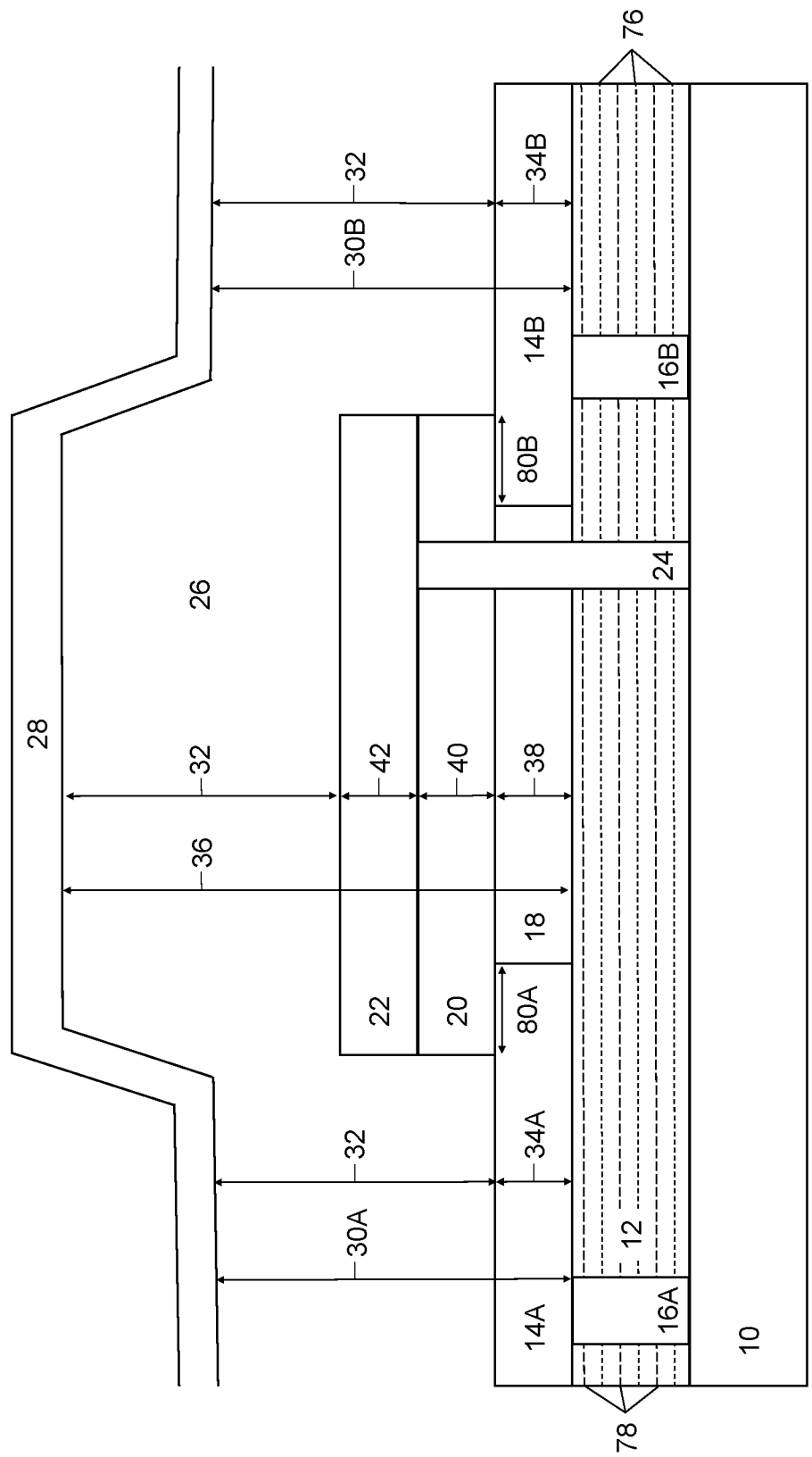
FIG. 1A illustrates an embodiment of a cross section view of a two color optical microcavity organic light emitting diode (OLED) array as per the present disclosure.

Unless defined otherwise, all technical and scientific terms used herein have the same meaning as commonly understood by one of ordinary skill in the art to which this invention pertains.

The use of the word "a" or "an" when used herein in conjunction with the term "comprising" may mean "one,"

but it is also consistent with the meaning of "one or more," "at least one" and "one or more than one."

As used herein, the terms "comprising," "having," "including" and "containing," and grammatical variations thereof, are inclusive or open-ended and do not exclude additional, unrecited elements and/or method steps. The term "consisting essentially of" when used herein in connection with a composition, device, article, system, use, or method, denotes that additional elements and/or method steps may be present, but that these additions do not materially affect the manner in which the recited composition, device, article, system, method, or use functions. A composition, device, article, system, use, or method described herein as comprising certain elements and/or steps may also, in certain embodiments comprise essentially of those elements and/or steps, and in other embodiments comprise of those elements and/or steps, whether or not these embodiments are specifically referred to.

As used herein, the term "about" refers to an approximately +/−10% variation from a given value. It is to be understood that such a variation is always included in any given value provided herein, whether or not it is specifically referred to.

The recitation of ranges herein is intended to convey both the ranges and individual values falling within the ranges, to the same place value as the numerals used to denote the range, unless otherwise indicated herein.

The use of any examples or exemplary language, e.g. "such as", "exemplary embodiment", "illustrative embodiment" and "for example" is intended to illustrate or denote aspects, embodiments, variations, elements or features relating to the invention and not intended to limit the scope of the invention.

As used herein, the terms "connect" and "connected" refer to any direct or indirect physical association between elements or features of the present disclosure. These terms may be understood to denote elements or features that are partly or completely contained within one another, attached to, coupled to, disposed on, joined together, in communication with, operatively associated with, etc., even if there are other elements or features intervening between the elements or features described as being connected.

As used herein, the term "OLED" refers to an Organic Light Emitting Diode, which is an opto-electronic device which emits light under the application of an external voltage. OLEDs have an emissive electroluminescent layer or organic material or species that emits light in response to an electric current. OLEDs can be divided into two main classes: those made with small organic molecules and those made with organic polymers. Without being bound by theory, when a current is applied, the anode injects holes and the cathode injects electrons into the organic layers. The injected holes and electrons each migrate toward the oppositely charged electrode. When an electron and hole localize on the same molecule, an exciton, which is a localized electron-hole pair having an excited energy state, is formed. Light is emitted when the exciton relaxes via a photo emissive mechanism. Types of OLED include but are not limited to Active-matrix OLEDs (AMOLED) and Passive-matrix OLEDs (PMOLED). AMOLEDs have full layers of cathode, organic molecules, and anode. The anode layers have a thin film transistor (TFT) plane in parallel to it so as to form a matrix. This helps in switching each pixel to its on or off state as desired, thus forming an image. Hence, the pixels can be switched off whenever they are not required or there is a black image on the display, decreasing the energy required to illuminate the display. This is the least power consuming type of OLED and has quicker refresh rates which makes them suitable for video. PMOLEDs have a similar composition to AMOLEDs but the cathode lines are arranged at right angles to the anode lines. The electrical control is achieved through the anode and cathode lines to activate the pixel at the intersection point, generating light. The display background of a PMOLED is always black while the color displayed when the pixel is turned on is a predetermined color. PMOLED pixels are fixed to a single color and are not suitable for dynamic imagery or displays. OLEDs may be top or bottom emitting. Top-emitting OLEDs have a substrate that is either opaque or reflective. An OLED is bottom emitting if the emitted light passes through the transparent or semi-transparent bottom electrode and substrate. Top-emitting OLEDs are generally better suited for active-matrix applications as they can be more easily integrated with a non-transparent transistor backplane.

As used herein, the term "DBR" refers to a distributed Bragg reflector. A distributed Bragg reflector is an optical mirror which is composed of different dielectric layers with different refractive indices in an alternative order.

As used herein, the term "optical path length", denoted by $\Lambda$, refers to the distance between two points (P1, P2), accounting for the refractive index (n) of the material that light travels through. In an example OLED device, the media that the light travels through may comprise one or more semitransparent or transparent intermediate electrodes and other layers, as well as layers comprising a white OLED stack. An optical path length is defined as the function:

$$\Lambda = \sum_{P1}^{P2} n_i d_i.$$

As used herein, the term "light field" refers to a function describing the amount of light flowing in every direction through points in space. A light field can represent radiance as a function of position and direction of light in free space, preferably free of occlusions. A light field can be synthetically generated, for example, through various rendering processes or may be captured from a light field camera or from an array of light field cameras.

As used herein, the term "light field display" is a device which reconstructs a light field. In one example the light field can be reconstructed from a finite number of light field radiance samples input to the light field display device. The radiance samples generally represent the color components red, green and blue (RGB). For reconstruction in a light field display, a light field can also be understood as a mapping from a four-dimensional space to a single RGB color, where the four dimensions include the vertical and horizontal dimensions of the display and two dimensions describing the directional components of the light field. In one example, a light field can be defined as the function:

$$LF:(x,y,u,v) \rightarrow (r,g,b)$$

For a fixed $x_f$, $y_f$, $LF(x_f, y_f, u, v)$ represents a two-dimensional (2D) image referred to as an "elemental image", where the elemental image is a directional image of the light field from the fixed $x_f$, $y_f$ position. When a plurality of elemental images are connected side by side, the resulting image is referred to as an "integral image". The integral image can be understood as the entire light field required for the light field display.

As used herein, the term "aperture ratio", in describing an optical display, refers to the ratio of the light emitting area compared to the total pixel area defined as the function:

$$\text{Aperture ratio} = \frac{\text{light emitting area}}{\text{total pixel area}}$$

As used herein, the term "pixel" refers to a light source and light emission mechanism used to create a display.

As used herein, the term "subpixel" refers to a structure comprised of a light emitting device housed within an optical microcavity.

As used herein, the term "electrode" refers to a conductor through which electricity enters or leaves an object, substance, or region.

As used herein, the term "cathode" refers to the negatively charged electrode by which electrons enter an electrical device.

As used herein, the term "anode" refers to the positively charged electrode by which the electrons leave an electrical device.

As used herein, the term "patterning" refers to a technique to transfer pattern upon a target material.

As used herein, the term "wavelength" is a measure of distance between two identical peaks (high points) or troughs (low points) in a wave, which is a repeating pattern of traveling energy such as light or sound.

Herein is described a microcavity organic light emitting diode (OLED) design and method for tuning a micron sized multi color optical microcavity OLED array. A light field display requires a pixel density of at least 25000 pixels per inch (ppi), requiring each pixel to be less than 20 μm. Most preferably, light field displays with a high display resolution have pixel densities greater than 5,000 ppi. Achieving a high aperture ratio at these resolutions can be accomplished through maximizing the light emitting area for each subpixel and minimizing subpixel spacing. This disclosure provides an optical microcavity pixel device comprising an organic light emitting diode (OLED) and a photolithography patterning method that achieves a micron sized pixel that when patterned in an array achieves an aperture ratio greater than 70%, suitable for a light field display with a resolution greater than 1,000 ppi. This can be achieved by patterning transparent or semi-transparent optical filler layers and intermediate electrodes to laterally overlap other intermediate electrodes in the OLED array to reduce lateral spacing and increase the aperture ratio of the resulting OLED array. This lateral overlap design enables the designer to optimize the optical properties of each OLED device and the aperture ratio of the OLED array as a whole. While the industry definition of a high aperture ratio for a display with micron sized pixels is 70%, this design allows the display to achieve near or about a 100% aperture ratio, creating a high-quality display suitable for a light field display and other applications. Also disclosed are methods for designing and fabricating an array of OLED devices that emit light including but not limited to yellow, red, green, or blue light.

Various features of the invention will become apparent from the following detailed description taken together with the illustrations in the Figures. The design parameters, design method, construction, and use of the optical microcavity OLED design process and structures disclosed herein are described with reference to various examples representing embodiments which are not intended to limit the scope of the invention as described and claimed herein. The skilled technician in the field to which the invention pertains will appreciate that there may be other variations, examples and embodiments of the invention not disclosed herein that may be practiced according to the teachings of the present disclosure without departing from the scope of the invention.

Each OLED in the device comprises an electrode configured to connect with a substrate, an optical microcavity including a distributed Bragg reflector (DBR), and a cathode. The optical microcavity is operatively associated with, or connected to, one or more reflective surfaces to substantially collimate, manipulate, or tune the light. At least one of the reflective surfaces is a light propagating reflective surface connected to the optical microcavity to propagate the light out of the optical microcavity. The present disclosure provides individually addressable red, green, and blue (RGB) subpixels. The subpixel size as presently described is in a nanoscale to several microns range. The DBR, as described herein, is comprised of an alternating stack of dielectric materials of specific thicknesses, ensuring the optical path length is a quarter of the designed wavelength and suitable for use with an OLED of any color. The highest reflectivity of a DBR is attained when the layer thicknesses are chosen such that the optical path length of each layer is one quarter of the resonance wavelength. With each layer having an optical path length of $\lambda_{Bragg}/4$, all reflections will add in phase, and the transmissivity will decrease exponentially as a function of mirror thickness. At longer or shorter wavelengths than the stopband, the reflections begin to add out of phase, therefore the total reflection decreases. This gives a broad-band high-reflectivity region centered on the Bragg wavelength, called the stop band, with oscillating side-lobes on either side. The DBR is generally composed of pairs of two different dielectric layers with different refractive indices but may also be composed of multiple dielectric materials or other transparent materials with a contrast in n, as long as the optical path length of each layer is $\lambda_{Bragg}/4$. The multilayer mirror comprises alternating layers of substantially non-absorbing materials of appropriately chosen thickness. Typically, each layer is of thickness $$\frac{\lambda}{4n},$$

where $\lambda$ is advantageously chosen to correspond approximately to the center wavelength of the EML emission spectrum, e.g., 500-550 nm. Such mirrors are well known. The reflectivity of the mirror depends in a known way on the number of layer pairs, layer thickness and the refractive index of the materials used. Exemplary material pairs in the visible wavelength region are $Si_3N_4$, $SiO_2$, and $TiO_2$.

FIG. 1A illustrates an embodiment of a cross section of a two color optical microcavity OLED array as described herein with two OLED devices of the first color and one OLED device of the second color. The OLED array shown comprises a DBR 12 deposited on a substrate 10. In this embodiment the substrate 10 is a TFT substrate, which is a device that forms the base structure of an embodiment of an OLED, providing the electrical control to switch each pixel or subpixel to its on or off state as desired. A TFT contains several layers including a metallic gate electrode, a gate insulator, a semiconductor layer, and source/drain electrodes deposited on a substrate. The TFT substrate preferably also has a planarization layer on which the materials of an OLED are deposited. The DBR 12 comprises a series of alternating high refractive index dielectric layers 76 and low refractive index dielectric layers 78. The number of high refractive index dielectric layers 76 and low refractive index dielectric layers 78 can be configured to be any integer. In the embodiment shown the DBR 12 can act as the first reflective surface for the optical microcavity of each OLED device in the OLED array.

Before each electrode in a series of electrodes for an array of first color OLED devices, herein referred to as the first color electrodes 14A, 14B are deposited on the DBR 12, a via for each of the first color OLEDs, herein referred to as the first color via 16A, 16B, is dry etched through the DBR 12. This provides an electrical connection from the substrate 10 to the first color electrodes 14A, 14B. The first color vias 16A, 16B may be etched using an etching technique, for example, reactive ion etching, anodic plasma etching, magnetically enhanced reactive ion etching, triode reactive ion etching, or transmission-coupled plasma etching. In this embodiment, a preferred dry etching method is used, such as reactive ion etching. After the first color vias 16A, 16B are etched through the DBR 12, the first color electrodes 14A, 14B are deposited on the DBR 12 using a shadow mask. A first optical filler layer 18 is patterned using photolithography for each second color OLED device in the OLED array directly on the DBR 12, between the first color electrodes 14A, 14B. The patterning can, for example, use a series of post treatments to chemically engrave a transferred pattern into or allow the deposition of new material in the transferred material. A second optical filler layer 20 is then patterned through a shadow mask, or using photolithography, for each second color OLED device in the OLED array on the first optical filler layer 18, covering the first optical filler layer 18. The second optical filler layer 20 may overlap the first color electrodes 14A, 14B, to form overlap regions 80A, 80B. The overlap regions 80A, 80B provide tolerances that mitigate alignment errors in fabrication, thus increasing the aperture ratio of the display by reducing the lateral spacing between the OLED devices on the substrate 10. The optical filler layers are designed to be transparent to visible light and electrically insulating. The optical filler layers function as electrically insulating layers to prevent crosstalk between the first color electrodes 14A, 14B and the second color electrode 22 in the overlap regions 80A, 80B.

Before a second color electrode 22 is deposited on the second optical filler layer 20, a second color via 24 for each of the second color electrodes 22 is dry etched using reactive ion etching through the second optical filler layer 20, the first optical filler layer 18, and the DBR 12. The second color via 24 provides an electrical connection from the substrate 10 to the second color electrode 22. The second color electrode 22 is then patterned on the second optical filler layer 20 with a shadow mask, preferably wherein the width of the second color electrode 22 is the same as the width of the second optical filler layer 20. For a two-color OLED array the layers of the white OLED stack 26 are then deposited over the entire OLED array. In a three color OLED array, a third optical filler layer, a fourth optical filler layer, third color via, and third color electrode would be deposited for the third color, followed by the white OLED stack 26. The uniformly deposited OLED stack emits white light, and for each color optical microcavity, the optical path length is tuned to achieve the specific color. A cathode 28 is then deposited on the white OLED stack 26 using, for example, a thermal evaporation deposition method. In this embodiment, the cathode 28 is a reflective material, deposited with a thickness resulting in a transmission greater than 0%, and is used to form the optical microcavity of each OLED device.

In this embodiment, the substrate 10 comprises a non-conducting component that forms the base for the OLED device and a conducting component that electrically powers each electrode. One example can be a thin film transistor (TFT) substrate comprised of one or more semiconducting materials, a gate insulator, and a substrate. The semiconducting materials can include, for example, hydrogenated amorphous silicon, polycrystalline silicon, amorphous oxide semiconductors, cadmium selenide, zinc oxide, organic materials such as pentacene, poly (3-hexylthiophene), poly (3-alkylthiophene), and poly (3-octylthiophene), or transparent electrodes such as indium zinc oxide (IZO) or indium tin oxide (ITO). Indium tin oxide (ITO) is typically encountered as an oxygen-saturated composition with a formulation of 74% In, 18% O2, and 8% Sn by weight. ITO is also commonly used as an anode material in an OLED structure due to its suitable conductivity, nearly transparent and colorless optical properties, and that it can be deposited by well-established methods. ITO can also be used to construct the anode layer in OLED devices according to the present disclosure. The gate insulator can be a metal passivated material with a transparent insulator such as $SiO_2$ and $Si_3N_4$ or an organic material such as poly-methyl methacrylate. The substrate can also be a non-conducting material, such as glass. The DBR 12 comprises alternating high refractive index dielectric layers 76 and low refractive index dielectric layers 78, that may be comprised of $TiO_2$ and $SiO_2$. The first color electrodes 14A, 14B and second color electrode 22 can be a semitransparent or transparent conducting material, such as ITO, a conducting polymer such as doped polyaniline, or a thin layer (between 5 and 35 nm, preferably less than 10 nm) of metal or alloy, or a carbon based material such as graphene. Transparent conducting materials, such as ITO, are preferred due to their high transmittance values (80-85%) and low reflectivity and absorbance.

The first optical filler layer 18 and second optical filler layer 20 can be, for example, a transparent polymer, such as, for example polyimide, or an inorganic transparent dielectric with various refractive index values, such as, for example, $Al_2O_3$, $SiO_2$, or $Si_3N_4$. The first optical filler layer 18 and second optical filler layer 20 can be comprised of the same material or different materials. The optical filler layers 18, 20 can be deposited through, for example, sputtering, thermal evaporation, chemical vapor deposition, or atomic layer deposition. One preferred method of deposition is sputtering, which allows the designer to precisely adjust the thickness of the layers during deposition. The thickness of the optical filler layers and the materials that comprise them are designed to tune the optical path length for each specific colour. The preferred material for an optical filler layer has a refractive index similar to the bottom electrodes. For example, ITO can be used for the second color electrode 22 and $Al_2O_3$ can be used for both the first optical filler layer 18 and the second optical filler layer 20. The white OLED stack 26 comprises thin-film layers of organic material, which commonly include one or more of an Organic Hole-Injection Layer (HIL), an Organic Hole-Transporting Layer (HTL), an Emissive Layer (EML), an Organic Electron-Transporting Layer (ETL), and an Organic Electron-Injection Layer. The series of layers in the white OLED stack are designed to emit white light. The individual colors of each OLED device are achieved through tuning the optical path length for each optical microcavity. Each layer of the white OLED stack 26 can be deposited through thermal evaporation, spin casting, or inkjet printing. For this embodiment, one preferred method for deposition of the white OLED stack 26 is thermal evaporation. The cathode 28 can be a reflective metal with a reflectance greater than 90%, such as aluminum, cadmium, or silver. This embodiment illustrates a conventional OLED configuration, wherein the bottom first color electrodes 14A, 14B and second color electrode 22 below the white OLED stack 26 are anodes, and the top electrode above the white OLED stack 26 is a cathode 28. The microcavity OLEDs described herein have a substantially reflective top and bottom surface with substantially transparent intermediate layers that collectively create a resonance inside the optical microcavity to create the optical path length required for the desired color. In the present configuration, wherein the DBR 12 is the bottom reflective surface and the cathode 28 is the top reflective surface, the cathode 28 is marginally less reflective than the DBR 12, allowing light generated in the optical microcavity to be emitted through the top of the OLED array. In another arrangement, the OLED array may be configured as an array of inverted OLED devices, wherein the bottom electrodes, deposited under the white OLED stack 26, are fully transparent cathodes and the top electrodes above the white OLED stack are reflective anodes. The presently described OLED array may also be configured to be an array of bottom emitting OLED devices, wherein the bottom electrode, the DBR 12, and the substrate 10 are marginally less reflective than the top electrode, emitting light through the substrate 10. The present OLED array can also be configured to be comprised of any combination of inverted or non-inverted and top or bottom emitting OLEDs.

In an optical microcavity, the optical path length for each color is equal to the peak wavelength of the color divided by two and multiplied by a positive integer. Therefore:

$$\Lambda_{Cx} = m\frac{\lambda_{Cx}}{2}$$

where:

$\Lambda_{Cx}$ is the optical path length of a color m is an integer $\lambda_{Cx}$ is the peak wavelength of a color Each element that comprises the optical microcavity has an optical path length that is determined by the refractive index of the material and its thickness. The total optical path length for each color can be determined by the optical path length of each element that comprises the optical microcavity: the DBR 12, the electrodes 14, 22, the optical filler layers 18, 20, the white OLED stack 26, and the cathode 28. Since the DBR 12 and cathode 28 are reflective surfaces that form the bounds of the optical microcavity, the penetration depth into the DBR 12 and the cathode 28 are considered in addition to the refractive index and the thickness. In this embodiment, the DBR 12 and cathode 28 are uniform and the white OLED stack 26 is designed to emit white light for the entire OLED array. The optical path lengths for each color include the penetration depth of the DBR 12 and the penetration depth of the cathode 28. These penetration depths are incorporated in design considerations and are constant across the OLED array. The DBR 12 and the cathode 28 are present, however not used to tune the optical path length to emit a specific color. Therefore:

$$\Lambda_{C1} = \Lambda_{e1} + \Lambda_{OLED} + (\Lambda_{CATHODE} + \Lambda_{DBR})$$

$$\Lambda_{C2} = \Lambda_{f1} + \Lambda_{f2} + \Lambda_{e2} + \Lambda_{OLED} + (\Lambda_{CATHODE} + \Lambda_{DBR})$$

The optical path length for each first color OLED device in the OLED array, $\Lambda_{C1}$, herein referred to as the optical path length of the first color 30A, 30B, is determined by the optical path length of the first electrode for each first color OLED device in the OLED array, herein referred to as the optical path length of the first electrode ($\Lambda_{e1}$) 34A, 34B and the optical path length of the white OLED stack ($\Lambda_{OLED}$) 32. The optical path length for each second color OLED device in the OLED array, $\Lambda_{C2}$, herein referred to as the optical path length of the second color ($\Lambda_{C2}$) 36, is determined by the sum of the optical path length of the first optical filler layer ($\Lambda_{f1}$) 38, the optical path length of the second optical filler layer ($\Lambda_{f2}$) 40, the optical path length of the second color electrode ($\Lambda_{e2}$) 42, and the optical path length of the white OLED stack ($\Lambda_{OLED}$) 32. Since the optical path length of each element in the optical microcavity is determined by the thickness of the element and its refractive index, adjusting the thicknesses of specific elements within the optical microcavity allows the designer to optimize the optical path length of the desired color. As the white OLED stack 26 is deposited across the OLED array, the optical path length of the white OLED stack ($\Lambda_{OLED}$) 32 can be designed to tune the optical path length for the first color ($\Lambda_{C1}$) 30A, 30B, which can be accomplished through optimizing the thickness of the white OLED stack 26. In particular, the optical path length for the first color ($\Lambda_{C1}$) should be about or equal to the peak wavelength of the first color divided by two, times an integer. As the optical path length of the white OLED stack 32 is uniform across the OLED array the optical path length of the second optical filler layer ($\Lambda_{f2}$) 40 can also be designed taking into consideration the thickness of the second optical filler layer 20 to create the optical path length required for the second color ($\Lambda_{C2}$) 36. It is advantageous to optimize the optical path length for the first color 30A, 30B with the optical path length of the white OLED stack 32 and the optical path length of the second color 36 with the optical path length of the second optical filler layer 40, as the white OLED stack 26 can be uniform. The uniform white OLED stack 26 can then be deposited over the entire OLED array, thereby simplifying fabrication.

Figure 1B:
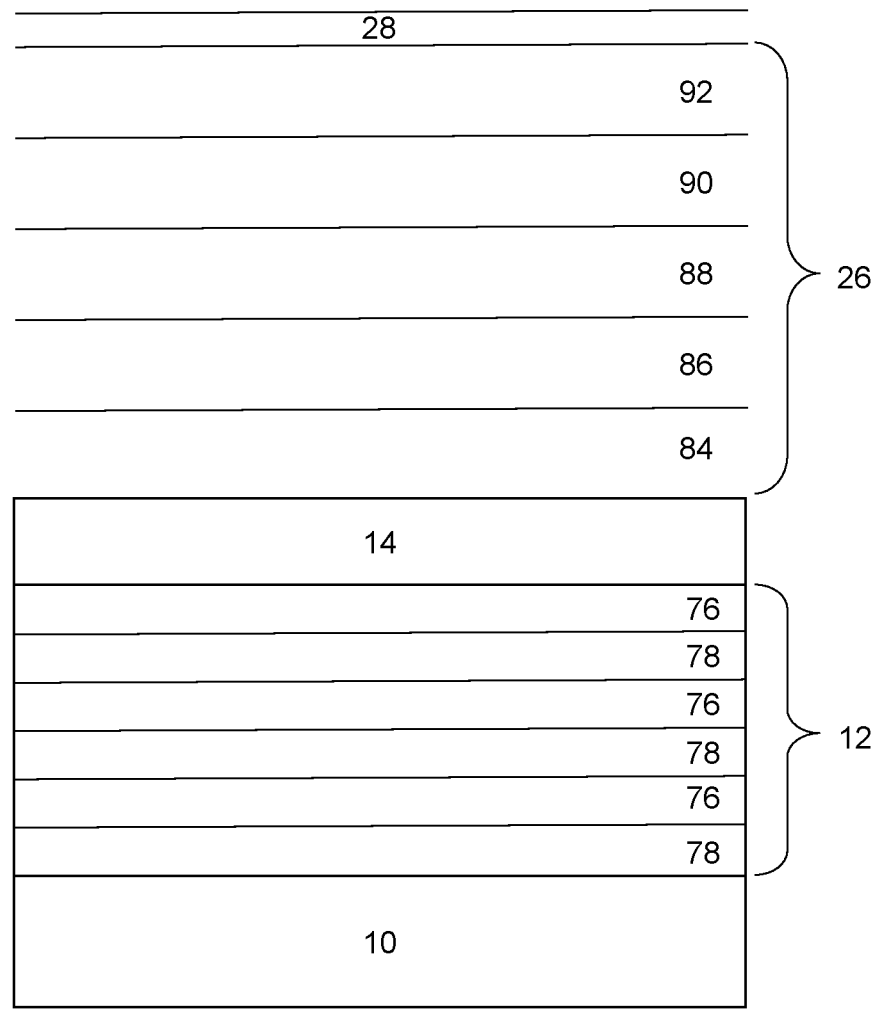
FIG. 1B illustrates an enlarged illustration of a one color optical microcavity OLED device as described in FIG. 1A.

FIG. 1B illustrates an enlarged illustration of a single color optical microcavity OLED device as described in FIG. 1A. The OLED device comprises a DBR 12 deposited on a substrate 10, which can be a TFT substrate. The DBR 12 comprises a series of alternating high refractive index dielectric layers 76 and low refractive index dielectric layers 78. It is noted that the number of pairs of high and low refractive index dielectric layers 76, 78 shown in FIG. 1B is three, comprising six layers, however the DBR can be comprised of any integer number of layers. This composition allows the DBR 12 to act as the first reflective surface for the optical microcavity of each OLED device in the OLED array. A first color electrode 14 is deposited on the DBR 12 through the use of a shadow mask. The layers that comprise the white OLED stack 26 are then individually deposited over the entire OLED array. Each layer of the white OLED stack 26 can be deposited through, for example, thermal evaporation, spin casting, and inkjet printing, and preferably by thermal evaporation. For this embodiment, the white OLED stack 26 can comprise one or more of each of the following layers: an Organic Hole-Injection Layer (HIL) 84, an Organic Hole-Transporting Layer (HTL) 86, an Emissive Layer (EML) 88, an Organic Electron-Transporting Layer (ETL) 90, and an Organic Electron-Injection Layer (EIL) 92. In some configurations, a white OLED stack 26 can comprise of a single EML 88, wherein the emission molecules of specific colors are combined in the EML 88 to generate white light. In alternate configurations, a white OLED stack 26 can comprise of multiple EMLs 88, which can be referred to as a tandem or stacked white OLED. In a tandem white OLED, white light is generated from all emitting EMLs 88 in the white OLED stack 26. In tandem OLED configurations, an additional charge generation layer can be deposited to function as an additional injection layer and as an artificial metal electrode. The combination of organic layers in the white OLED stack 26 are designed to emit white light, while each optical microcavity tunes the optical path length of various elements to achieve a specific color. A cathode 28 is then deposited on the white OLED stack 26 using, for example, thermal evaporation. In this embodiment, the cathode 28 is a reflective material and is used to form an optical microcavity for each OLED device.

Figure 1C:
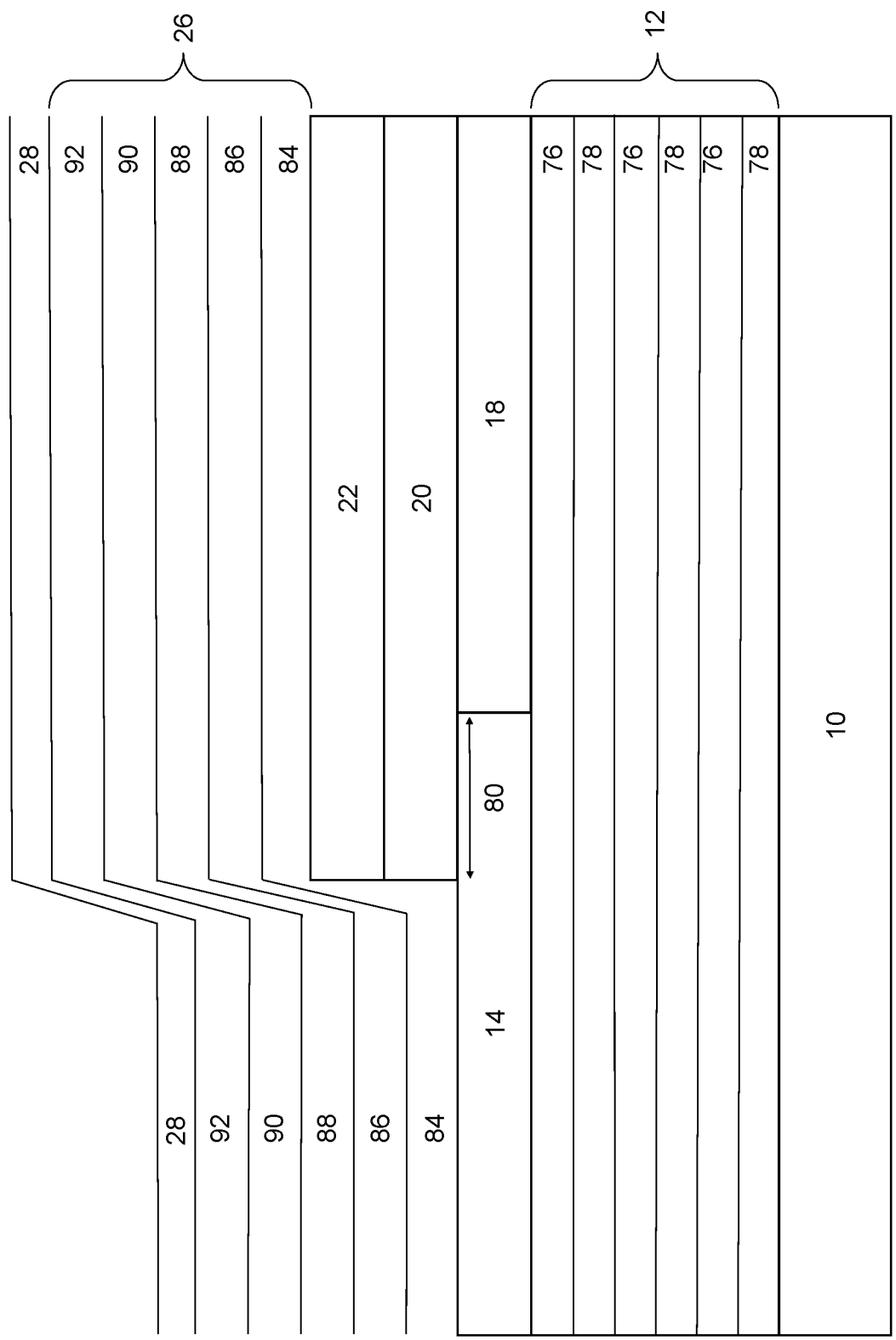
FIG. 1C illustrates an enlarged illustration of a two color optical microcavity OLED device as described in FIG. 1A.

FIG. 1C illustrates an enlarged illustration of a two color optical microcavity OLED device as described in FIG. 1A. The OLED device comprises a DBR 12 deposited on a substrate 10. In this embodiment the substrate 10 is a TFT substrate. The DBR 12 comprises a series of alternating high refractive index dielectric layers 76 and low refractive index dielectric layers 78. The number of high and low refractive index dielectric layers 76, 78 can be configured to be any integer. This composition allows the DBR 12 to act as the first reflective surface for the optical microcavity of each OLED device in the OLED array. A first color electrode 14 is deposited on the DBR 12 through the use of a shadow mask. A first optical filler layer 18 is patterned using photolithography for each second color OLED device in the OLED array directly on the DBR 12, adjacent to the first color electrode 14. A second optical filler layer 20 is then patterned through a shadow mask or using photolithography for each second color OLED device in the OLED array on the first optical filler layer 18, covering the entire first optical filler layer 18 and may overlap the first color electrode 14, to form the overlap region 80. The overlap region 80 mitigates alignment errors in fabrication, thus increasing the aperture ratio of the display through reducing the lateral spacing between the OLED devices on the substrate 10. The second color electrode 22 is patterned on the second optical filler layer 20 with a shadow mask, preferably wherein the width of the second color electrode 22 is the same width as the second optical filler layer 20. Although only first and second microcavities are shown here it is understood that an OLED array comprises a plurality of first color microcavities with first electrodes and a plurality of second color microcavities with second electrodes. It is further understood that OLED arrays also generally comprise a plurality of three different color microcavities to provide red, green, and blue color emission.

The layers that comprise the white OLED stack 26 are then individually deposited over the entire OLED array. Each layer of the white OLED stack 26 can be deposited through thermal evaporation, spin casting, or inkjet printing. For this embodiment, the preferred method is thermal evaporation. For this embodiment, the organic layers that comprise the white OLED stack 26 are deposited on the first and second color electrodes 14, 22 in the following order: an Organic Hole-Injection Layer (HIL) 84, an Organic Hole-Transporting Layer (HTL) 86, an Emissive Layer (EML) 88, an Organic Electron-Transporting Layer (ETL) 90, and an Organic Electron-Injection Layer (EIL) 92. The white OLED stack 26 can further comprise one or more of each of the organic layers. The organic layers of the white OLED stack 26 are together designed to emit white light, while each optical microcavity tunes the optical path length of various elements to achieve a specific color. A cathode 28 is then deposited on the white OLED stack 26 using, for example, thermal evaporation. In this embodiment, the cathode 28 is a reflective material and is used to form an optical microcavity for each OLED device.

Figure 2:
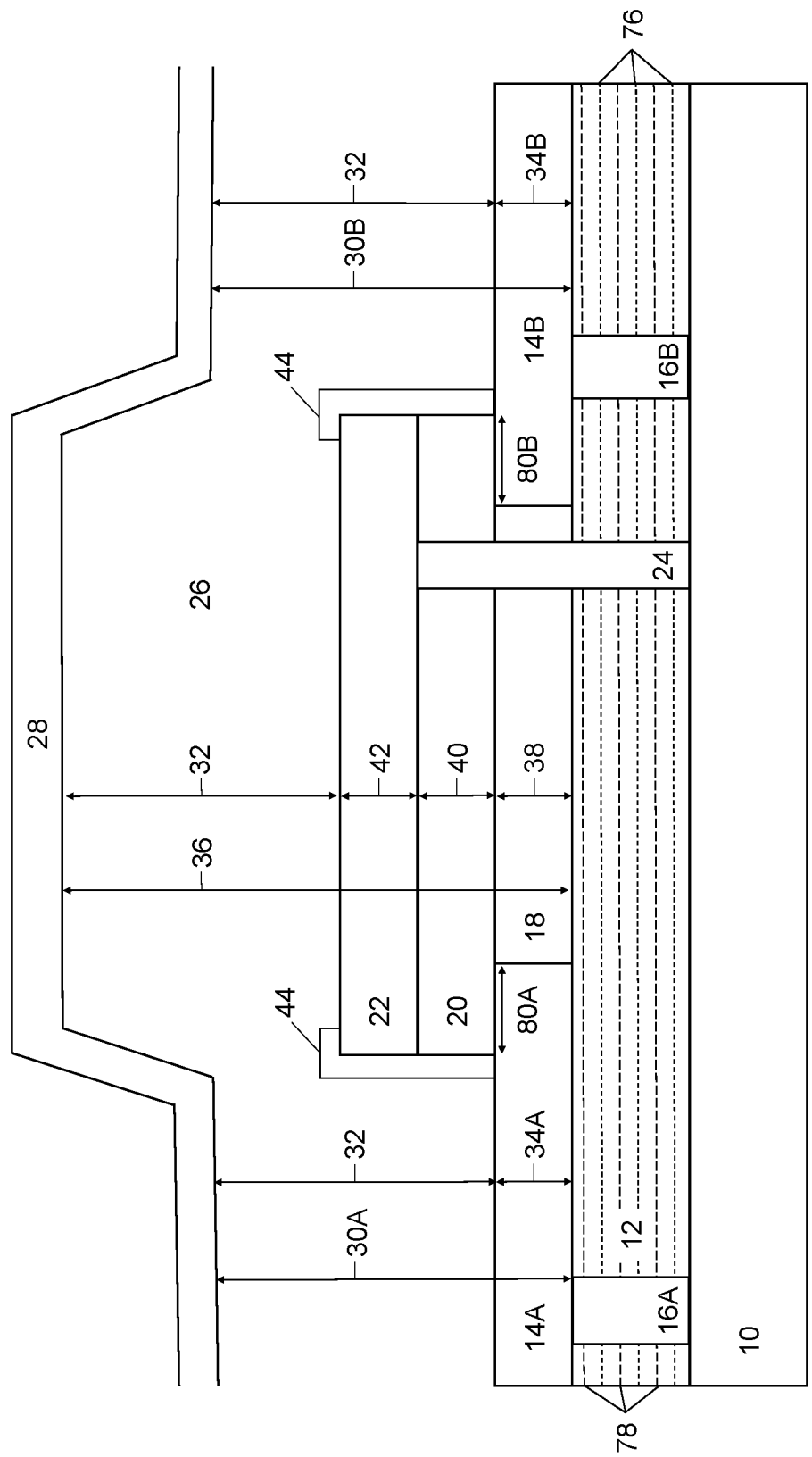
FIG. 2 illustrates an alternative embodiment of a two color optical microcavity OLED array as per the present disclosure including a pixel definition layer (PDL).

FIG. 2 illustrates an alternative embodiment of a two color optical microcavity OLED array as per the present disclosure including a pixel definition layer (PDL) 44. This cross section illustrates two OLED devices of the first color and one OLED device of the second color. The OLED array comprises a DBR 12 deposited on a substrate 10. In this embodiment the substrate 10 is a TFT substrate, which is a device that forms the base structure of the embodiment. The DBR 12 comprises a series of alternating high refractive index dielectric layers 76 and low refractive index dielectric layers 78. Before the first color electrodes 14A, 14B are deposited on the DBR 12, a first color via 16A, 16B is dry etched through the DBR 12 to provide an electrical connection from the substrate 10 to the first color electrodes 14A, 14B. In this embodiment, the preferred dry etching method is reactive ion etching. The first color electrodes 14A, 14B are then patterned on the DBR 12 using a shadow mask. The first optical filler layer 18 is patterned using photolithography on the DBR 12 between the first color electrodes 14A, 14B. The second optical filler layer 20 is deposited on, and fully covers the first optical filler layer 18 and may overlap the first color electrodes 14A, 14B, to form overlap regions 80A, 80B. The second optical filler layer can be patterned using a shadow mask or photolithography. The overlap regions 80A, 80B provide tolerances that mitigate alignment errors in fabrication, thus increasing the aperture ratio of the display through reducing the lateral spacing between OLED devices on the substrate 10.

Before the second color electrode 22 is deposited, a second color via 24 is dry etched using reactive ion etching through the optical filler layers 20, 18 and the DBR 12 to provide an electrical connection to the substrate 10. The second color electrode 22 is patterned with a shadow mask on the second optical filler layer 20, wherein the width of the second color electrode 22 equals the width of the second optical filler layer 20. In this embodiment, an optional PDL 44 is patterned with a shadow mask such that it covers the region of the second color electrode 22 and second optical filler layer 20 that overhangs the adjacent first color electrodes 14A, 14B. The PDL 44 prevents electrical shorting between the first color electrodes 14A, 14B, and second color electrode 22, reducing crosstalk across the OLED array. Crosstalk generally refers to light leaking from one pixel to another when light is emitted that can interfere with the image quality causing loss of contrast, loss of depth resolution, viewer discomfort, and duplication of displayed images. The PDL 44 can be deposited by, for example, sputtering, spin coating, thermal evaporation, chemical vapor deposition, atomic layer deposition, or spin casting. The optional PDL 44 can be comprised of an inorganic material such as an insulating dielectric, for example $Al_2O_3$, $Si_3N_4$, or $SiO_2$, or an organic material such as a photosensitive polyimide. In a three color OLED device a PDL layer can also connect the third color electrode to the second color electrode. The layers that comprise the white OLED stack 26 are deposited over the entire OLED array. A cathode 28 is then deposited by thermal evaporation on the white OLED stack 26. In this embodiment, the cathode 28 is a reflective material and therefore is used to form an optical microcavity for each OLED device.

The optical path length of the first color ($\Lambda_{C1}$) 30A, 30B, is determined by the optical path length of the first electrode ($\Lambda_{e1}$) 34A, 34B and the optical path length of the white OLED stack ($\Lambda_{OLED}$) 32. The optical path length of the second color ($\Lambda_{C2}$) 36, is determined by the sum of the optical path length of the first optical filler layer ($\Lambda_{f1}$) 38, the optical path length of the second optical filler layer ($\Lambda_{f2}$) 40, the optical path length of the second color electrode ($\Lambda_{e2}$) 42, and the optical path length of the white OLED stack ($\Lambda_{OLED}$) 32. Since the optical path length of each element in the optical microcavity is determined by the thickness of the element and its refractive index, adjusting the thicknesses of specific elements within the optical microcavity allows the designer to tune the optical path length of the desired color. As the white OLED stack 26 is deposited across the OLED array; the optical path length of the white OLED stack ($\Lambda_{OLED}$) 32 may be designed to tune the optical path length for the first color ($\Lambda_{C1}$) 30A, 30B, which may be accomplished through optimizing the thickness of the white OLED stack 26. As the optical path length of the white OLED stack 32 is uniform across the OLED array the optical path length of the second optical filler layer ($\Lambda_{f2}$) 40 may be designed through the thickness of the second optical filler layer 20 to create the optical path length required for the second color ($\Lambda_{C2}$) 36.

Optimizing the optical path length for the first color 30A, 30B with the optical path length of the white OLED stack 32 and the optical path length of the second color 36 with the optical path length of the second optical filler layer 40 is advantageous as the white OLED stack 26 can be uniform. The uniform white OLED stack 26 can then be deposited over the entire OLED array, thereby simplifying fabrication.

Figure 3A:
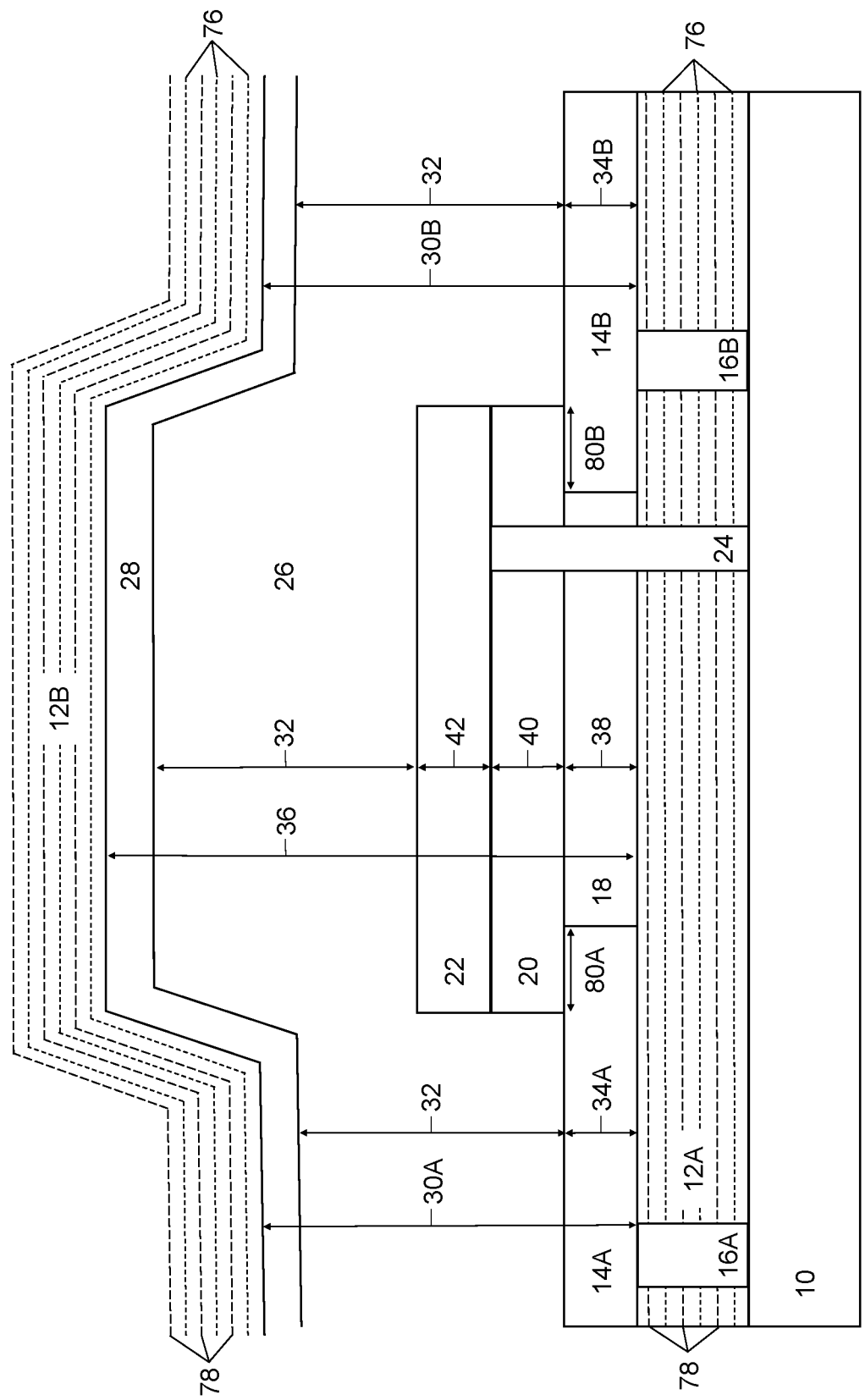
FIG. 3A illustrates an alternative embodiment of a two color optical microcavity OLED array as per the present disclosure including an additional DBR deposited on the cathode.

FIG. 3A illustrates an alternative embodiment of a two color optical microcavity OLED array having a second DBR 12B deposited on top of the cathode 28. This cross section illustrates two OLED devices of the first color and one OLED device of the second color. The OLED array comprises a first DBR 12A deposited on a substrate 10. In this embodiment the substrate 10 is a TFT substrate, which is a device that forms the base structure of the embodiment. The first DBR 12A has a series of alternating high refractive index dielectric layers 76 and low refractive index dielectric layers 78. Before the first color electrodes 14A, 14B are deposited on the first DBR 12A, first color vias 16A, 16B are dry etched through the first DBR 12A to provide an electrical connection from the substrate 10 to the first color electrodes 14A, 14B. In a preferable embodiment, the vias are created using reactive ion etching. The first color electrodes 14A, 14B are then patterned using a shadow mask onto the first DBR 12A. A first optical filler layer 18 is then patterned using photolithography on the first DBR 12A between the first color electrodes 14A, 14B. The second optical filler layer 20 is then deposited such that it fully covers the first optical filler layer 18 and preferably overlap the first color electrodes 14A, 14B, to form overlap regions 80A, 80B. The second optical filler layer 20 can be patterned using a shadow mask or using photolithography. The overlap regions 80A, 80B provide tolerances that mitigate alignment errors in fabrication, thus increasing the aperture ratio of the display through reducing the lateral spacing between OLED devices on the substrate 10.

Before the second color electrode 22 is deposited, a second color via 24 is dry etched using reactive ion etching through the optical filler layers 20, 18 and the first DBR 12A to provide an electrical connection to the substrate 10. The second color electrode 22 is patterned on the second optical filler layer 20 using a shadow mask, wherein the width of the second color electrode 22 is approximately equal to the width of the second optical filler layer 20. The layers that comprise the white OLED stack 26 are then deposited over the entire OLED array. A cathode 28 is then deposited by thermal evaporation on the white OLED stack 26. In this embodiment, an additional DBR 12B is deposited on top of the cathode 28. The second DBR 12B has a series of alternating high refractive index dielectric layers 76 and low refractive index dielectric layers 78. The cathode 28 is comprised of a semi-transparent or transparent material and the DBR 12B is used to form an optical microcavity for each OLED device.

Each element that comprises the optical microcavity has an optical path length that is determined by the refractive index of the material and its thickness. The total optical path length for each color can be determined by the optical path length of each element that comprises the optical microcavity: the first DBR 12A, the first electrodes 14A, 14B, second electrode 22, the optical filler layers 18, 20, the white OLED stack 26, the cathode 28, and the second DBR 12B. Since the first DBR 12A and second DBR 12B are reflective surfaces that form the bounds of the optical microcavity, the penetration depth into the DBRs 12A, 12B are considered in addition to the refractive index and the thickness. In this embodiment, the DBRs 12A, 12B and cathode 28 are uniform and the white OLED stack 26 is designed to emit white light for the entire OLED array. The optical path lengths for each color include the penetration depth of the first DBR 12A, the penetration depth of the second DBR 12B, and the optical path length of the cathode 28. These penetration depths and corresponding optical path lengths are incorporated in design considerations but are constant across the OLED array. The first DBR 12A, the second DBR 12B, and the cathode 28 are not used to tune the optical path length to emit a specific color.

Therefore:

$$\Lambda_{C1}=\Lambda_{e1}+\Lambda_{OLED}+(\Lambda_{CATHODE}+\Lambda_{DBR\ A}+\Lambda_{DBR\ B})$$

$$\Lambda_{C2}=\Lambda_{f1}+\Lambda_{f2}+\Lambda_{e2}+\Lambda_{OLED}+(\Lambda_{CATHODE}+\Lambda_{DBR\ A}+\Lambda_{DBR\ B})$$

The optical path length of the first color ($\Lambda_{C1}$) 30A, 30B, is determined by the optical path length of the first electrode ($\Lambda_{e1}$) 34A, 34B and the optical path length of the white OLED stack ($\Lambda_{OLED}$) 32. The optical path length of the second color ($\Lambda_{C2}$) 36, is determined by the sum of the optical path length of the first optical filler layer ($\Lambda_{f1}$) 38, the optical path length of the second optical filler layer ($\Lambda_{f2}$) 40, the optical path length of the second color electrode ($\Lambda_{e2}$) 42, and the optical path length of the white OLED stack ($\Lambda_{OLED}$) 32. Since the optical path length of each element in the optical microcavity is determined by the thickness of the element and its refractive index, adjusting the thicknesses of specific elements within the optical microcavity allows the designer to tune the optical path length of the desired color. As the white OLED stack 26 is deposited across the OLED array the optical path length of the white OLED stack ($\Lambda_{OLED}$) 32 can be designed to tune the optical path length for the first color ($\Lambda_{C1}$) 30A, 30B, which can be accomplished through optimizing the thickness of the white OLED stack 26. As the optical path length of the white OLED stack 32 is uniform across the OLED array the optical path length of the second optical filler layer ($\Lambda_{f2}$) 40 can also be designed through the thickness of the second optical filler layer 20 to create the optical path length required for the second color ($\Lambda_{C2}$) 36. Optimizing the optical path length for the first color 30A, 30B with the optical path length of the white OLED stack 32 and the optical path length of the second color 36 with the optical path length of the second optical filler layer 40 is advantageous as the white OLED stack 26 can be uniform across the OLED optical microcavity array. The uniform white OLED stack 26 can also be deposited over the entire OLED array, thereby simplifying fabrication.

Figure 3B:
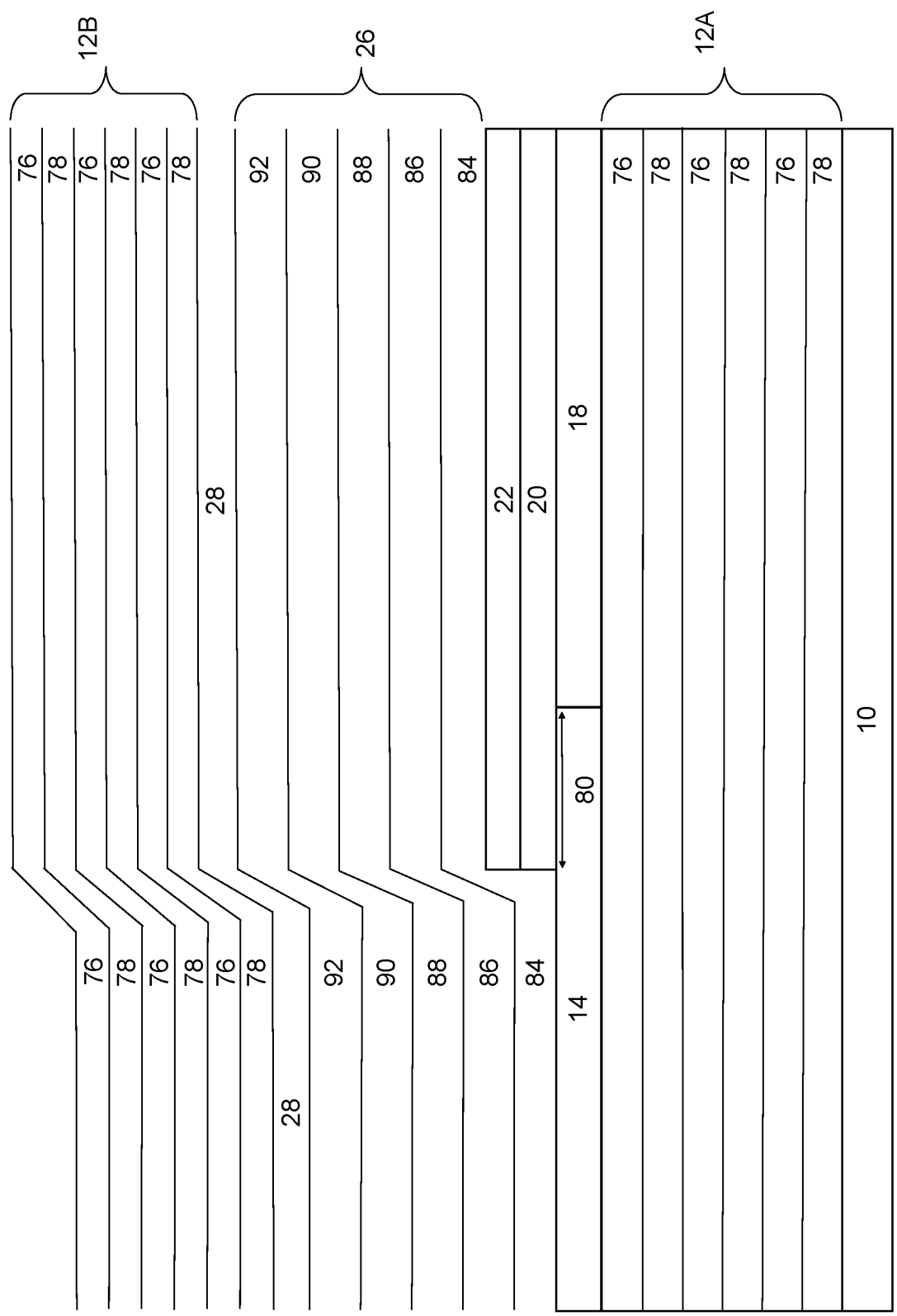
FIG. 3B illustrates an enlarged illustration of a two color optical microcavity OLED device as described in FIG. 3A.

FIG. 3B illustrates an enlarged illustration of a two color optical microcavity OLED device as described in FIG. 3A. The OLED device comprises a first DBR 12A deposited on a substrate 10 which is preferably a TFT substrate. The first DBR 12A is comprised of alternating high refractive index dielectric layers 76 and low refractive index dielectric layers 78. The number of layers of high and low refractive index dielectric layers 76, 78 can any integer of layers, with three pairs comprising six layers shown in this configuration. In this embodiment the first DBR 12A acts as the first reflective surface for the optical microcavity of each OLED device in the OLED array. A first color electrode 14 is deposited on the first DBR 12A through the use of a shadow mask. A first optical filler layer 18 is patterned using photolithography for each second color OLED device in the OLED array directly on the first DBR 12A, adjacent to the first color electrode 14. A second optical filler layer 20 is then patterned through a shadow mask or photolithography for each second color OLED device in the OLED array on the first optical filler layer 18, covering the entire first optical filler layer 18 and may overlap the first color electrode 14, to form the overlap region 80. The overlap region 80 mitigates alignment errors in fabrication, thus increasing the aperture ratio of the display through reducing the lateral spacing between the OLED devices on the substrate 10. The second color electrode 22 is patterned on the second optical filler layer 20 with a shadow mask, preferably wherein the width of the second color electrode 22 is the same the width of the second optical filler layer 20.

The layers that comprise the white OLED stack 26 are then individually deposited over the entire OLED array. Each layer of the white OLED stack 26 can be deposited through, for example, thermal evaporation, spin casting, or inkjet printing. For this embodiment, a preferred method is thermal evaporation. The organic layers that comprise the white OLED stack 26 are then deposited on the first and second color electrodes 14, 22 in the following order: an Organic Hole-Injection Layer (HIL) 84, an Organic Hole-Transporting Layer (HTL) 86, an Emissive Layer (EML) 88, an Organic Electron-Transporting Layer (ETL) 90, and an Organic Electron-Injection Layer (EIL) 92. The white OLED stack 26 can comprise of one or more of each of the organic layers. The organic layers are designed to emit white light, while each optical microcavity tunes the optical path length of various elements to achieve a specific color. A cathode 28 is then deposited on the white OLED stack 26 using, for example, thermal evaporation. In this embodiment, the cathode 28 is comprised of a semi-transparent or transparent material and a second DBR 12B is deposited on the cathode 28. The second DBR 12B comprises a series of alternating high refractive index dielectric layers 76 and low refractive index dielectric layers 78. The number of layers of high and low refractive index dielectric layers 76, 78 in the second DBR 12B can also be configured to be any integer. This configuration allows the second DBR 12B to act as the top reflective surface for the optical microcavity of each OLED device in the OLED array.

Figure 4:
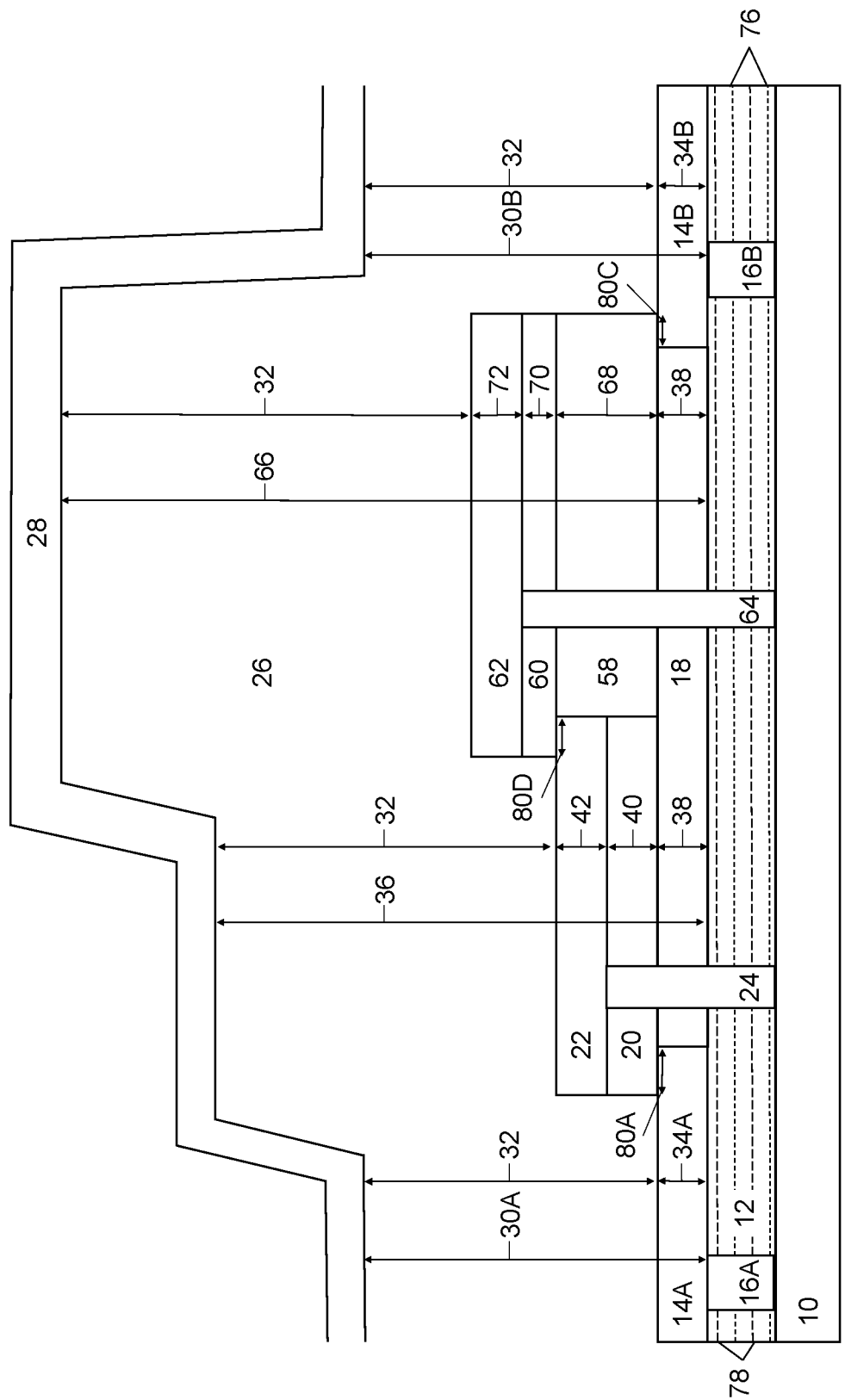
FIG. 4 illustrates an embodiment of a cross section of a three color optical microcavity OLED array as per the present disclosure.

FIG. 4 illustrates an embodiment of a cross section of a three color optical microcavity OLED array per the present disclosure. The OLED array comprises a DBR 12 deposited on a substrate 10. This cross section illustrates two OLED devices of the first color and a single OLED device for each of the second color and third color. In this embodiment the substrate 10 is a TFT substrate, which is a device that forms the base structure for the OLED array. The DBR 12 comprises a series of alternating high refractive index dielectric layers 76 and low refractive index dielectric layers 78, where the number of layers of high refractive index dielectric layers 76 and low refractive index dielectric layers 78 can be any integer. In this composition, the DBR 12 is the first reflective surface for the optical microcavity of each OLED device in the OLED array.

Before the first color electrodes 14A, 14B for an array of first color OLED devices are deposited on the DBR 12, first color vias 16A, 16B are dry etched through the DBR 12 to provide an electrical connection from the substrate 10 to the first color electrodes 14A, 14B. The vias may be etched by, for example, reactive ion etching, anodic plasma etching, magnetically enhanced reactive ion etching, triode reactive ion etching, and transmission-coupled plasma etching. One preferred dry etching method for constructing the vias is reactive ion etching. After the first color vias 16A, 16B are etched through the DBR 12, the first color electrodes 14A, 14B are patterned on the DBR 12 using a shadow mask. A first optical filler layer 18 is then patterned using photolithography directly on the DBR 12 between the first color electrodes 14A, 14B for each second color OLED device in the OLED array. A second optical filler layer 20 is then deposited on, and partially covers the first optical filler layer 18 and may overlap the first color electrode 14A, to form an overlap region 80A. The second optical filler layer 20 can be patterned using a shadow mask or photolithography. The overlap region 80A provide tolerances that mitigate alignment errors in fabrication, thus increasing the aperture ratio of the display through reducing the lateral spacing between OLED devices on the substrate 10.

Before a second color electrode 22 is deposited on the second optical filler layer 20, a second color via 24 is dry etched using reactive ion etching through the second optical filler layer 20, the first optical filler layer 18, and the DBR 12. The second color via 24 provides an electrical connection from the substrate 10 to the second color electrode 22. The second color electrode 22 is then patterned using a shadow mask on the second optical filler layer 20, preferably wherein the width of the second color electrode 22 is the same the width of the second optical filler layer 20. A third optical filler layer 58 is then patterned using photolithography for each third color OLED device in the OLED array on the first optical filler layer 18 adjacent to the second optical filler layer 20 and may overlap the first color electrode 14B to form an overlap region 80C. A fourth optical filler layer 60 is deposited for each third color OLED device in the OLED array on the third optical filler layer 58 and may overlap the second color electrode 22, to form an overlap region 80D. The fourth optical filler layer 60 can be patterned using a shadow mask or photolithography. The overlap regions 80C, 80D can mitigate alignment errors in fabrication and increase the aperture ratio of the display through reducing the lateral spacing between OLED devices on the substrate 10.

Before a third color electrode 62 is deposited on the fourth optical filler layer 60, a third color via 64 is dry etched, preferably using reactive ion etching, through the fourth optical filler layer 60, the third optical filler layer 58, the first optical filler layer 18, and the DBR 12. The third color via 64 provides an electrical connection from the substrate 10 to the third color electrode 62. The third color electrode 62 is then patterned using a shadow mask on the fourth optical filler layer 60, preferably wherein the width of the third color electrode 62 is the same width of the fourth optical filler layer 60. The layers that comprise a white OLED stack 26 are then deposited over the entire OLED array. A cathode 28 is then deposited on the white OLED stack 26 using, for example, thermal evaporation. In this embodiment, the cathode 28 is a reflective material and therefore is used to form an optical microcavity for each OLED device.

In this embodiment, the substrate 10 can be a thin film transistor (TFT) substrate comprised of semiconducting materials, a gate insulator, and a substrate. The semiconducting materials may include, for example, hydrogenated amorphous silicon, polycrystalline silicon, amorphous oxide semiconductors, cadmium selenide, zinc oxide; organic materials, such as pentacene, poly (3-hexylthiophene), poly (3-alkylthiophene), and poly (3-octylthiophene); or transparent electrodes, such as ITO. The gate insulator can be a metal passivated with a transparent insulator such as $SiO_2$ and $Si_3N_4$ or an organic material such as poly-methylmethacrylate. The substrate can also be a non-conducting material, such as glass. The DBR 12 comprises alternating high refractive index dielectric layers 76 and low refractive index dielectric material layers 78. The electrodes 14A, 14B, 22, 62 can be a semitransparent or transparent conducting material, such as ITO, a conducting polymer such as doped polyaniline, or a thin layer (between 5 and 35 nm, preferably less than 10 nm) of metal or alloy, and a carbon based material such as graphene. The transparent conducting materials such as ITO are preferred for this disclosure due to its high transmittance (80-85%) and low reflectivity and absorbance. The optical filler layers 18, 20, 58, 60 can comprise transparent polymers, such as polyimide, or inorganic transparent dielectrics with various refractive index values such as $Al_2O_3$, $SiO_2$, or $Si_3N_4$. The optical filler layers 18, 20, 58, 60 can be deposited through sputtering, thermal evaporation, chemical vapor deposition, atomic layer deposition. The preferred material for an optical filler layer has a refractive index similar to the bottom electrodes; for example ITO is the preferred material for the second color electrode 22 and the third color electrode 62, then $Al_2O_3$ is the preferred material for the optical filler layers. The preferred method of deposition is sputtering, which allows the designer to precisely adjust the thickness of the layers during deposition. The white OLED stack 26 comprises thin-film layers of organic material, which commonly include one or more of an Organic Hole-Injection Layer (HIL), an Organic Hole-Transporting Layer (HTL), an Emissive Layer (EML), an Organic Electron-Transporting Layer (ETL), and an Organic Electron-Injection Layer. The series of OLED layers are designed to emit white light. Each layer of the white OLED stack 26 can be deposited through thermal evaporation, spin casting, and inkjet printing. For this embodiment, the preferred method is thermal evaporation. The individual colors of each OLED device are achieved through modulating the optical path length for each optical microcavity. The cathode 28 can be a reflective metal with a reflectance greater than 90% such as aluminum, cadmium, or silver. This embodiment illustrates a conventional OLED configuration wherein the bottom electrodes 14A, 14B, 22, 62, below the white OLED stack 26 are anodes and the electrode above the white OLED stack 26 is a cathode 28. The present disclosure may also be configured as an array of inverted OLED devices, wherein the bottom electrode, deposited before the white OLED stack 26, is a cathode 28, and the top electrode above the white OLED stack 26 is an anode. The present disclosure may also be configured to be an array of bottom emitting OLED devices, wherein the bottom electrode, the DBR 12, and the substrate 10 are semi-transparent or transparent, emitting light through the substrate 10. The disclosed embodiment can be configured to be any combination of inverted or non-inverted and top or bottom emitting.

Each element that comprises the optical microcavity has an optical path length that is determined by the refractive index of the material and its thickness. The total optical path length for each color can be determined by the optical path length of each element that comprises the optical microcavity: the DBR 12, the electrodes 14, 22, 62, the optical filler layers 18, 20, 58, 60, the white OLED stack 26, and the cathode 28. Since the DBR 12 and cathode 28 are reflective surfaces that form the bounds of the optical microcavity, the penetration depth into the DBR 12 and the cathode 28 are considered in addition to the refractive index and the thickness. In this embodiment, the DBR 12 and cathode 28 are uniform and the white OLED stack 26 is designed to emit white light for the entire OLED array. The optical path lengths for each color include the penetration depth of the DBR 12 and the penetration depth of the cathode 28. These penetration depths are incorporated in design considerations but are constant across the OLED array. The DBR 12 and the cathode 28 shown are not used to tune the optical path length to emit a specific color.

Therefore:

$$\Lambda_{C1} = \Lambda_{e1} + \Lambda_{OLED} + (\Lambda_{CATHODE} + \Lambda_{DBR})$$

$$\Lambda_{C2} = \Lambda_{f1} + \Lambda_{f2} + \Lambda_{e2} + \Lambda_{OLED} + (\Lambda_{CATHODE} + \Lambda_{DBR})$$

$$\Lambda_{C3} = \Lambda_{f1} + \Lambda_{f3} + \Lambda_{f4} + \Lambda_{e3} + \Lambda_{OLED} + (\Lambda_{CATHODE} + \Lambda_{DBR})$$

The optical path length for each first color OLED device in the OLED array, $\Lambda_{C1}$, herein referred to as the optical path length of the first color 30A, 30B, is determined by the optical path length of the first electrode for each first color OLED device in the OLED array, herein referred to as the optical path length of the first electrode ($\Lambda_{e1}$) 34A, 34B and the optical path length of the white OLED stack ($\Lambda_{OLED}$) 32. The optical path length for each second color OLED device in the OLED array, $\Lambda_{C2}$, herein referred to as the optical path length of the second color ($\Lambda_{C2}$) 36, is determined by the sum of the optical path length of the first optical filler layer ($\Lambda_{f1}$) 38, the optical path length of the second optical filler layer ($\Lambda_{f2}$) 40, the optical path length of the second color electrode ($\Lambda_{e2}$) 42, and the optical path length of the white OLED stack ($\Lambda_{OLED}$) 32. The optical path length for each third color OLED device in the OLED array, $\Lambda_{C3}$, herein referred to as the optical path length of the third color ($\Lambda_{C3}$) 66, is determined by the sum of the optical path length of the first optical filler layer ($\Lambda_{f1}$) 38, the optical path length of the third optical filler layer ($\Lambda_{f3}$) 68, the optical path length of the fourth optical filler layer ($\Lambda_{f4}$) 70, the optical path length of the third color electrode ($\Lambda_{e3}$) 72, and the optical path length of the white OLED stack ($\Lambda_{OLED}$) 32.

Since the optical path length of each element in the optical microcavity is determined by the thickness of the element and its refractive index, adjusting the thicknesses of specific elements within the optical microcavity allows the designer to optimize the optical path length of the desired color. As the white OLED stack 26 is deposited across the OLED array, the optical path length of the white OLED stack ($\Lambda_{OLED}$) 32 can be designed to tune the optical path length for the first color ($\Lambda_{C1}$) 30A, 30B, which can be accomplished through optimizing the thickness of the white OLED stack 26. In particular, the optical path length for the first color ($\Lambda_{C1}$) 30A, 30B should be about or equal to the peak wavelength of the first color divided by two, times an integer. As the optical path length of the white OLED stack 32 is uniform across the OLED array the optical path length of the second optical filler layer ($\Lambda_{f2}$) 40 can also be designed taking into consideration the thickness of the second optical filler layer 20 to tune the optical path length required for the second color ($\Lambda_{C2}$) 36. Similarly, the optical path length of the fourth optical filler layer ($\Lambda_{f4}$) 70 can be designed taking into consideration the thickness of the fourth optical filler layer 62 to tune the optical path length required for the third color ($\Lambda_{C3}$) 66. Optimizing the optical path length for the first color 30A, 30B with the optical path length of the white OLED stack 32, as well as the optical path length of the second color 36 and the optical path length of the third color 66, with the optical path length of the optical filler layers 40, 70 is advantageous as the white OLED stack 26 can be uniform. The uniform white OLED stack 26 can then be deposited over the entire OLED array, thereby simplifying fabrication.

Figure 5:
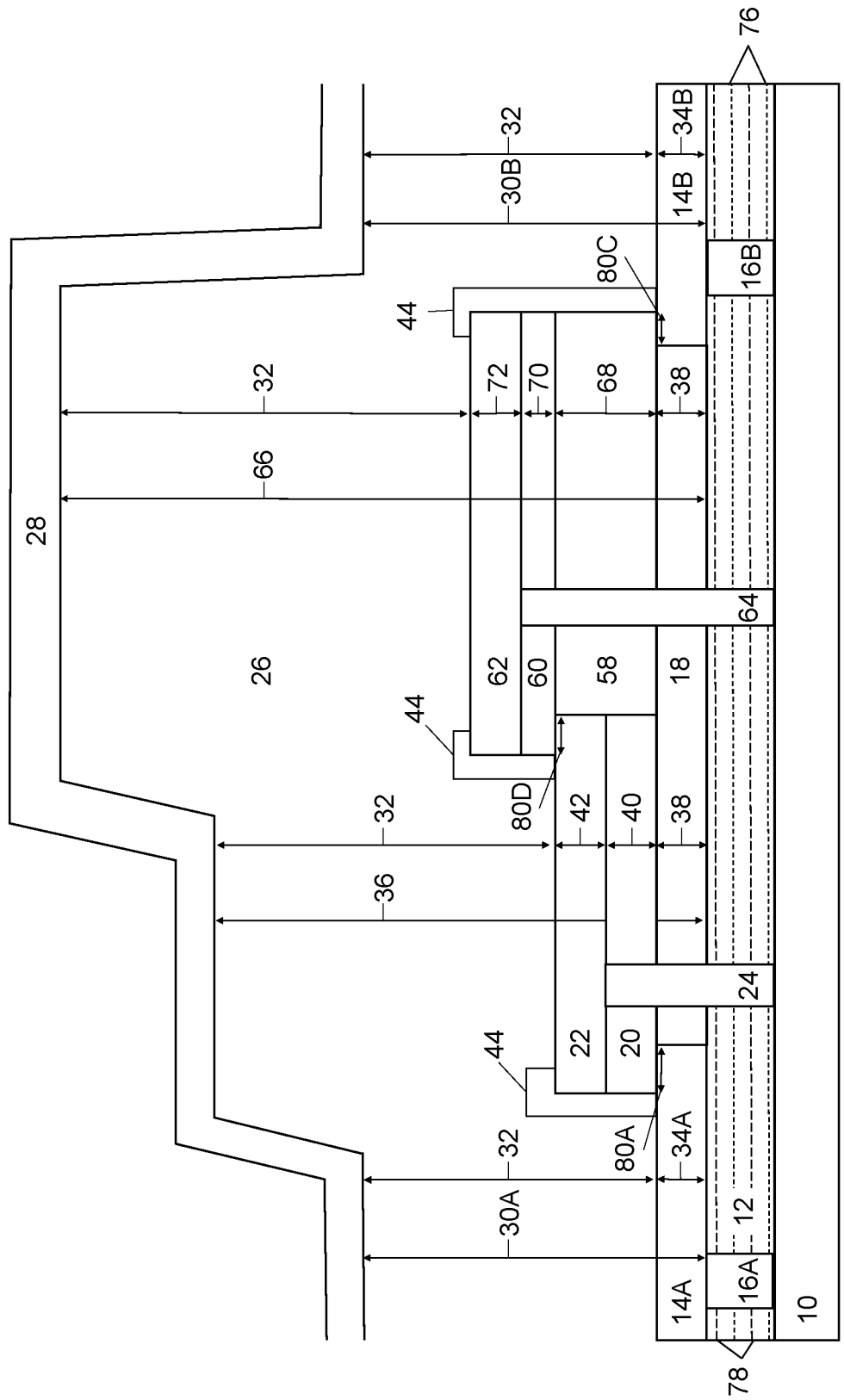
FIG. 5 illustrates an alternative embodiment of a three color optical microcavity OLED array as per the present disclosure including a PDL.

FIG. 5 illustrates an alternative embodiment of a three color optical microcavity OLED array as per the present disclosure including a pixel definition layer (PDL) 44. This cross section illustrates two OLED devices of the first color and a single OLED device for each of the second color and third color. The OLED array comprises a DBR 12 deposited on a substrate 10. In this embodiment the substrate 10 is a TFT substrate, which is a device that forms the base structure of the embodiment. The DBR 12 comprises a series of alternating high refractive index dielectric layers 76 and low refractive index dielectric layers 78. Before the first color electrodes 14A, 14B are deposited, a first color via 16A, 16B is dry etched through the DBR 12 for each first color electrode 14A, 14B to provide an electrical connection to the substrate 10. In this embodiment, the preferred dry etching method is reactive ion etching. The first color electrodes 14A, 14B are patterned on the DBR 12 using a shadow mask. The first optical filler layer 18 is patterned using photolithography on the DBR 12 between the first color electrodes 14A, 14B. The second optical filler layer 20 is deposited on, and partially covers the first optical filler layer 18 and may overlap the first color electrode 14A, to form an overlap region 80A. The second optical filler layer 20 can be patterned using a shadow mask or photolithography. The overlap region 80A provide tolerances that mitigate alignment errors in fabrication, thus increasing the aperture ratio of the display through reducing the lateral spacing between OLED devices on the substrate 10. A second color via 24 is then dry etched using reactive ion etching through the optical filler layer 18, 20 and the DBR 12 to provide an electrical connection for the second color electrode 22 to the substrate 10. The second color electrode 22 is patterned using a shadow mask on the second optical filler layer 20, wherein the width of the second color electrode 22 equals the width of the second optical filler layer 20. The third optical filler layer 58 is patterned using photolithography on the first optical filler layer 18 adjacent to the second optical filler layer 20 and may overlap the first color electrode 14B, to form an overlap region 80C. The fourth optical filler layer 60 is deposited on the third optical filler layer 58 and may overlap the second color electrode 22, to form an overlap region 80D. The fourth optical filler layer 60 can be patterned with a shadow mask or photolithography. The overlap regions 80C, 80D may mitigate alignment errors in fabrication, thus increasing the aperture ratio of the display through reducing the lateral spacing between OLED devices on the substrate 10. A third color via 64 is then dry etched using reactive ion etching through the optical filler layer 58, 60 and the DBR 12 to provide an electrical connection to the substrate 10. The third color electrode 62 is patterned using a shadow mask on the fourth optical filler layer 60, wherein the width of the third color electrode 62 equals the width of the fourth optical filler layer 60. In this embodiment, an optional PDL 44 is patterned using a shadow mask such that it covers the region of the second and third color electrodes 22, 62 and optical filler layers 20, 60, 58 that overhangs the respective adjacent first color electrodes 14A, 14B and second color electrode 22. The PDL 44 is then deposited between the first color electrode 14A and second color electrode 22, second color electrode 22 and third color electrode 62, and third color electrode 62 and first color electrode 14B. The PDL 44 can reduce crosstalk across the OLED array and prevent electrical shorting. The layers that comprise the white OLED stack 26 are then deposited over the entire OLED array. A cathode 28 is then deposited on the white OLED stack 26 using, for example, thermal evaporation. In this embodiment, the cathode 28 is a reflective material and forms part of the optical microcavity for each OLED device.

Each element that comprises the optical microcavity has an optical path length that is determined by the refractive index of the material and its thickness. The total optical path length for each color can be determined by the optical path length of each element that comprises the optical microcavity: the DBR 12, the electrodes 14, 22, 62, the optical filler layers 18, 20, 58, 60, the white OLED stack 26, and the cathode 28. Since the DBR 12 and cathode 28 are reflective surfaces that form the bounds of the optical microcavity, the penetration depth into the DBR 12 and the cathode 28 are considered in addition to the refractive index and the thickness. In this embodiment, the DBR 12 and cathode 28 are uniform and the white OLED stack 26 is designed to emit white light for the entire OLED array. The optical path lengths for each color include the penetration depth of the DBR 12 and the penetration depth of the cathode 28. These penetration depths are incorporated in design considerations but are constant across the OLED array. The DBR 12 and the cathode 28 are not used to tune the optical path length to emit a specific color.

Therefore:

$$\Lambda_{C1} = \Lambda_{e1} + \Lambda_{OLED} + (\Lambda_{CATHODE} + \Lambda_{DBR})$$

$$\Lambda_{C2} = \Lambda_{f1} + \Lambda_{f2} + \Lambda_{e2} + \Lambda_{OLED}(\Lambda_{CATHODE} + \Lambda_{DBR})$$

$$\Lambda_{C3} = \Lambda_{f1} + \Lambda_{f3} + \Lambda_{f4} + \Lambda_{e3} + \Lambda_{OLED} + (\Lambda_{CATHODE} + \Lambda_{DBR})$$

The optical path length of the first color ($\Lambda_{C1}$) 30A, 30B, is determined by the optical path length of the optical path length of the first electrode ($\Lambda_{e1}$) 34A, 34B and the optical path length of the white OLED stack ($\Lambda_{OLED}$) 32. The optical path length of the second color ($\Lambda_{C2}$) 36, is determined by the sum of the optical path length of the first optical filler layer ($\Lambda_{f1}$) 38, the optical path length of the second optical filler layer ($\Lambda_{f2}$) 40, the optical path length of the second color electrode ($\Lambda_{e2}$) 42, and the optical path length of the white OLED stack ($\Lambda_{OLED}$) 32. The optical path length of the third color ($\Lambda_{C3}$) 66, is determined by the sum of the optical path length of the first optical filler layer ($\Lambda_{f1}$) 38, the optical path length of the third optical filler layer ($\Lambda_{f3}$) 68, the optical path length of the fourth optical filler layer ($\Lambda_{f4}$) 70, the optical path length of the third color electrode ($\Lambda_{e3}$) 72, and the optical path length of the white OLED stack ($\Lambda_{OLED}$) 32.

Since the optical path length of each element in the optical microcavity is determined by the thickness of the element and its refractive index, adjusting the thicknesses of specific elements within the optical microcavity allows the designer to optimize the optical path length of the desired color. As the white OLED stack 26 is deposited across the OLED array; the optical path length of the white OLED stack ($\Lambda_{OLED}$) 32 may be designed to tune the optical path length for the first color ($\Lambda_{C1}$) 30A, 30B, which may be accomplished through optimizing the thickness of the white OLED stack 26. As the optical path length of the white OLED stack 32 is uniform across the OLED array the optical path length of the second optical filler layer ($\Lambda_{f2}$) 40 may be designed through the thickness of the second optical filler layer 20 to tune the optical path length required for the second color ($\Lambda_{C2}$) 36. Similarly, the optical path length of the fourth optical filler layer ($\Lambda_{f4}$) 70 may be designed through the thickness of the fourth optical filler layer 60 to tune the optical path length required for the third color ($\Lambda_{C3}$) 66.

Optimizing the optical path length for the first color 30A, 30B with the optical path length of the white OLED stack 32 and the optical path length of the second and third colors 36, 66 with the optical path length of the optical filler layers 40, 70 is advantageous as the white OLED stack 26 can be uniform. The uniform white OLED stack 26 can then be deposited over the entire OLED array, thereby simplifying fabrication.

Figure 6:
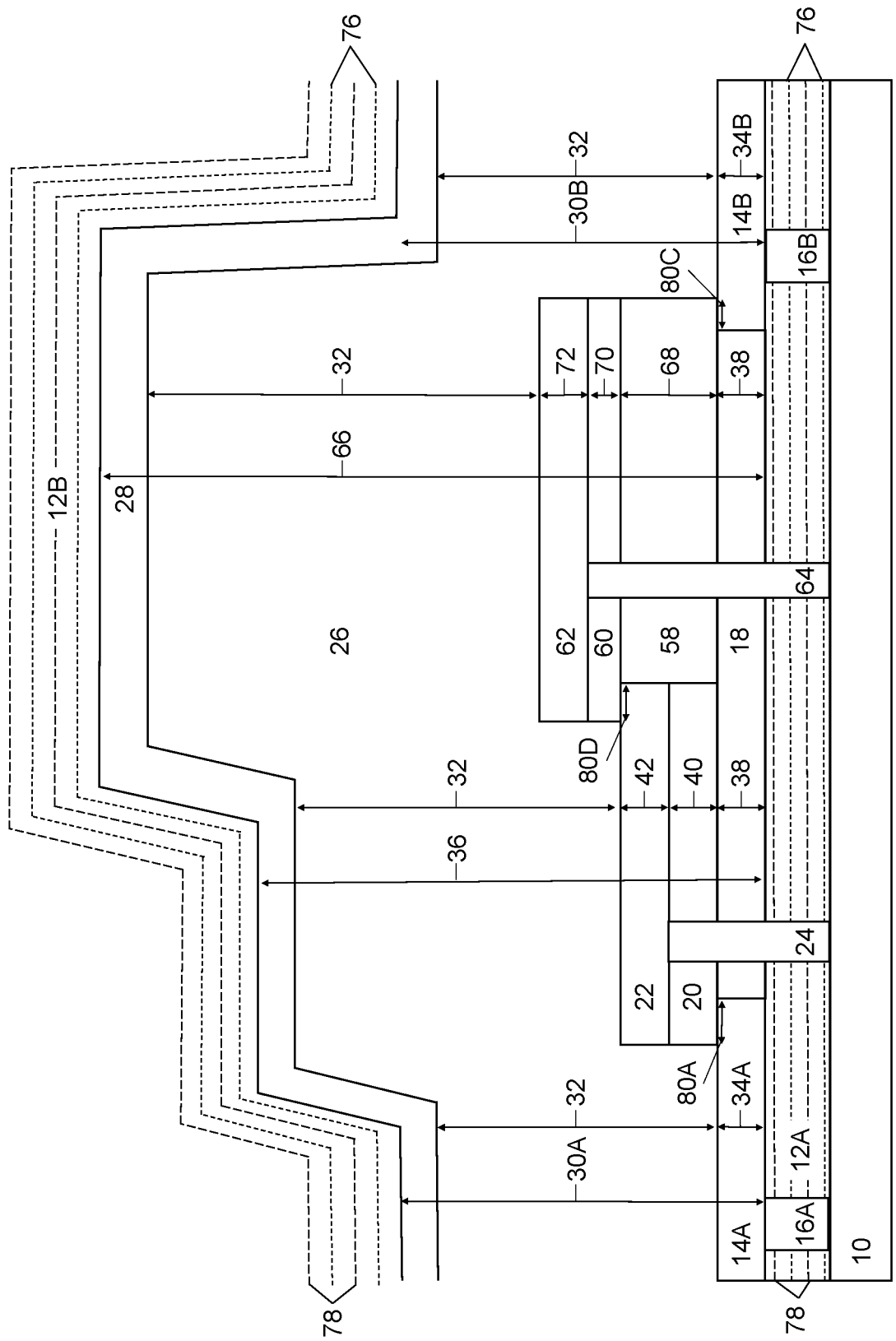
FIG. 6 illustrates an alternative embodiment of a three color optical microcavity OLED array as per the present disclosure including an additional DBR deposited on the cathode.

FIG. 6 illustrates an alternative embodiment of a three color optical microcavity OLED array as per the present disclosure including a second DBR 12B deposited on the cathode 28. This cross section illustrates two OLED devices of the first color and a single OLED device for each of the second color and third color. The OLED array comprises a first DBR 12A deposited on a substrate 10. In this embodiment the substrate 10 is a TFT substrate that forms the base structure of the embodiment. The first DBR 12A comprises a series of alternating high refractive index dielectric layers 76 and low refractive index dielectric layers 78. A first color via 16A, 16B is dry etched through the first DBR 12A for each first color electrode 14A, 14B to provide an electrical connection to the substrate 10. The first color electrodes 14A, 14B are then patterned on the first DBR 12A with a shadow mask. The first optical filler layer 18 is then patterned using photolithography on the first DBR 12A between the first color electrodes 14A, 14B. The second optical filler layer 20 is then deposited on, and partially covers the first optical filler layer 18 and may overlap the first color electrode 14A, to form an overlap region 80A. The second optical filler layer 20 can then be patterned using a shadow mask or photolithography. The overlap region 80A provide tolerances that mitigate alignment errors in fabrication, thus increasing the aperture ratio of the display through reducing the lateral spacing between OLED devices on the substrate 10. A second color via 24 is then etched through the first optical filler layer 18 and second optical filler layer 20 and the first DBR 12A to provide an electrical connection for the second color electrode 22 to the substrate 10. The second color electrode 22 is then patterned using a shadow mask on the second optical filler layer 20, wherein the width of the second color electrode 22 equals the width of the second optical filler layer 20. The third optical filler layer 58 is then patterned using photolithography on the first optical filler layer 18 adjacent to the second optical filler layer 20 and may overlap the first color electrode 14B, to form an overlap region 80C. The fourth optical filler layer 60 is then deposited on the third optical filler layer 58 and may overlap the second color electrode 22, to form an overlap region 80D. The fourth optical filler layer 60 can be patterned using a shadow mask or photolithography. The overlap regions 80C, 80D may mitigate alignment errors in fabrication, thus increasing the aperture ratio of the display through reducing the lateral spacing between OLED devices on the substrate 10. A third color via 64 is then dry etched through the optical filler layers 58, 60 and the first DBR 12A to provide an electrical connection to the substrate 10. The third color electrode 62 is then patterned using a shadow mask on the fourth optical filler layer 60, wherein the width of the third color electrode 62 equals the width of the fourth optical filler layer 60. The layers that comprise the white OLED stack 26 are deposited over the entire OLED array. The cathode 28 is then deposited on the white OLED stack 26 using, for example, thermal evaporation. In this embodiment, a second DBR 12B is deposited on the cathode 28. The second DBR 12B comprises a series of alternating high refractive index dielectric layers 76 and low refractive index dielectric layers 78. The cathode 28 is comprised of a semi-transparent or transparent material and the second DBR 12B is used to form an optical microcavity for each OLED optical microcavity device.

Each element that comprises the optical microcavity has an optical path length that is determined by the refractive index of the material and its thickness. The total optical path length for each color can be determined by the optical path length of each element that comprises the optical microcavity: first DBR 12A, electrodes 14, 22, 62, optical filler layers 18, 20, 58, 60, white OLED stack 26, cathode 28, and second DBR 12B. Since the first DBR 12A and second DBR 12B are reflective surfaces that form the bounds of the optical microcavity, the penetration depth into the DBRs 12A, 12B are considered in addition to the refractive index and the thickness in the calculation for each optical path length. In this embodiment, the DBRs 12A, 12B and cathode 28 are uniform and the white OLED stack 26 is designed to emit white light for the entire OLED array. The optical path lengths for each color include the penetration depth of the first DBR 12A, the penetration depth of the second DBR 12B, and the optical path length of the cathode 28. These penetration depths and corresponding optical path lengths are incorporated in design considerations but are constant across the OLED array. The first DBR 12A, the second DBR 12B, and the cathode 28 are not used to tune the optical path length to emit a specific color.

Therefore:

$$\Lambda_{C1}=\Lambda_{e1}+\Lambda_{OLED}+(\Lambda_{CATHODE}+\Lambda_{DBR\ A}+\Lambda_{DBR\ B})$$

$$\Lambda_{C2}=\Lambda_{f1}+\Lambda_{f2}+\Lambda_{e2}+\Lambda_{OLED}+(\Lambda_{CATHODE}+\Lambda_{DBR\ A}+\Lambda_{DBR\ B})$$

$$\Lambda_{C3}=\Lambda_{f1}+\Lambda_{f3}+\Lambda_{f4}+\Lambda_{e3}+\Lambda_{OLED}+(\Lambda_{CATHODE}+\Lambda_{DBR\ A}+\Lambda_{DBR\ B})$$

The optical path length of the first color ($\Lambda_{C1}$) 30A, 30B, is determined by the optical path length of the optical path length of the first electrode ($\Lambda_{e1}$) 34A, 34B and the optical path length of the white OLED stack ($\Lambda_{OLED}$) 32. The optical path length of the second color ($\Lambda_{C2}$) 36, is determined by the sum of the optical path length of the first optical filler layer ($\Lambda_{f1}$) 38, the optical path length of the second optical filler layer ($\Lambda_{f2}$) 40, the optical path length of the second color electrode ($\Lambda_{e2}$) 42, and the optical path length of the white OLED stack ($\Lambda_{OLED}$) 32. The optical path length of the third color ($\Lambda_{C3}$) 66, is determined by the sum of the optical path length of the first optical filler layer ($\Lambda_{f1}$) 38, the optical path length of the third optical filler layer ($\Lambda_{f3}$) 68, the optical path length of the fourth optical filler layer ($\Lambda_{f4}$) 70, the optical path length of the third color electrode ($\Lambda_{e3}$) 72, and the optical path length of the white OLED stack ($\Lambda_{OLED}$) 32.

Since the optical path length of each element in the optical microcavity is determined by the thickness of the element and its refractive index, adjusting the thicknesses of specific elements within the optical microcavity allows the designer to optimize the optical path length of the desired color. As the white OLED stack 26 is deposited across the OLED array; the optical path length of the white OLED stack ($\Lambda_{OLED}$) 32 may be designed to tune the optical path length for the first color ($\Lambda_{C1}$) 30A, 30B, which may be accomplished through optimizing the thickness of the white OLED stack 26. As the optical path length of the white OLED stack 32 is uniform across the OLED array the optical path length of the second optical filler layer ($\Lambda_{f2}$) 40 may be designed through the thickness of the second optical filler layer 20 to tune the optical path length required for the second color ($\Lambda_{C2}$) 36. Similarly, the optical path length of the fourth optical filler layer ($\Lambda_{f4}$) 70 may be designed through the thickness of the fourth optical filler layer 60 to tune the optical path length required for the third color ($\Lambda_{C3}$) 66. Optimizing the optical path length for the first color 30A, 30B with the optical path length of the white OLED stack 32 and the optical path length of the second and third colors 36, 66 with the optical path length of the optical filler layers 40, 70 is advantageous as the white OLED stack 26 can be uniform. The uniform white OLED stack 26 can then be deposited over the entire OLED array, thereby simplifying fabrication.

Figure 7:
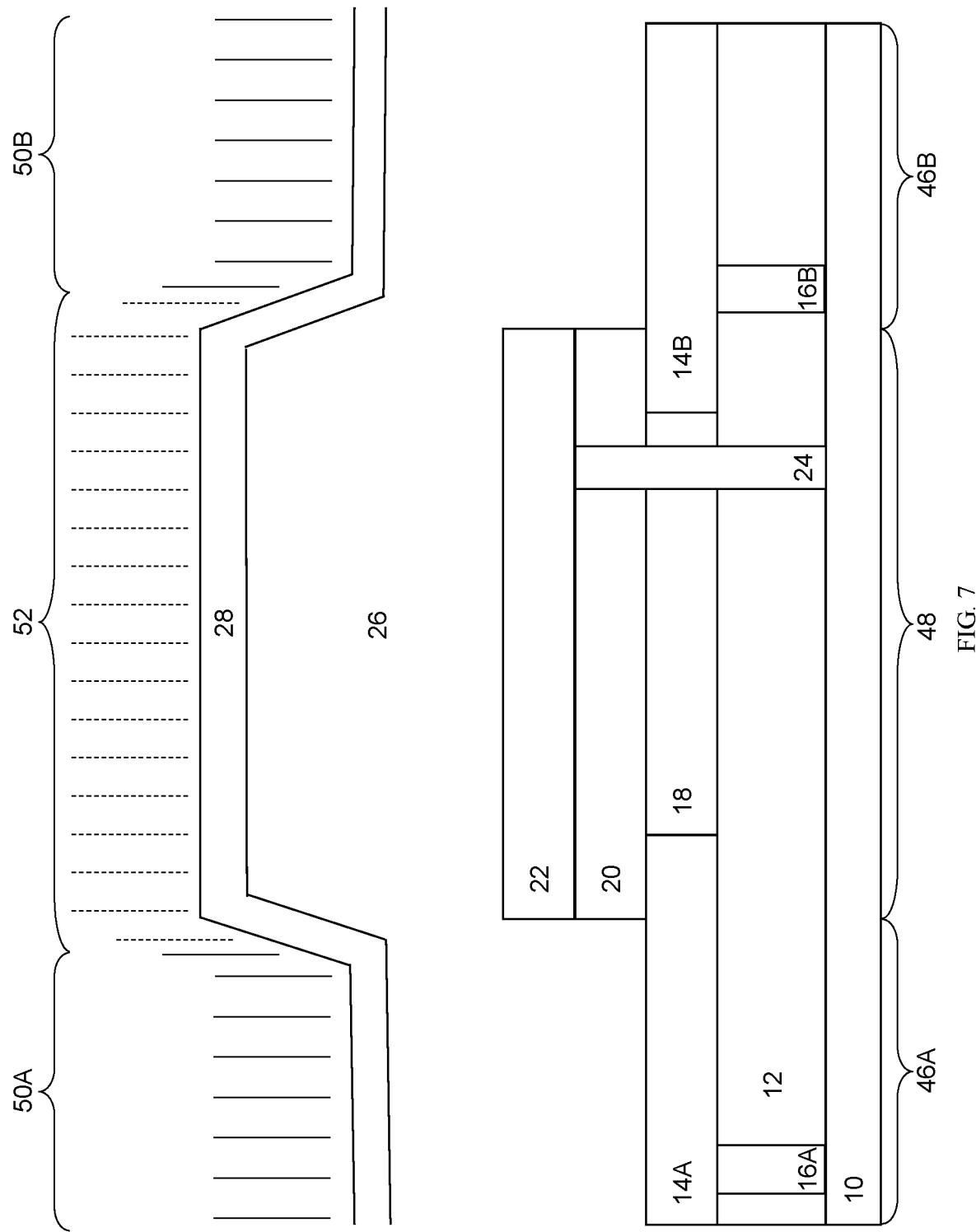
FIG. 7 illustrates an embodiment of a light path from the TFT substrate to emission of the two color optical microcavity OLED array as per the present disclosure.

FIG. 7 illustrates an embodiment of a light path from the substrate 10 to first color light emission 50A, 50B, and second color light emission 52 of a two color optical microcavity OLED array as per the present disclosure. Each subpixel in a series of subpixels for an array of first color OLED devices, herein referred to as the first color subpixel 46A, 46B, is the width of the light emitting area for each first color OLED device, illustrated as the first color light emission 50A, 50B, respectively. Each subpixel in a series of subpixels for an array of second color OLED devices, herein referred to as the second color subpixel 48, is the width of the light emitting area for each second color OLED device, illustrated as the second color light emission 52. An electrical current originating in the substrate 10 flows through first color vias 16A, 16B, and second color via 24, to first color electrodes 14A, 14B, and second color electrode 22, respectively, to the cathode 28 through the white OLED stack 26. One skilled in the art will understand that the many layers that comprise the white OLED stack 26 create a luminescent region where electrons give up energy in the form of a photon of light, which is emitted as first color light emission 50A, 50B, and second color light emission 52, respectively. The area under first color light emission 50A, 50B can be thought of as an individual optical microcavity for the first color. The design of this optical microcavity is optimized to emit light for the first color. The area under second color light emission 52 can be thought of as an individual optical microcavity for the second color. The design of this optical microcavity is optimized to emit light for the second color. The optical microcavity forms an area for optical resonance to occur to generate and emit a specific color of light. This light is optimized for the first and second colors through the design of the length of the corresponding optical microcavity created by the distance between the top of the DBR 12 and the bottom of the cathode 28. The white OLED stack 26 is also designed to create the desired optical microcavity for the first color OLED device. The first optical filler layer 18 and second optical filler layer 20 are transparent or semi-transparent, creating the desired optical microcavity length for the second color OLED device. The patterning of the first color electrodes 14A, 14B and second color electrode 22 is designed to minimize lateral spacing allows the first color subpixels 46A, 46B and second color subpixel 48 and their corresponding light emitting regions 50A, 50B, 52, respectively, to fully utilize the light emitting area, thereby increasing the aperture ratio of the light field display.

Figure 8:
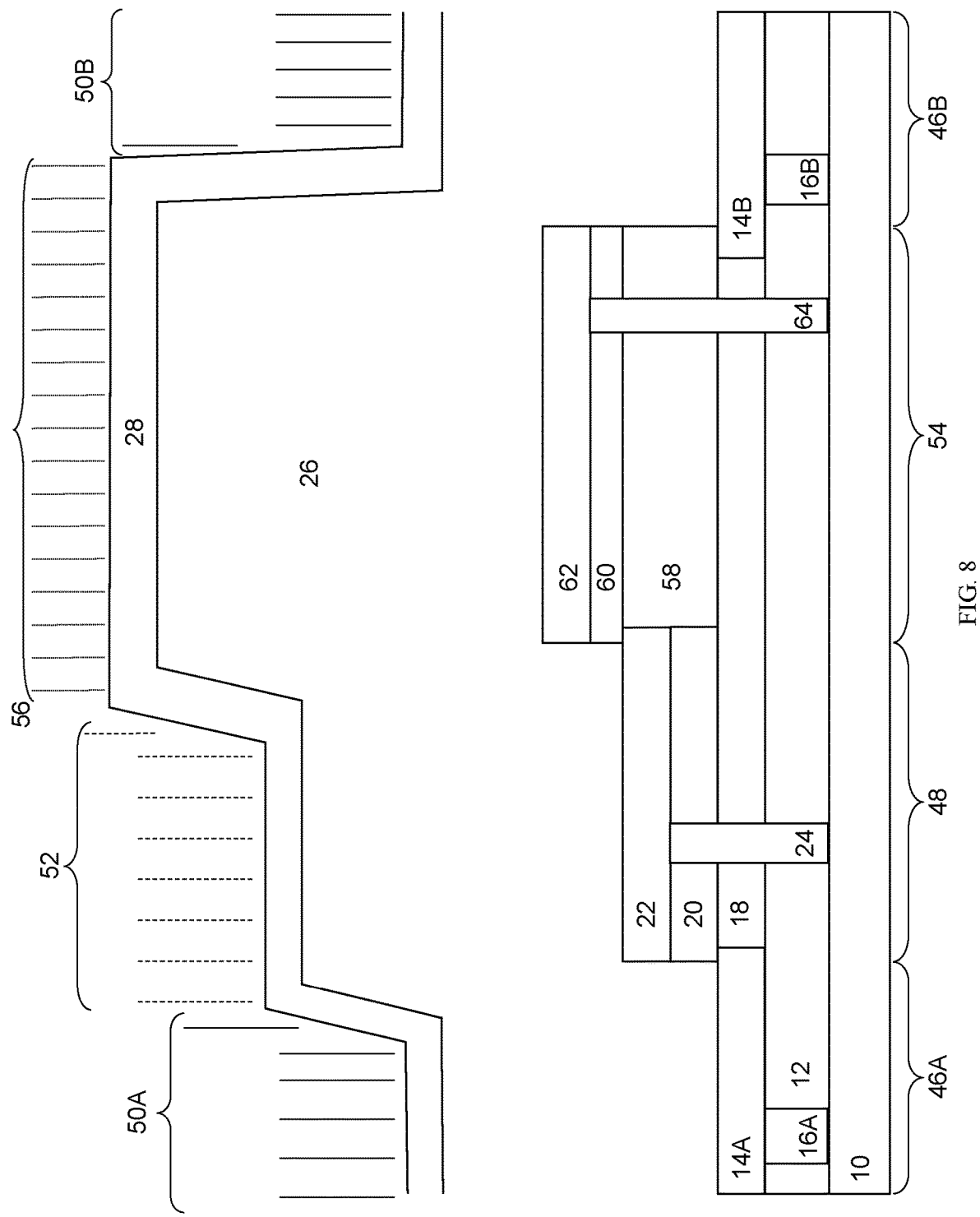
FIG. 8 illustrates an embodiment of a light path from the TFT substrate to emission of the three color optical microcavity OLED array as per the present disclosure.

FIG. 8 illustrates an embodiment of a light path from the substrate 10 to first color light emission 50A, 50B, second color light emission 52, and third color light emission 56 of the three color optical microcavity OLED array as per the present disclosure. Each subpixel in a series of subpixels for an array of first color OLED devices, herein referred to as the first color subpixel 46A, 46B, is the width of the light emitting area for each first color OLED device, illustrated as the first color light emission 50A, 50B. Each subpixel in a series of subpixels for an array of second color OLED devices, herein referred to as the second color subpixel 48, is the width of the light emitting area for each second color OLED device, illustrated as the second color light emission 52. Each subpixel in a series of subpixels for an array of third color OLED devices, herein referred to as the third color subpixel 54, is the width of the light emitting area for each third color OLED device, illustrated as the third color light emission 56. It is understood that three-color OLED arrays in accordance with the present disclosure comprise a plurality of first color subpixels, second color subpixels, and third color subpixels. An electrical current originating in the substrate 10 flows through vias 16A, 16B, 24, 64, to electrodes 14A, 14B, 22, 62, and to the cathode 28 through the white OLED stack 26. The layers that comprise the white OLED stack 26 create a luminescent region where electrons give up energy in the form of a photon of light, which is emitted as first color light emission 50A, 50B, second color light emission 52, and third color light emission 56. The emitted light is optimized for the first, second, and third colors through the length of the corresponding optical microcavity created by the distance between the top of the DBR 12 and the bottom of the cathode 28, and the white OLED stack 26 is designed to create the desired optical microcavity for the first colored OLED devices. The first optical filler layer 18 and second optical filler layer 20 are transparent or semi-transparent, creating the desired optical microcavity length for the second color OLED device. The first optical filler layer 18, third optical filler layer 58, and fourth optical filler layer 60 are transparent or semi-transparent, creating the desired optical microcavity length for the third color OLED device. The patterning of the first color electrodes 14A, 14B, second color electrode 22, and third color electrode 62 minimizes lateral spacing to allow the first color subpixels 46A, 46B, second color subpixel 48, and third color subpixel 54 and their corresponding light emitting regions 50A, 50B, 52, 56 to fully utilize the light emitting area, thereby increasing the aperture ratio of the light field display.

Figure 9:
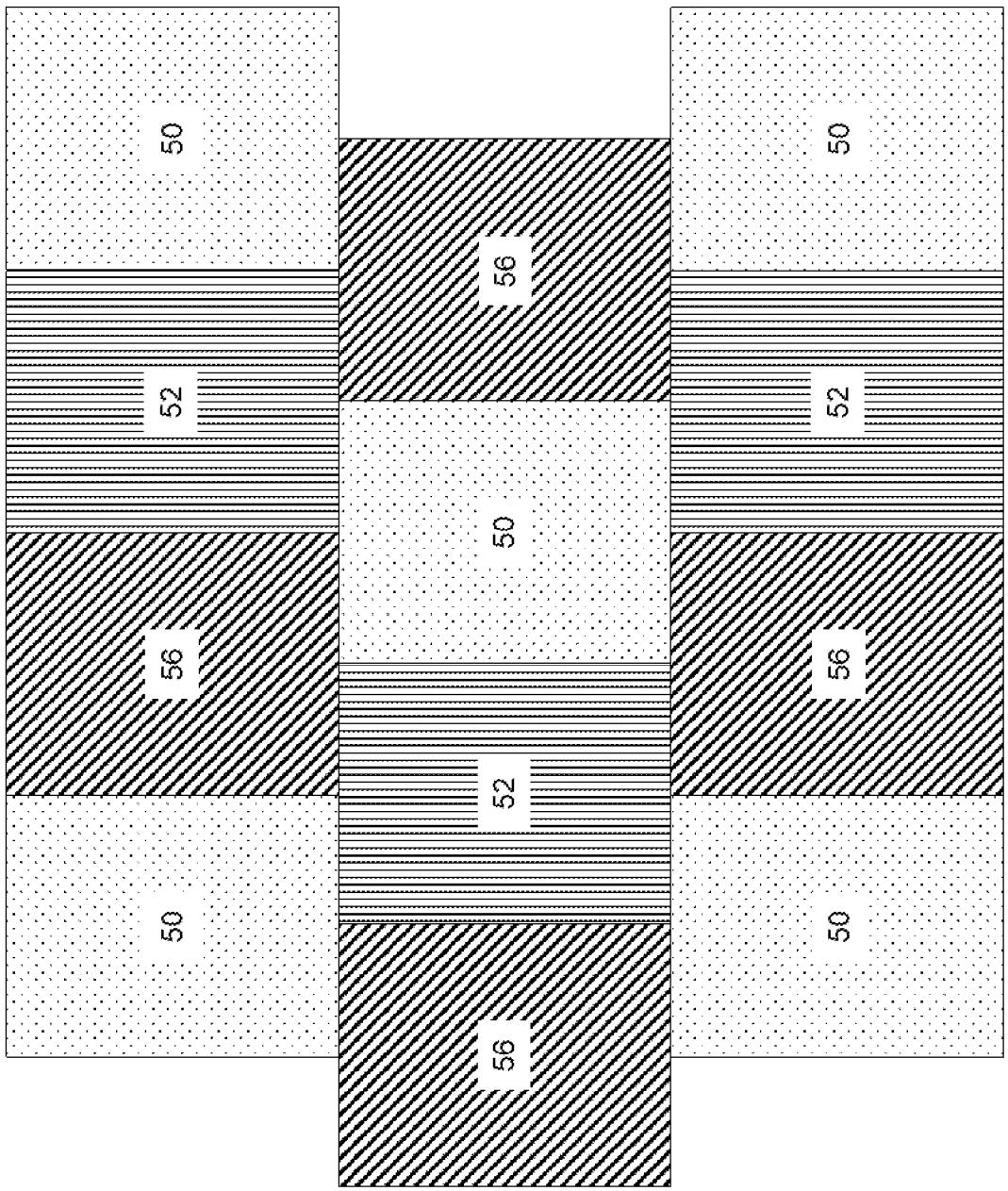
FIG. 9 illustrates the top view of an embodiment of light emission from the three color optical microcavity OLED array as per the present disclosure.

FIG. 9 illustrates a top view of light emission from a three color optical microcavity OLED array with overlapping subpixels as per the present disclosure. The overlapping patterning of first color electrodes, second color electrodes, and third color electrodes minimize lateral spacing and cause the three colors of subpixels and their corresponding light emitting regions to overlap. This allows the OLED array to fully utilize the light emitting area, thereby increasing the aperture ratio of the light field display. As shown, first color light emission 50, second color light emission 52, and third color light emission 56 overlap. FIG. 9 illustrates a delta triad subpixel configuration, which is one possible configuration of a three color OLED array as presently described.

Fabrication of optical microcavity OLED devices suitable for light field displays is inherently complicated due to the pixel size required to achieve a high aperture display. FIGS. 10A-N illustrate a method for fabricating a two color OLED array as per the present disclosure.

FIG. 10A illustrates a first step in fabrication, depositing the DBR 12 on the substrate 10. In this embodiment the substrate 10 is a TFT substrate, which is a device that forms the base structure of the embodiment. It is understood that the DBR 12 illustrated in FIG. 10A comprises of alternating high refractive index dielectric layers and low refractive index dielectric layers. Each layer of the DBR 12 can be deposited through sputtering, thermal evaporation, chemical vapor deposition, and atomic layer deposition. The preferred method of deposition for this embodiment is sputtering.

FIG. 10B illustrates first color vias 16A, 16B dry etched through the DBR 12 to connect to the substrate 10. The via may be etched by reactive ion etching, anodic plasma etching, magnetically enhanced reactive ion etching, triode reactive ion etching, and transmission-coupled plasma etching. In this embodiment, the preferred dry etching method is reactive ion etching.

Figure 10C:
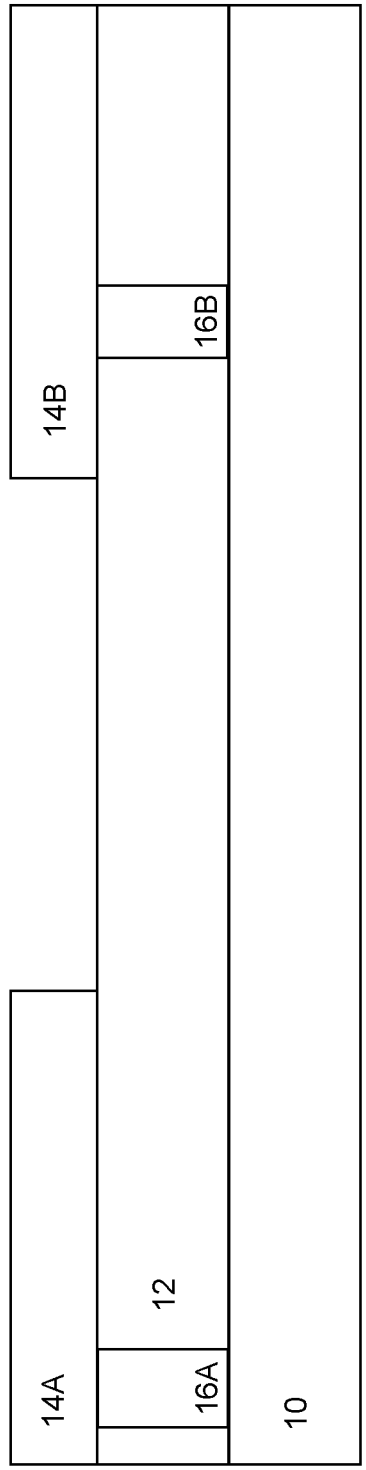
FIG. 10C illustrates step 3 of the proposed two color OLED array patterning process for depositing a first color electrode.

FIG. 10C illustrates first color electrodes 14A, 14B deposited on the DBR 12. The first color vias 16A, 16B provide an electrical connection for the first color electrodes 14A, 14B to the substrate 10. The electrodes can be patterned on through sputtering, thermal evaporation, and spin coating. In this embodiment sputtering is the preferred method of deposition. A shadow mask can be used for depositing elements, for example in this embodiment the first color electrodes 14A, 14B, in the desired pattern. Shadow masks are generally micro-structures, or stencils, that are used to define device areas, with precision, for deposition, etching, or a variety of applications suitable for processing a substrate. The shadow masks are designed with specific perforations that when placed on a substrate, allow for precise patterning of elements during deposition. Precision is particularly important when depositing micron sized OLED devices as alignment or deposition errors can occur. This will result in non-optimal electrical properties and optical characteristics of the OLED device, reducing the aperture ratio of the OLED array. A shadow mask is the tool used to pattern the substrate, wherein any of the suitable deposition methods, for example in this embodiment sputtering, thermal evaporation, and spin coating, can be used with a shadow mask to deposit the desired pattern of the first color electrodes 14A, 14B on the DBR 12.

FIGS. 10D-G illustrate a series of photolithography steps for patterning a first optical filler layer. Photolithography is a widely used fabrication technique to transfer a pattern through a photomask onto a substrate using a photoresist and ultraviolet (UV) light. The photomask can be, for example, a thin plate with a sub-micrometer or nanometer size pattern with opaque and transparent regions in a desired pattern, and preferably comprises glass or fused silica. The photomask is used in combination with UV light to transfer a pattern from the mask to the substrate in high resolution photolithography. Photolithography is a process that begins with, for example, cleaning the top surface with a solvent such as acetone, methanol, and isopropanol, followed by deionized water. It should be noted that a shadow mask may be used for any patterning step in this embodiment if the desired pixel size is larger than this embodiment.

Figure 10D:
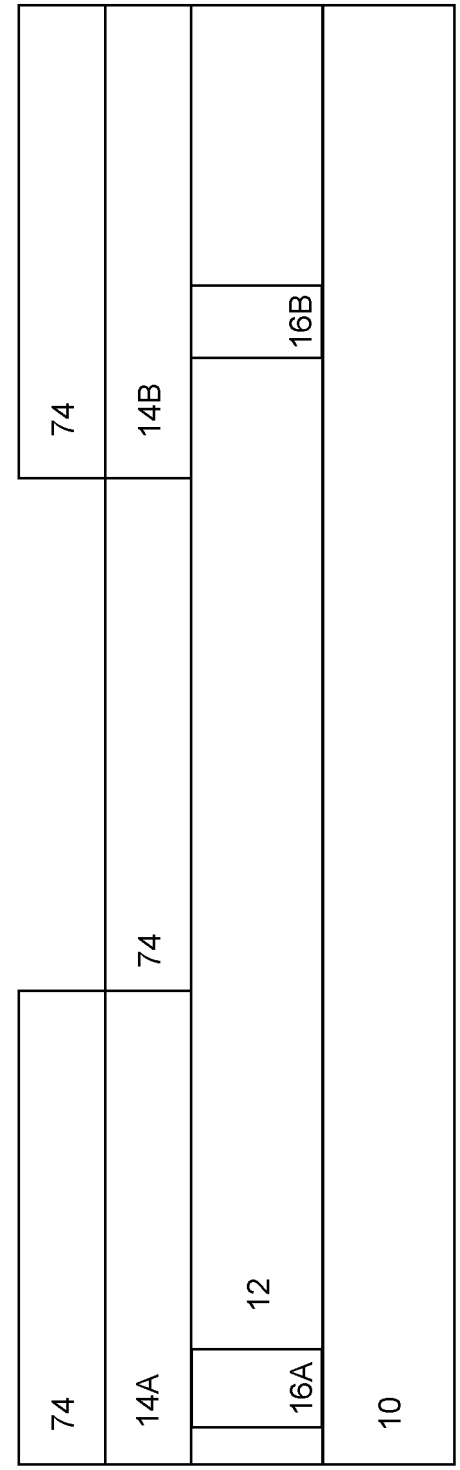
FIG. 10D illustrates step 4 of the proposed two color OLED array patterning process for depositing a photoresist.

FIG. 10D illustrates a cross sectional view of the embodiment following deposition of photoresist 74. Deposition can be achieved, for example, through spin coating deposition. Photoresist 74 is deposited on a structure comprising a substrate 10, having a DBR 12 deposited thereon with first color electrodes 14A, 14B stacked upon the DBR 12 connected to the substrate 10 by vias 16A, 16B respectively. The structure with the photoresist 74 is soft baked at a temperature below about 110° C. to remove the solvent content. A patterning step using, for example, a photomask, which is designed with a series of nanosized opaque and transparent sections of a specific pattern wherein the pattern can be transferred onto the top layer during a photolithography process. The photomask can be comprised of glass, fused silica, or other suitable material. In this embodiment a photomask is applied with a design that has opaque sections in the pattern of the first color electrodes 14A, 14B.

In FIG. 10E the structure on substrate 10 with the photomask is exposed to UV light. The UV light causes a chemical change that allows the photoresist 74 to be removed by etching. During photolithography photoresist 74 in the region where first optical filler layer is desired to be applied between first electrodes 14A, 14B is removed, exposing DBR 12, while photoresist above the first electrodes 14A, 14B with vias 16A, 16B remains intact. There are two types of photoresists: positive and negative. Positive photoresists chemically change to become soluble to etching when exposed to UV light, and only the exposed portions of the photoresist will be removed through etching subsequent to UV exposure. The unexposed portion of the photoresist remains insoluble. In negative photoresists the portion of the photoresist that is exposed to light becomes insoluble to etching. In this example, photoresist 74 is preferably a positive photoresist, which has been found to be easier to control during photolithography as it can maintain its size and pattern, has better etching resistance, and has superior resolution and thermal stability. It is understood, however, that negative photoresists may also be used. Etching removes the photoresist layer from the embodiment through chemical etching, which may be referred to as a developer; plasma etching; reactive ion etching; and ion beam milling. The photoresist material and etching process, which may include the developer material, are specifically designed to work in cooperation to create a high-quality pattern without affecting the other deposited materials on the embodiment. A mask, or photomask, controls where light (i.e. UV light for photolithography) shines on the wafer or substrate. The photomask may comprise an opaque plate with perforations or transparent regions that allows light to shine through at defined locations. Photomask materials can include, for example, fused silica (quartz glass) with a coating pattern made of chrome. There are instances wherein the photomask will get further coated with Teflon to help prevent stiction issues during contact photolithography. For a positive photoresist, the photomask will have the desired pattern and transfer that pattern to the embodiment through the photolithography process.

FIG. 10F illustrates the deposition of the first optical filler layer 18 over the entire OLED array. The first optical filler layer 18 can be deposited on the DBR 12 and photoresist 74 protecting first electrodes 14A, 14B and vias 16A, 16B by, for example, sputtering, thermal evaporation, chemical vapor deposition, or atomic layer deposition. One preferred method of deposition is sputtering, which allows the designer to precisely adjust the thickness of the layers during deposition. Substrate 10 and layers thereon is then exposed to a stripper that removes the photoresist 74 as well as the first optical filler layer 18 deposited on the photoresist 74. The photoresist stripper interacts with, fragments, and removes the photoresist 74 while the remaining layers already deposited on the substrate are kept intact. Some examples of photoresist strippers are, for example: solvents such as acetone, NMP (1-methyl-2-pyrrolidone), dimethyl sulfoxide; alkaline media such as potassium hydroxide (KOH) or sodium hydroxide (NaOH) at 2-3% concentrate; hydrofluoroethers; commercially available removers such as AZ 100, TechniStrip P1316, P1331, N1555; and combustion using $O_2$ plasma.

Figure 10G:
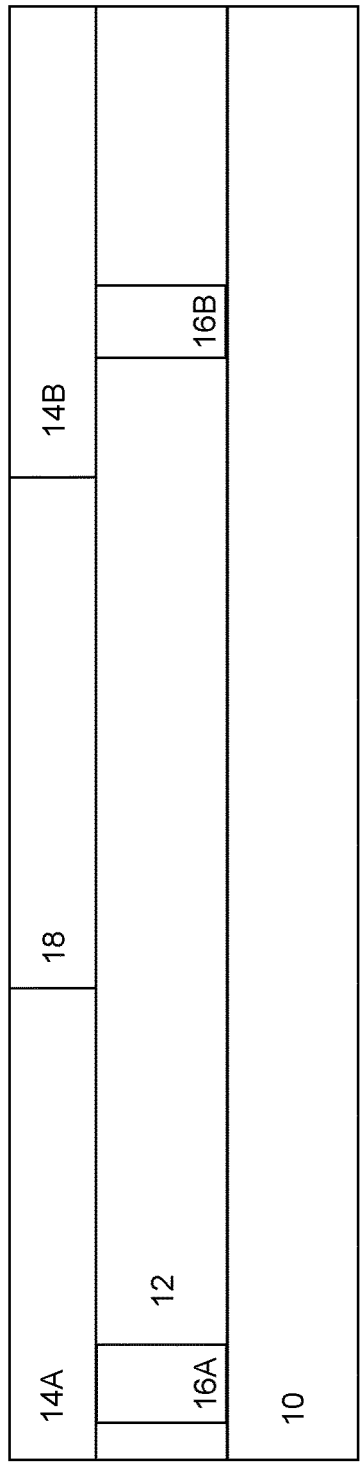
FIG. 10G illustrates step 7 of the proposed two color OLED array patterning process for a photolithography step, which lifts off the remaining photoresist thereby removing the first optical filler layer that was deposited on the photoresist.

FIG. 10G illustrates a substrate 10 after the remaining photoresist and the first optical filler layer 18 that was deposited on the photoresist are removed. It should be noted that the entirety of this photolithography process can be repeated for the deposition of all subsequent optical filler layers disclosed herein. DBR 12, first electrodes 14A, 14B and vias 16A, 16B remain intact on substrate 10.

Figure 10H:
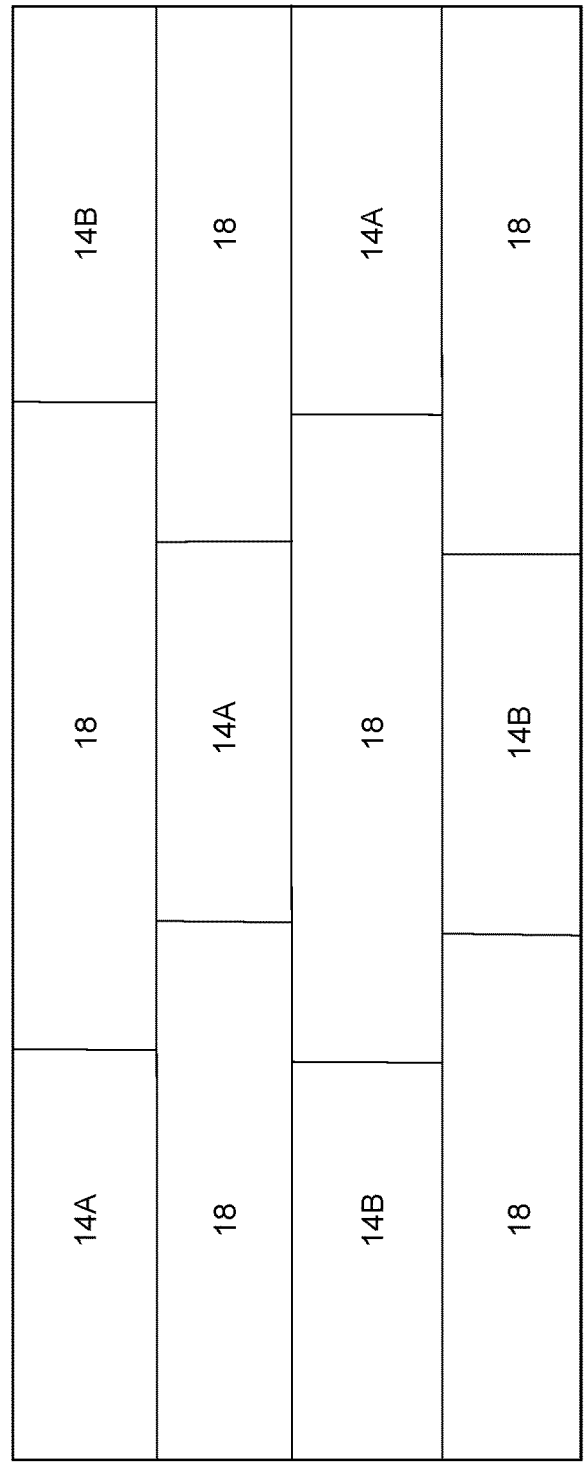
FIG. 10H illustrates a top view of step 7 of the proposed two color OLED array patterning process.

FIG. 10H illustrates a top view of the embodiment in FIG. 10G after the photolithography step is completed. The pattern of the first color electrodes 14A, 14B and the first optical filler layer 18 across the OLED array is shown, and particularly how the patterning eliminates spacing between OLED devices.

Figure 10I:
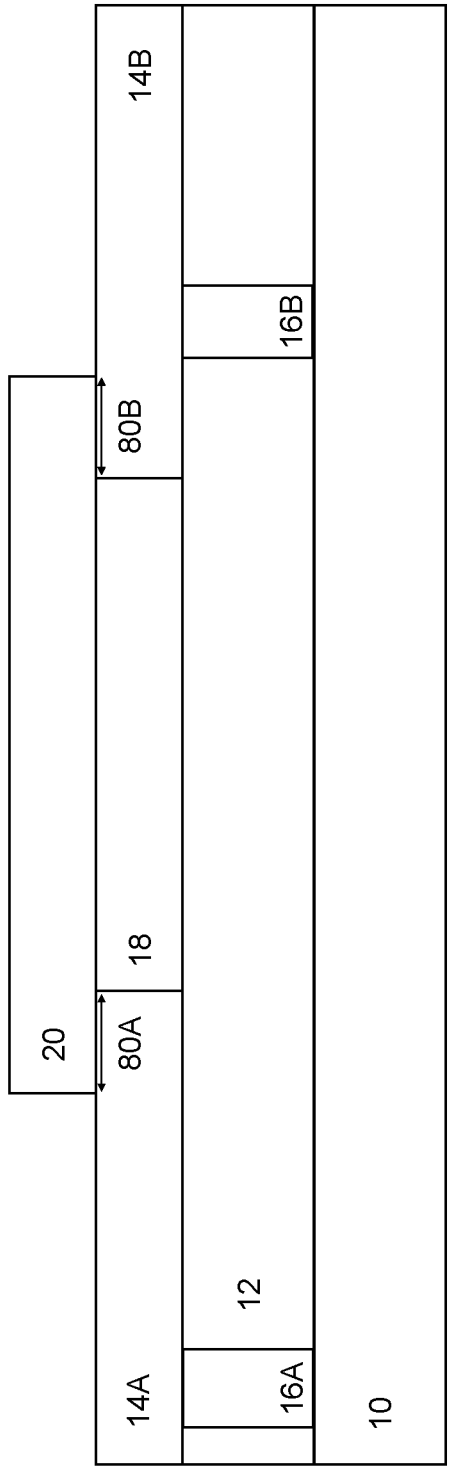
FIG. 10I illustrates step 8 of the proposed two color OLED array patterning process for depositing a second optical filler layer.

FIG. 10I illustrates the second optical filler layer 20 deposited on the first optical filler layer 18 covering the entire first optical filler layer 18 and partially overlapping the first color electrodes 14A, 14B, to form overlap regions 80A, 80B. The second optical filler layer 20 can be deposited through, for example, sputtering, thermal evaporation, chemical vapor deposition, or atomic layer deposition. One preferred method of deposition is sputtering, which allows the designer to precisely adjust the thickness of the layers during deposition. The overlap regions 80A, 80B provide tolerances that mitigate alignment errors in fabrication, thus increasing the aperture ratio of the display through reducing the lateral spacing between OLED devices on the substrate 10. DBR 12, first electrodes 14A, 14B and first color vias 16A, 16B remain intact on substrate 10.

Figure 10J:
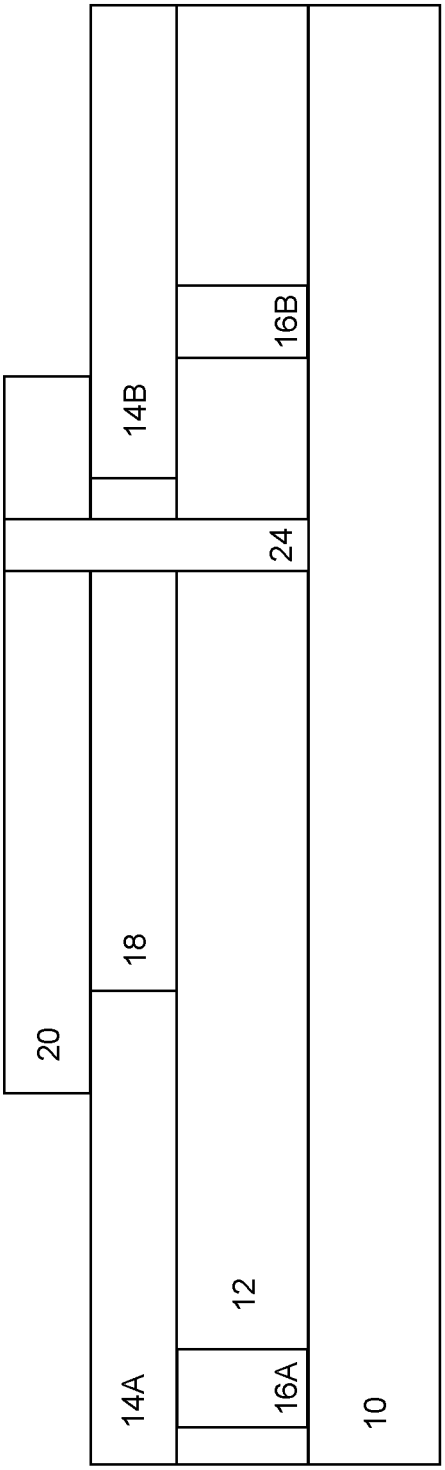
FIG. 10J illustrates step 9 of the proposed two color OLED array patterning process for forming a via for the second color electrode through the DBR, the first optical filler layer, and the second optical filler layer.
Figure 10K:
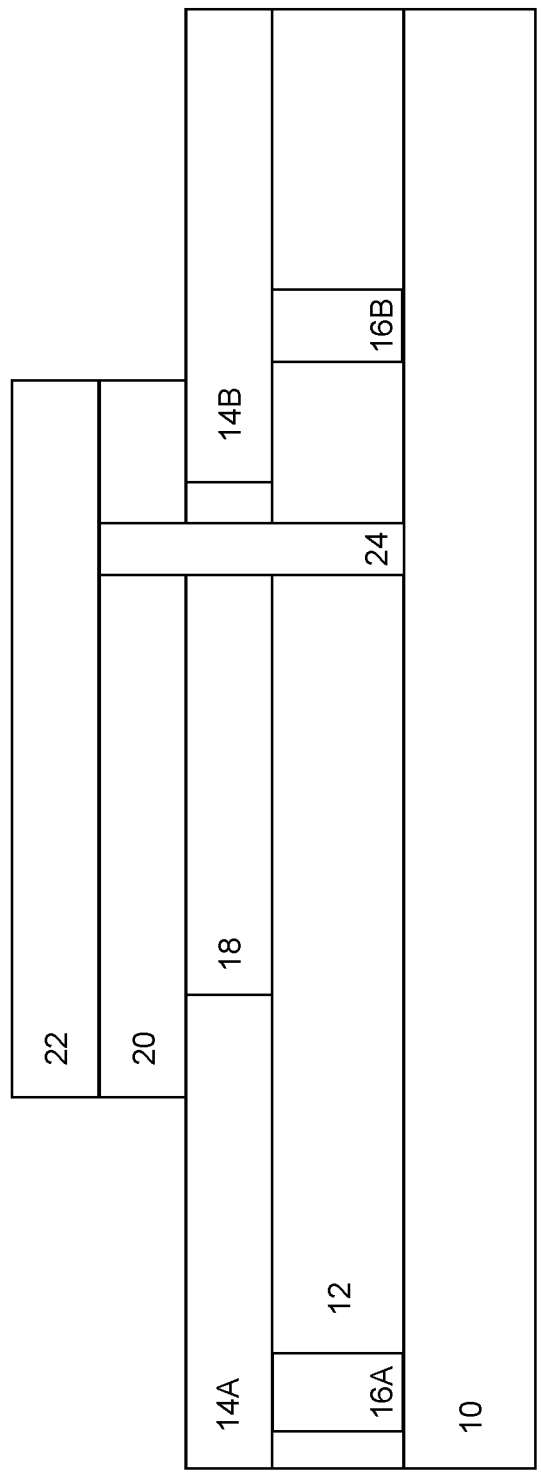
FIG. 10K illustrates step 10 of the proposed two color OLED array patterning process for depositing a second color electrode.

FIG. 10J illustrates the second color via 24 dry etched using reactive ion etching through first optical filler layer 18, second optical filler layer 20, and DBR 12. First electrodes 14A, 14B and first color vias 16A, 16B remain intact on substrate 10.

10K illustrates the second color electrode 22 deposited through sputtering on the second optical filler layer 20, wherein the width of the second color electrode 22 is approximately equal to the width of the second optical filler layer 20. The second color via 24 provides an electrical connection for the second color electrode 22 to the substrate 10. First optical filler layer 18, first color electrodes 14A, 14B, first color vias 16A, 16B, and the DBR 12 remain intact on substrate 10.

Figure 10L:
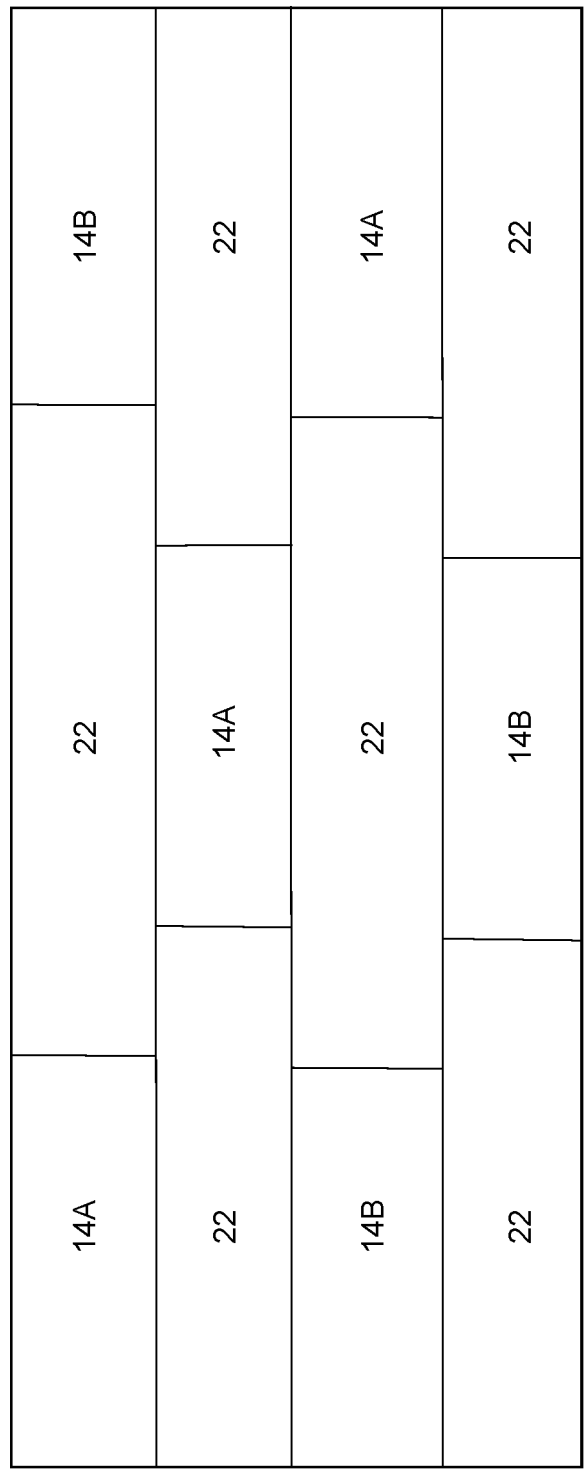
FIG. 10L illustrates a top view of step 10 of the proposed two color OLED array patterning process.

FIG. 10L illustrates a top view of the embodiment after the second color electrode 22 is deposited. The patterning of the first color electrodes 14A, 14B and second color electrode 22 allow for the minimal spacing between OLED devices on the OLED array. The colors emitted can be any of the colors on the visible light spectrum including but not limited to red, yellow, blue, and green. The preferred combination for a two-color array is yellow and blue emission.

Figure 10M:
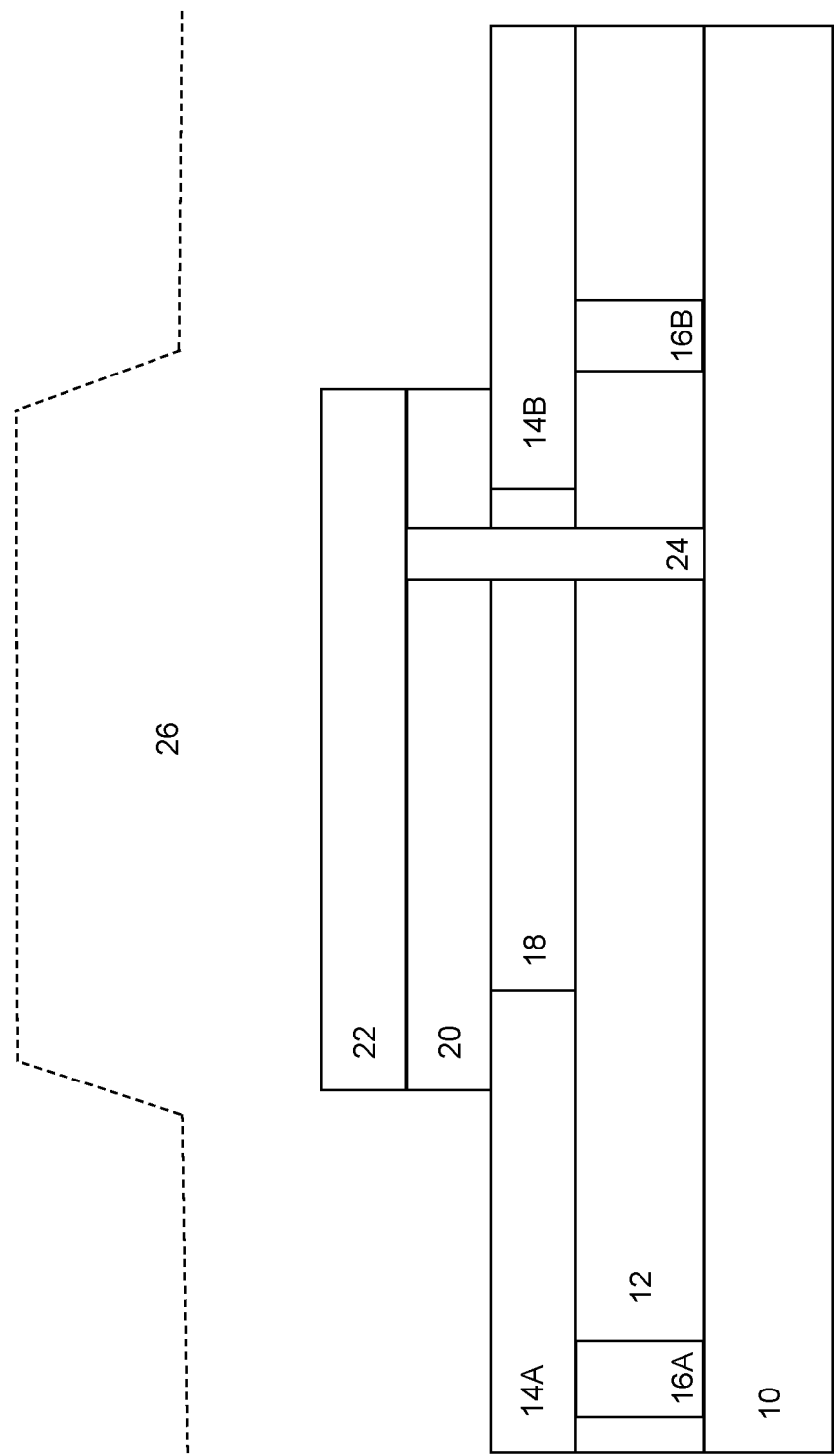
FIG. 10M illustrates step 11 of the proposed two color OLED array patterning process for depositing a white OLED stack.
Figure 10N:
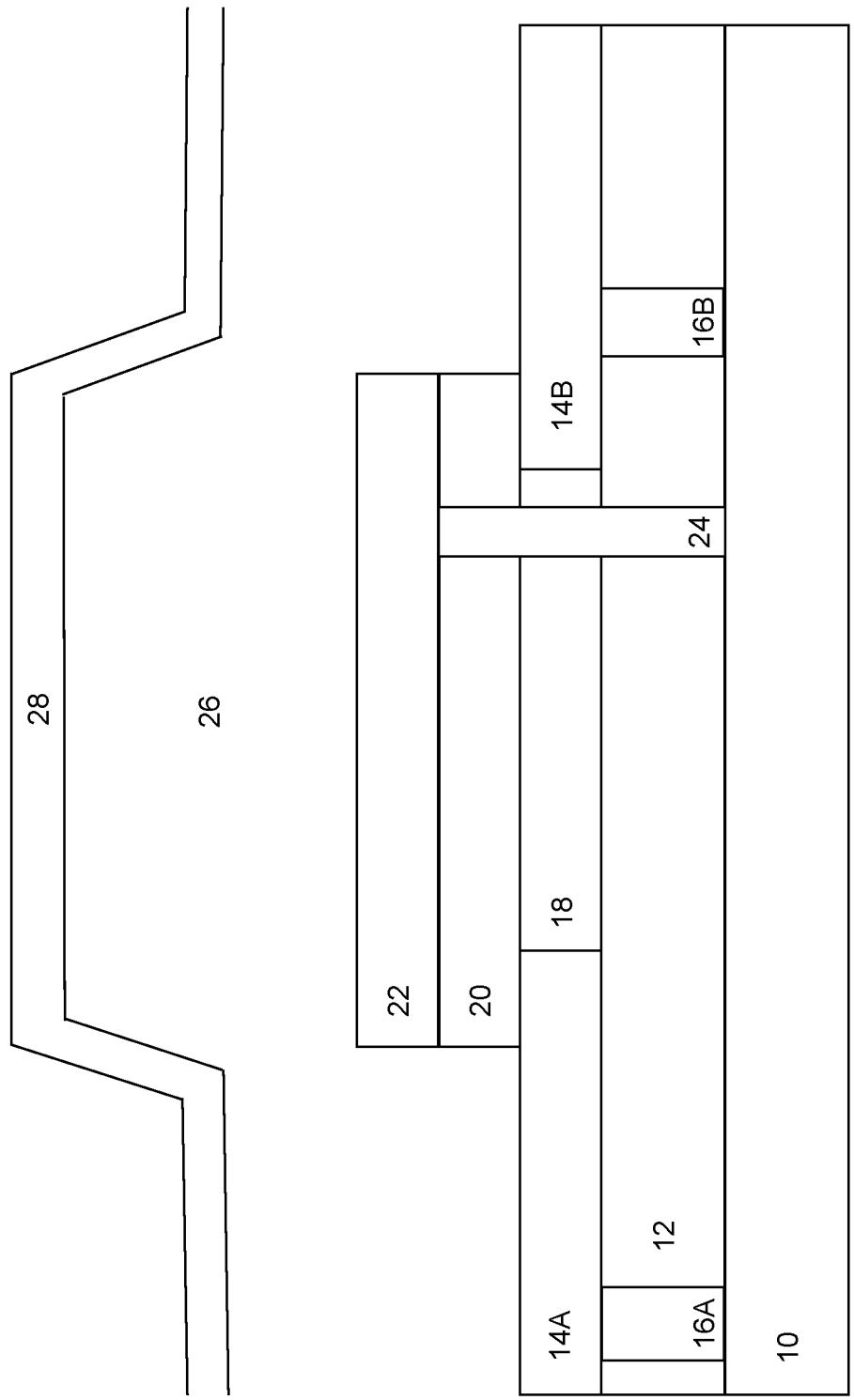
FIG. 10N illustrates step 12 of the proposed two color OLED array patterning process for depositing a cathode as the top reflective surface, forming the optical microcavity of the OLED array.

FIG. 10M illustrates a white OLED stack 26 deposited on top of the substrate 10 having already deposited thereon second color electrode 22, second optical filler layer 20, first optical filler layer 18, second color via 24, first color electrodes 14A, 14B, first color vias 16A, 16B, and DBR 12. White OLED stack 26 illustrated in FIG. 10M comprises of a series of layers of organic materials and each layer of the white OLED stack 26 can be deposited through thermal evaporation, spin casting, or inkjet printing.

FIG. 10N illustrates the final step in the fabrication process with the deposition of the cathode 28, creating the optical microcavity for each OLED device in the OLED array. The cathode 28 can be deposited through thermal evaporation and sputtering. In this embodiment, thermal evaporation is the preferred deposition method. The plurality of first and second color microcavities formed by second color electrode 22, second optical filler layer 20, first optical filler layer 18, second color via 24, first color electrodes 14A, 14B, first color vias 16A, 16B, and DBR 12 along with the white OLED stack 26 form the OLED array device on the substrate 10.

Figure 11C:
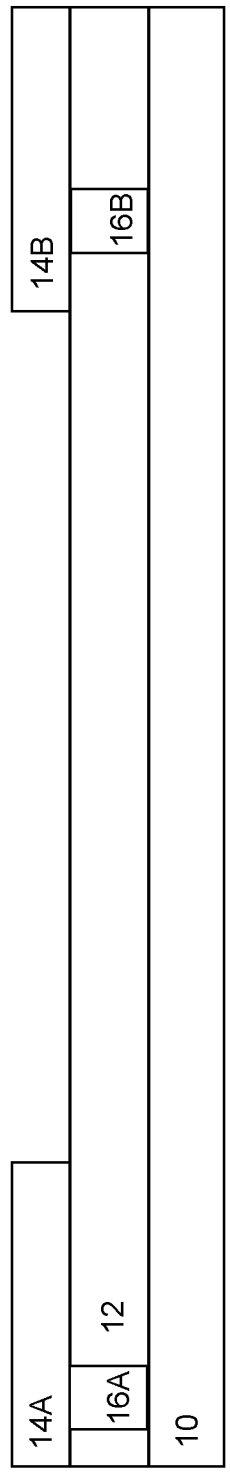
FIG. 11C illustrates step 3 of the proposed three color OLED array patterning process for depositing the first color electrode.
Figure 11D:
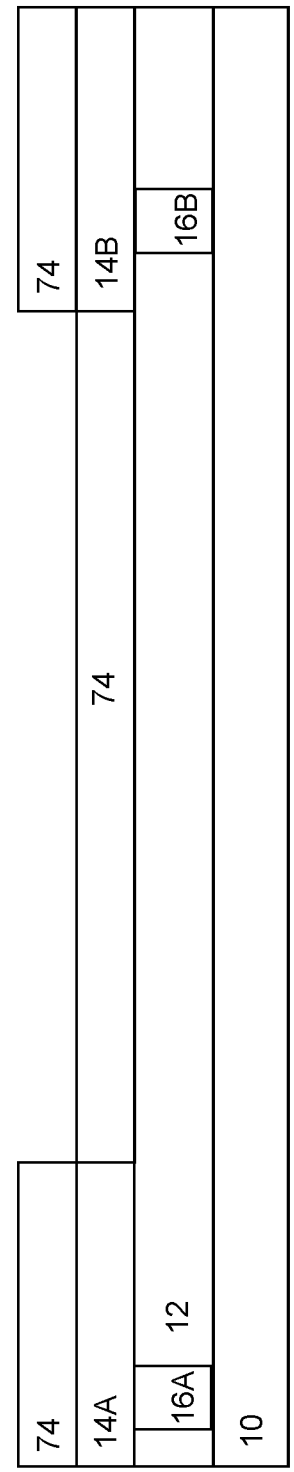
FIG. 11D illustrates step 4 of the proposed three color OLED array patterning process for depositing a photoresist.
Figure 11G:
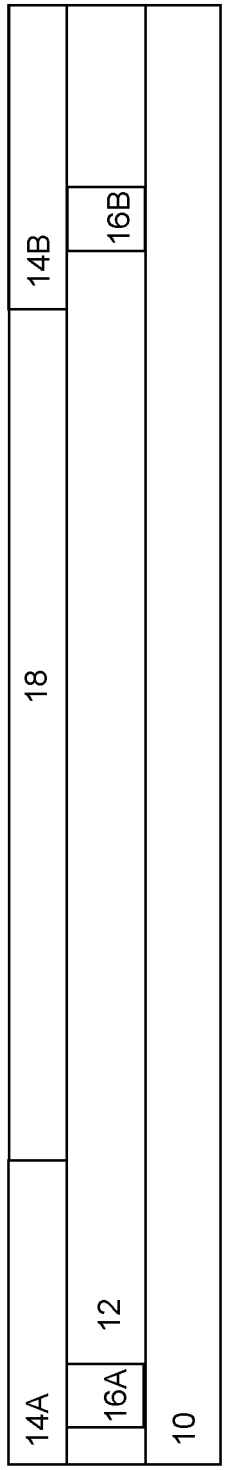
FIG. 11G illustrates step 7 of the proposed three color OLED array patterning process for a photolithography step, which lifts off the remaining photoresist thereby removing the first optical filler layer that was deposited on the photoresist.
Figure 11H:
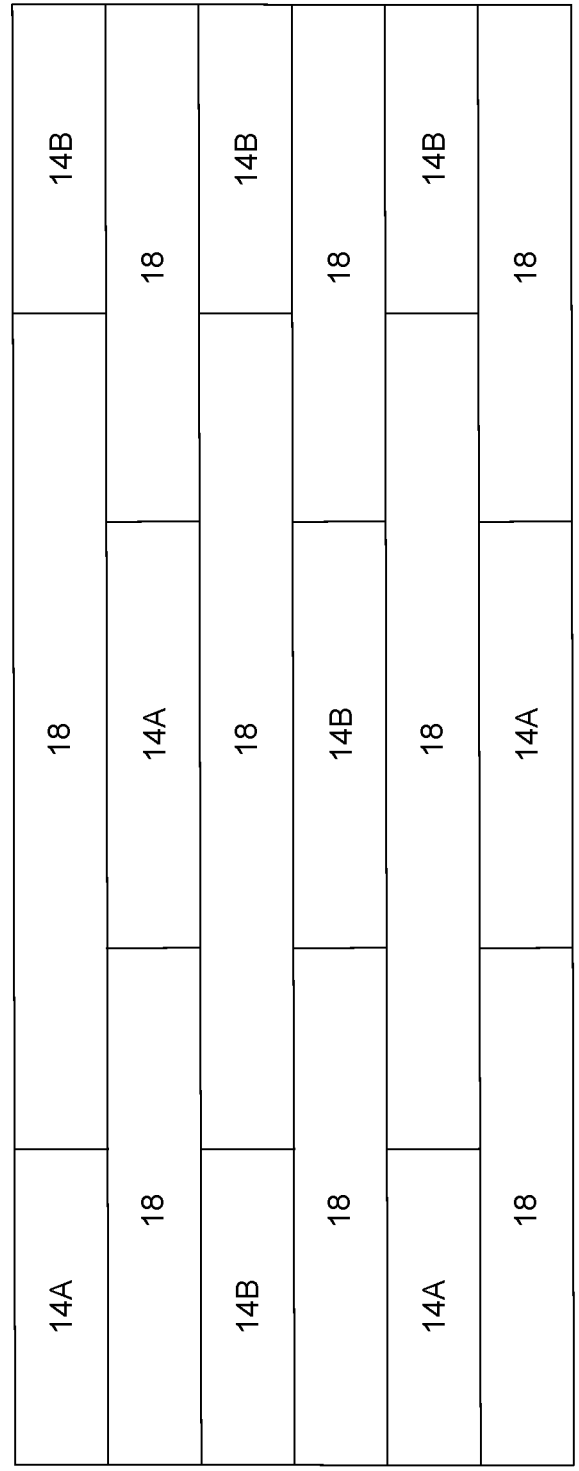
FIG. 11H illustrates a top view of step 7 of the proposed three color OLED array patterning process.
Figure 11K:
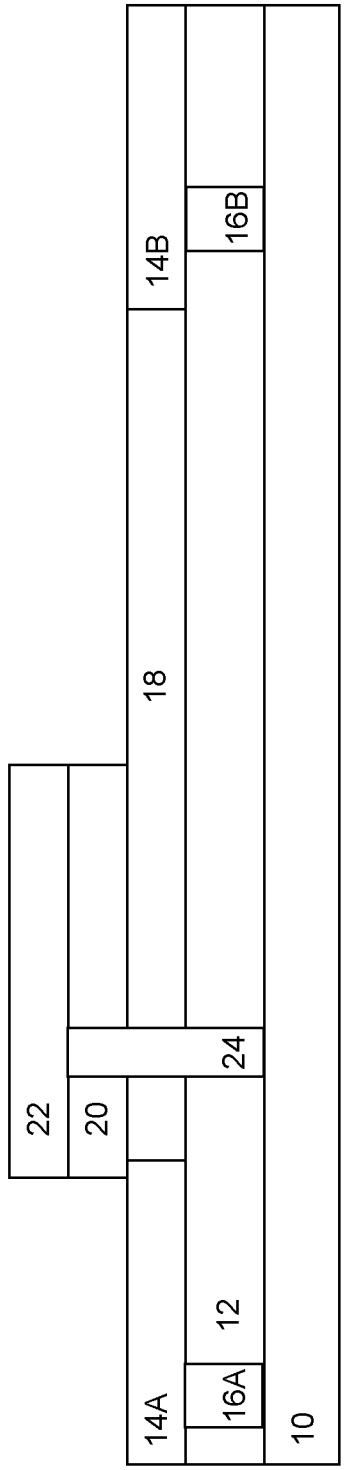
FIG. 11K illustrates step 10 of the proposed three color OLED array patterning process for depositing a second color electrode.
Figure 11L:
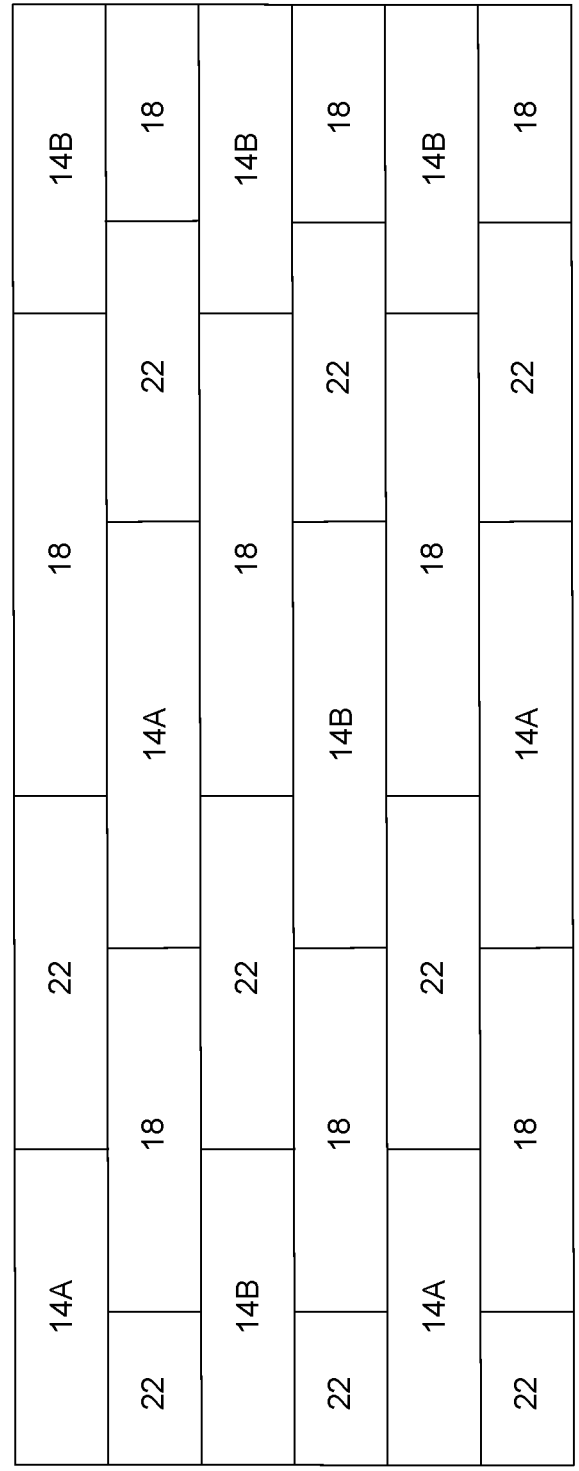
FIG. 11L illustrates a top view of step 10 of the proposed three color OLED array patterning process.
Figure 11M:
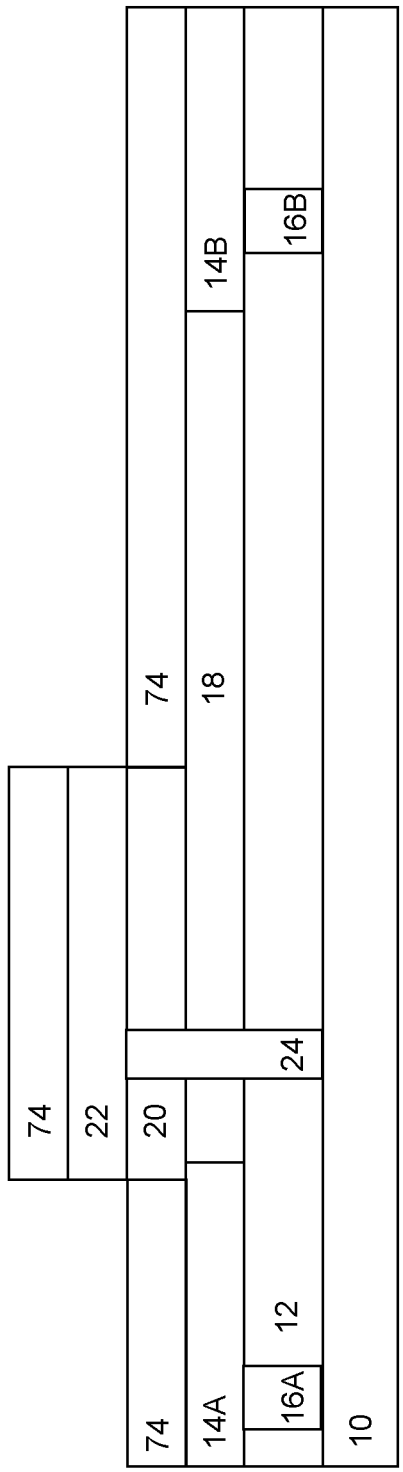
FIG. 11M illustrates step 11 of the proposed three color OLED array patterning process for depositing the photoresist.
Figure 11N:
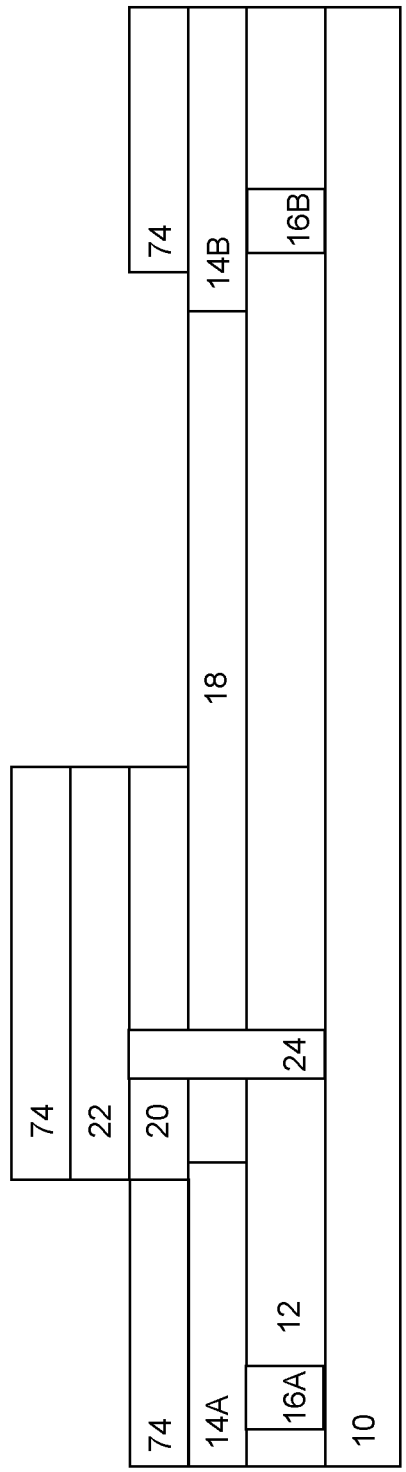
FIG. 11N illustrates step 12 of the proposed three color OLED array patterning process for a photolithography step, which partially exposes the embodiment to UV light thereby partially removing the photoresist through etching.
Figure 11O:
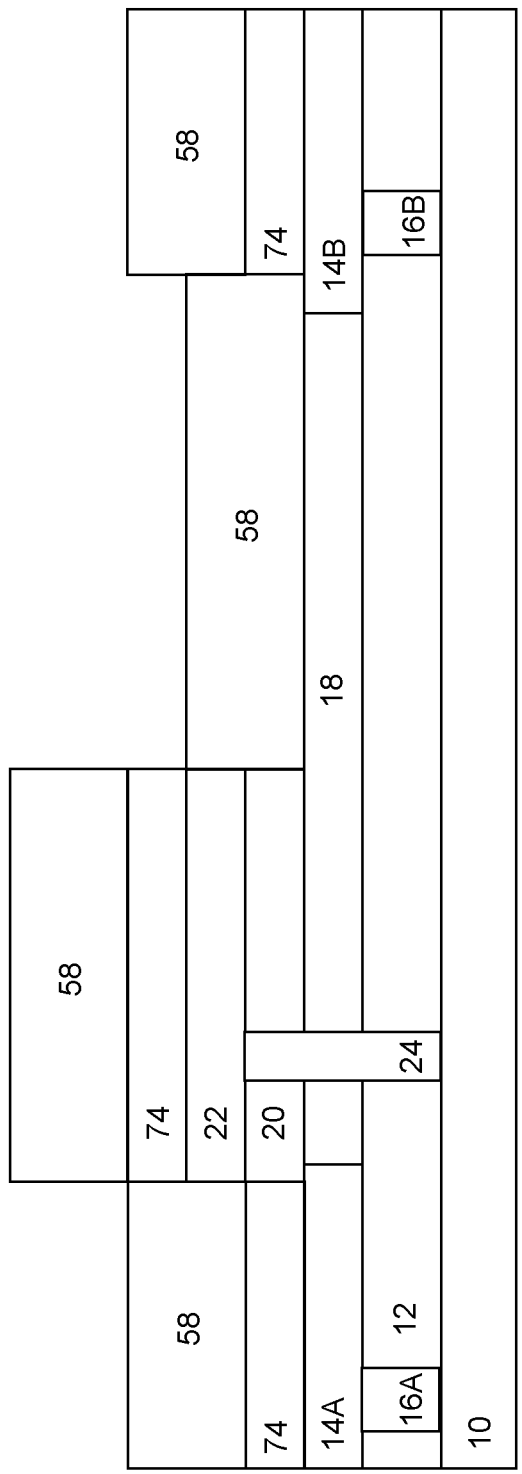
FIG. 11O illustrates step 13 of the proposed three color OLED array patterning process for depositing a third optical filler layer.
Figure 11P:
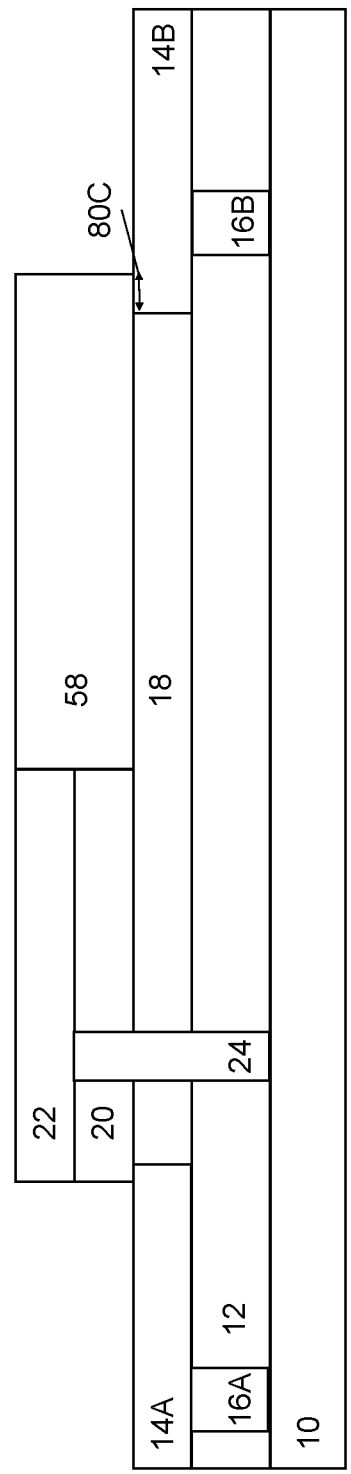
FIG. 11P illustrates step 14 of the proposed three color OLED array patterning process for a photolithography step, which lifts off the remaining photoresist thereby removing the third optical filler layer that was deposited on the photoresist.
Figure 11S:
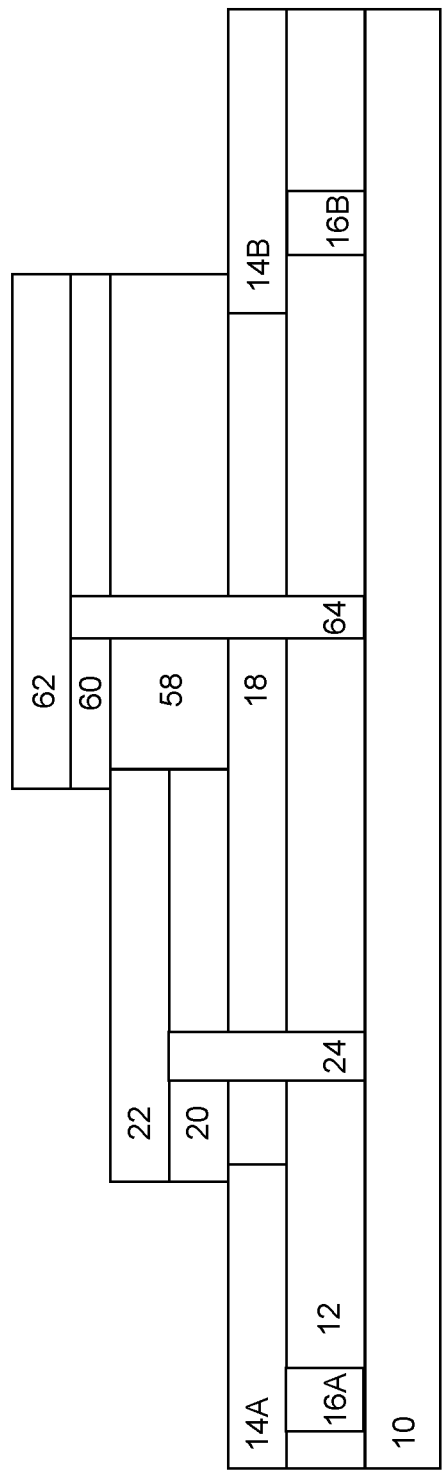
FIG. 11S illustrates step 17 of the proposed three color OLED array patterning process for depositing a third color electrode.
Figure 11T:
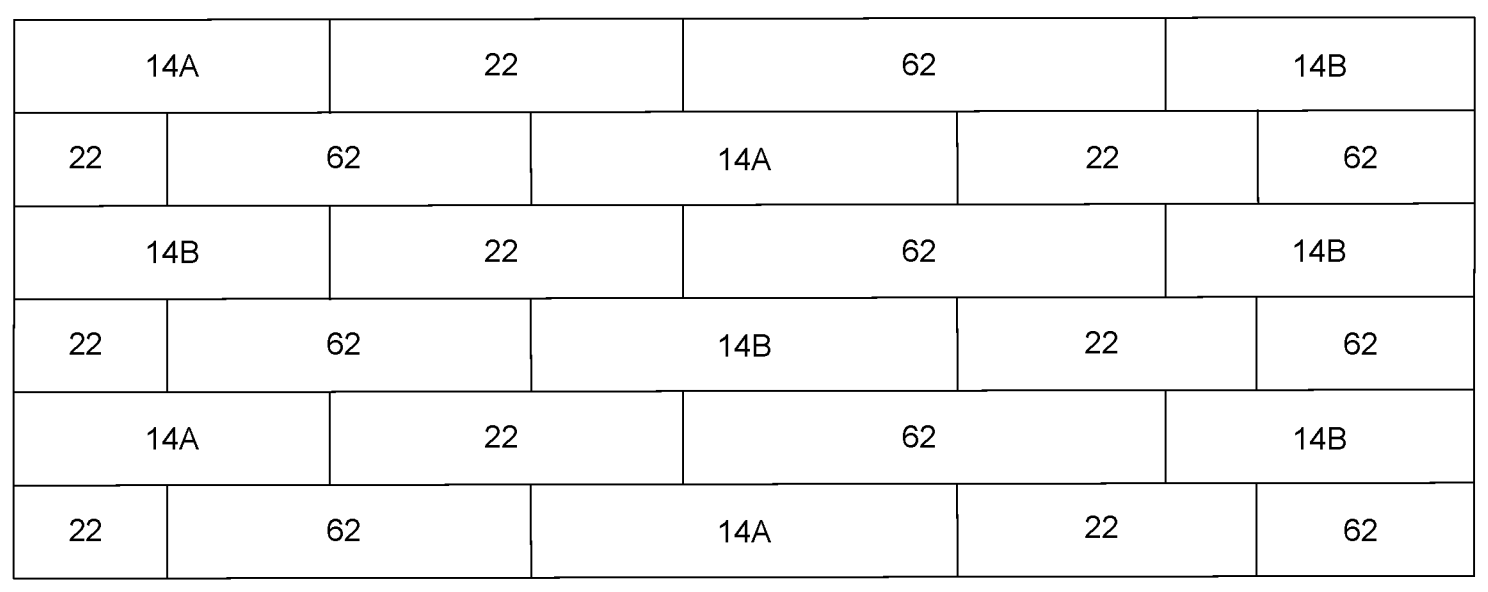
Figure 11U:
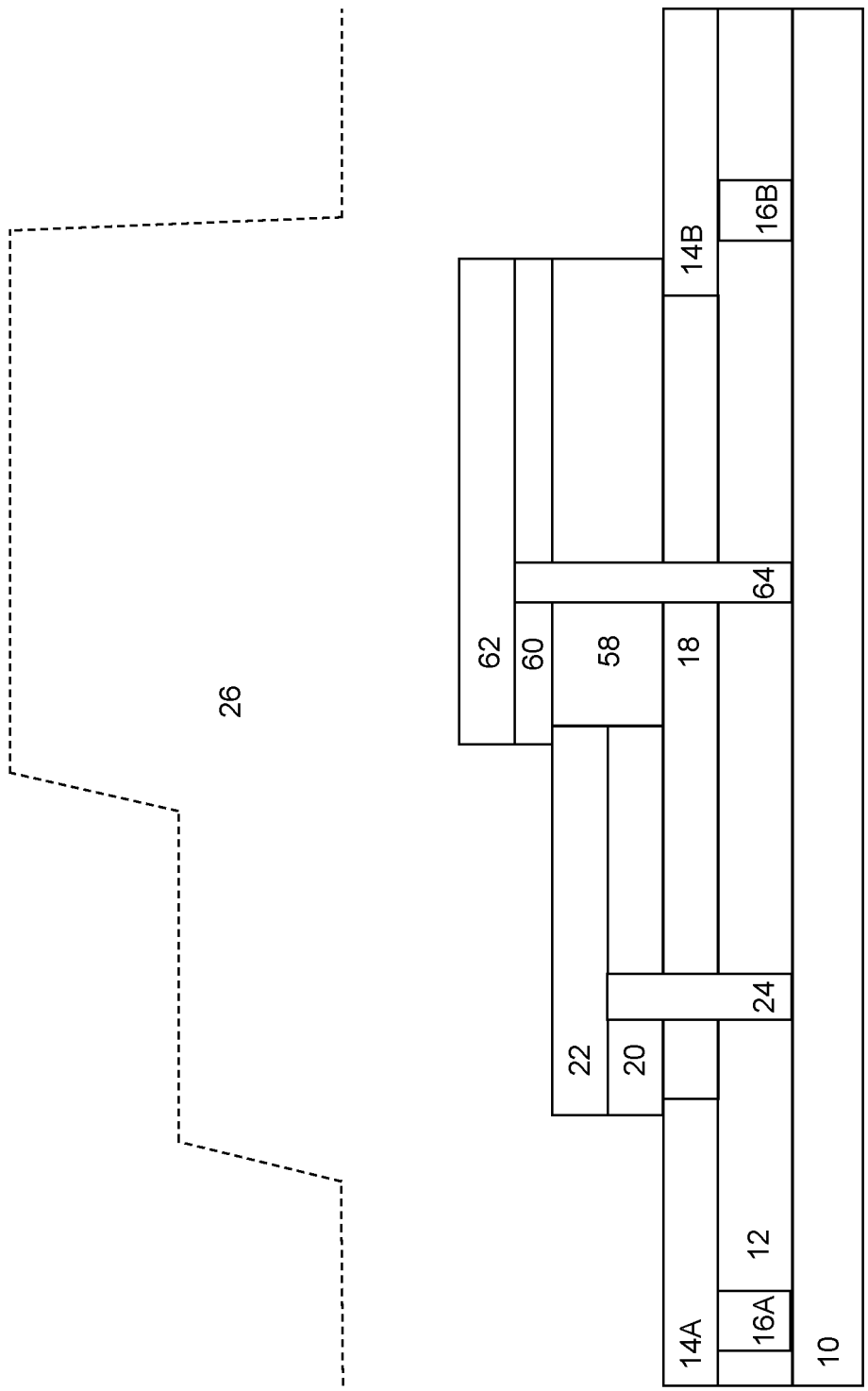
FIG. 11U illustrates step 18 of the proposed three color OLED array patterning process for depositing a white OLED stack.
Figure 11V:
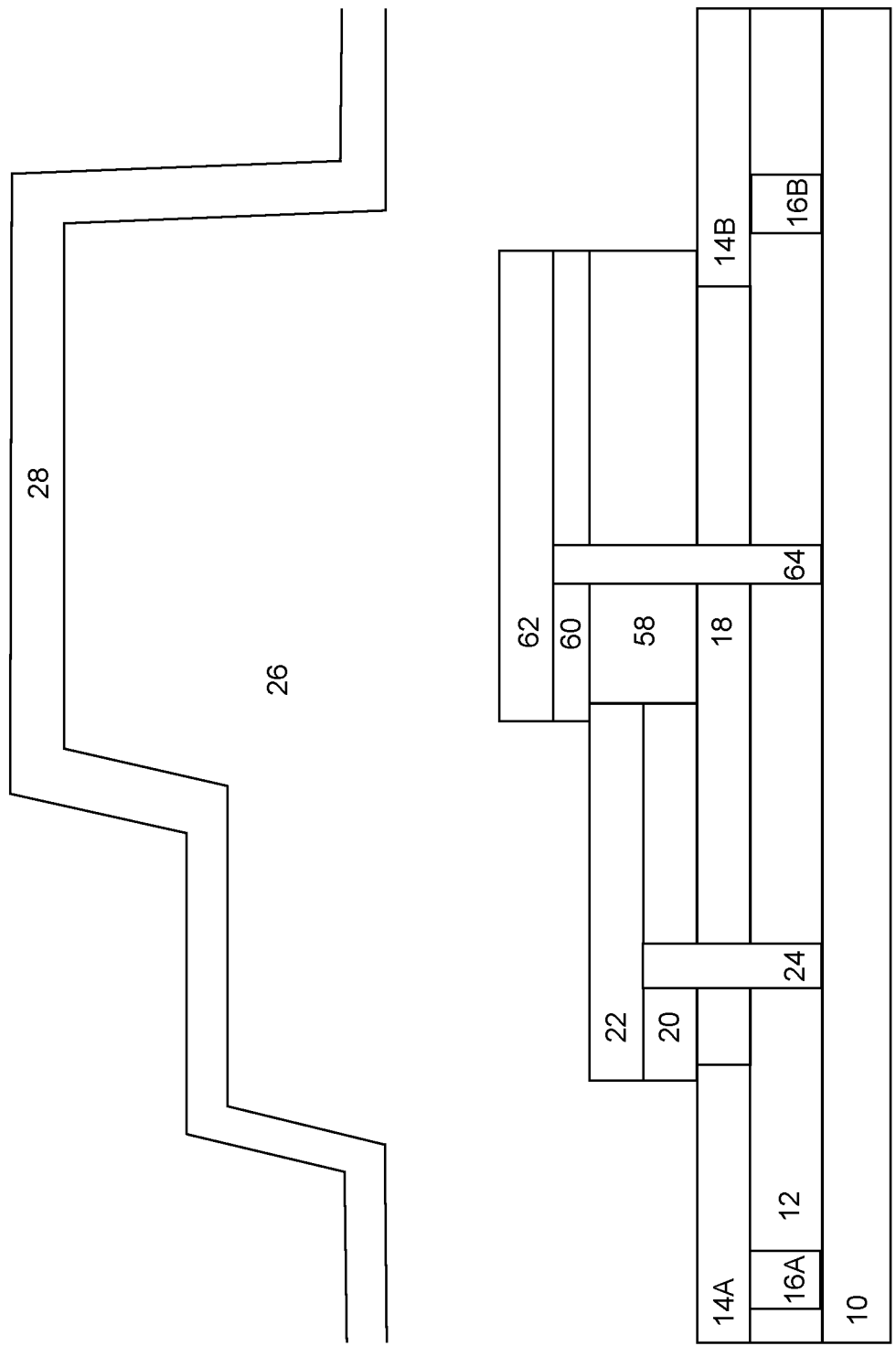
FIG. 11V illustrates step 19 of the proposed three color OLED array patterning process for depositing a cathode as the top reflective surface to form the optical microcavity of the OLED device.

FIGS. 11A-V illustrate a step-by-step process of fabricating a three color OLED array as per the present disclosure.

FIG. 11A illustrates the first step in fabrication, depositing the DBR 12 on the substrate 10. In this embodiment the substrate 10 is a TFT substrate, which is a device that forms the base structure of the embodiment. It is understood that the DBR 12 illustrated in FIG. 11A comprises of alternating high refractive index dielectric layers and low refractive index dielectric layers. Each layer of the DBR 12 can be deposited through sputtering, thermal evaporation, chemical vapor deposition, and atomic layer deposition. The preferred method of deposition for this embodiment is sputtering.

FIG. 11B illustrates the first color vias 16A, 16B dry etched through the DBR 12 to connect to the substrate 10. Each via may be etched by reactive ion etching, anodic plasma etching, magnetically enhanced reactive ion etching, triode reactive ion etching, and transmission-coupled plasma etching. In this embodiment, the preferred dry etching method is reactive ion etching.

FIG. 11C illustrates the first color electrodes 14A, 14B deposited on the DBR 12. The first color vias 16A, 16B provide an electrical connection for the first color electrodes 14A, 14B to the substrate 10. The electrodes can be patterned on through sputtering, thermal evaporation, and spin coating. In this embodiment sputtering is the preferred method of deposition.

FIGS. 11D-G illustrate a series of photolithography steps for patterning the first optical filler layer. It is understood that photolithography is a widely used fabrication technique and the steps as described in FIG. 10D-G may be repeated for the deposition of all optical filler layers disclosed herein.

FIG. 11D illustrates a cross sectional view of the embodiment following deposition of photoresist 74. Deposition may be achieved through spin coating deposition. Photoresist 74 is deposited on a structure comprising a substrate 10, having a DBR 12 deposited thereon with first color electrodes 14A, 14B stacked on the DBR 12 connected to the substrate 10 by first color vias 16A, 16B, respectively. In this embodiment, a photomask is applied with a design that has opaque sections in the pattern of the first color electrodes 14A, 14B.

In FIG. 11E the structure with the photomask is exposed to UV light, which causes a chemical change to the photoresist 74 adjacent to the first color electrodes 14A, 14B, making it soluble to etching. In this embodiment, photoresist 74 is a positive photoresist. First color electrodes 14A, 14B, first color vias 16A, 16B, and the layers of DBR 12 deposited on the substrate 10 remain intact.

FIG. 11F illustrates the deposition of the first optical filler layer 18 over the entire OLED array. The first optical filler layer 18 can be deposited through sputtering, thermal evaporation, chemical vapor deposition, atomic layer deposition.

The preferred method of deposition is sputtering, which allows the designer to precisely adjust the thickness of the layers during deposition. The substrate is then exposed to a stripping process that removes the photoresist 74 and the first optical filler layer 18 on top of the photoresist 74. The stripper can be a commercially available product that fragments and removes the photoresist 74 without damaging first optical filler layer 18, first color electrodes 14A, 14B, first color vias 16A, 16B, and the layers of DBR 12 deposited on the substrate 10.

FIG. 11G illustrates the embodiment after the remaining photoresist and the first optical filler layer 18 that was deposited on the photoresist were removed. First optical filler layer 18, first color electrodes 14A, 14B, first color vias 16A, 16B, and the layers of DBR 12 remain intact on the substrate 10.

FIG. 11H illustrates a top view of the embodiment after the photolithography steps are completed. The pattern of the first color electrodes 14A, 14B and the first optical filler layer 18 across the OLED array is shown, specifically how the patterning eliminates spacing between OLED devices in the OLED array.

FIG. 11I illustrates deposition of a second optical filler layer 20 partially on the first optical filler layer 18 and partially on the first color electrode 14A to form the overlap region 80A. The second optical filler layer 20 can be deposited through sputtering, thermal evaporation, chemical vapor deposition, atomic layer deposition. One preferred method of deposition is sputtering, which allows the designer to precisely adjust the thickness of the layers during deposition. The overlap region 80A provide tolerances that mitigate alignment errors in fabrication, thus increasing the aperture ratio of the display through reducing the lateral spacing between OLED devices on the substrate 10. First optical filler layer 18, first color electrodes 14A, 14B, first color vias 16A, 16B, and the layers of DBR 12 remain intact on the substrate 10.

FIG. 11J illustrates the second color via 24 formed by dry etching using reactive ion etching through the first optical filler layer 18, second optical filler layer 20, and the DBR 12. First color electrodes 14A, 14B, first color vias 16A, 16B, and the layers of DBR 12 remain intact on the substrate 10.

FIG. 11K illustrates deposition of second color electrode 22, for example by sputtering, on the second optical filler layer 20, wherein the width of the second color electrode 22 is approximately equal to the width of the second optical filler layer 20. The second color via 24 provides an electrical connection for the second color electrode 22 to the substrate 10. First optical filler layer 18, first color electrodes 14A, 14B, first color vias 16A, 16B, and the layers of DBR 12 remain intact on the substrate 10.

FIG. 11L illustrates a top view of the embodiment after the second color electrode 22 is deposited. The patterning of the first color electrodes 14A, 14B, and second color electrodes 22 and the first optical filler layer 18, where the third electrode will ultimately be deposited, allows for the minimal spacing between OLED optical microcavity devices on the OLED array.

FIGS. 11M-P illustrate a series of photolithography steps for patterning the third optical filler layer. It is understood that photolithography is a widely used fabrication technique and the steps as described in FIG. 10D-G may be repeated for the deposition of all optical filler layers disclosed herein.

FIG. 11M illustrates a cross sectional view of the embodiment following deposition of photoresist 74. Deposition may be achieved through spin coating deposition. Photoresist 74 is deposited on a structure comprising a substrate 10 which has a DBR 12 deposited thereon with first color electrodes 14A, 14B stacked upon the DBR 12 connected to the substrate 10 by first color vias 16A, 16B, respectively, first optical filler layer 18 deposited on the DBR 12 with the second optical filler layer 20 and the second color electrode 22 stacked upon the first optical filler layer 18, with the second color electrode 22 connected to the substrate 10 by second color via 24, respectively. The photomask is then applied with a design that has opaque sections in the pattern of the first color electrodes 14A, 14B and second color electrode 22 and partially covers the first color electrode 14B.

In FIG. 11N the structure with the photomask is exposed to UV light, which causes a chemical change to the photoresist 74, making it soluble to etching in the transparent regions of the photomask. In this embodiment, photoresist 74 is a positive photoresist. First optical filler layer 18, first color electrodes 14A, 14B, first color vias 16A, 16B, second optical filler layer 20, second color electrode 22, second color via 24, and the layers of DBR 12 remain intact on the substrate 10.

FIG. 11O illustrates the deposition of the third optical filler layer 58 on top of photoresist 74, which is deposited over the entire OLED array. The third optical filler layer 58 can be deposited, for example, through sputtering, thermal evaporation, chemical vapor deposition, or atomic layer deposition. One preferred method of deposition is sputtering which allows the designer to precisely adjust the thickness of the layers during deposition. The substrate 10 is then exposed to a stripping process that removes the photoresist 74 and the third optical filler layer 58 deposited on the photoresist 74. The stripper can be a commercially available product that fragments and removes the photoresist 74 without damaging the other layers underneath. First optical filler layer 18, first color electrodes 14A, 14B, first color vias 16A, 16B, second optical filler layer 20, second color electrode 22, second color via 24, and the layers of DBR 12 remain intact on the substrate 10.

FIG. 11P illustrates the substrate 10 and its deposited layers after the remaining photoresist and the third optical filler layer 58 that was deposited on the photoresist were removed. The remaining third optical filler layer 58 may partially cover the first optical filler layer 18 and the first color electrode 14B to form overlap region 80C. First optical filler layer 18, first color electrodes 14A, 14B, first color vias 16A, 16B, second optical filler layer 20, second color electrode 22, second color via 24, and the layers of DBR 12 remain intact on the substrate 10.

FIG. 11Q illustrates the fourth optical filler layer 60 deposited on the third optical filler layer 58 and may overlap the second color electrode 22, forming overlap region 80D. The fourth optical filler layer 60 can be deposited through, for example, sputtering, thermal evaporation, chemical vapor deposition, or atomic layer deposition. One preferred method of deposition is sputtering which allows the designer to precisely adjust the thickness of the layers during deposition. The overlap regions 80C, 80D may mitigate alignment errors in fabrication, thus increasing the aperture ratio of the display through reducing the lateral spacing between OLED devices on the substrate 10. First optical filler layer 18, first color electrodes 14A, 14B, first color vias 16A, 16B, second optical filler layer 20, second color electrode 22, second color via 24, and the layers of DBR 12 remain intact on the substrate 10.

FIG. 11R illustrates the third color via 64 dry etched using reactive ion etching through the first optical filler layer 18, third optical filler layer 58, fourth optical filler layer 60, and the DBR 12. First optical filler layer 18, first color electrodes 14A, 14B, first color vias 16A, 16B, second optical filler layer 20, second color electrode 22, and second color via 24 remain intact on the substrate 10.

FIG. 11S illustrates the third color electrode 62 deposited through sputtering, for example, on the fourth optical filler layer 60. The width of the third color electrode 62 is approximately equal to the width of the fourth optical filler layer 60. The third color via 64 provides an electrical connection for the third color electrode 62 to the substrate 10. First optical filler layer 18, first color electrodes 14A, 14B, first color vias 16A, 16B, second optical filler layer 20, second color electrode 22, second color via 24, third optical filler layer 58, and DBR 12 remain intact on the substrate 10.

FIG. 11T illustrates a top view after the third color electrode 62 is deposited. The patterning of the first color electrodes 14A, 14B, second color electrode 22, and third color electrode 62 allows for the minimal spacing between OLED devices on the OLED array. The colors emitted can be any of the colors on the visible light spectrum including but not limited to red, yellow, blue, and green. The preferred combination for a three color array is red, green, and blue emission.

FIG. 11U illustrates the white OLED stack 26 deposited over the entire OLED array. It is understood that the white OLED stack 26 illustrated in FIG. 11U preferably comprises a series of layers comprised of organic materials. Each layer of the white OLED stack 26 can be deposited through thermal evaporation, spin casting, and inkjet printing. For this embodiment, the preferred method is thermal evaporation. First optical filler layer 18, first color electrodes 14A, 14B, first color vias 16A, 16B, second optical filler layer 20, second color electrode 22, second color via 24, third optical filler layer 58, third color electrode 62, third color via 64, fourth optical filler layer 60, and DBR 12 remain intact on the substrate 10 underneath the white OLED stack 26.

FIG. 11V illustrates the final step in the fabrication process with the deposition of the cathode 28 on top of white OLED stack 26, creating the optical microcavity for each OLED device in the OLED array. The cathode 28 can be deposited through thermal evaporation and sputtering. In this embodiment, thermal evaporation is the preferred deposition method. First optical filler layer 18, first color electrodes 14A, 14B, first color vias 16A, 16B, second optical filler layer 20, second color electrode 22, second color via 24, third optical filler layer 58, third color electrode 62, third color via 64, fourth optical filler layer 60, and DBR 12 remain intact on the substrate 10.

All publications, patents and patent applications mentioned in this specification are indicative of the level of skill of those skilled in the art to which this invention pertains and are herein incorporated by reference. The reference to any prior art in this specification is not, and should not be taken as, an acknowledgement or any form of suggestion that such prior art forms part of the common general knowledge.

The invention being thus described, it will be obvious that the same may be varied in many ways. Such variations are not to be regarded as a departure from the scope of the invention, and all such modifications as would be obvious to one skilled in the art are intended to be included within the scope of the following claims.

We claim:

1. An organic light emitting diode device comprising:
   a substrate;
   a distributed Bragg reflector (DBR) on the substrate;
   a first color electrode on the DBR defining a first color microcavity, the first color electrode connected to the substrate through a first via;
   a first optical filler layer on the DBR, the first optical filler layer being adjacent the first color electrode on the DBR;
   a second optical filler layer on the first optical filler layer and partially overlapping the first color electrode at an overlap region;
   a second color electrode on the second optical filler layer defining a second color microcavity, the second color electrode connected to the substrate through a second via;
   a white organic light emitting diode (OLED) stack on top of the first color electrode and the second color electrode; and
   a top electrode on top of the white OLED stack.

2. The device of claim 1, wherein the second color electrode partially overlaps the first color electrode.

3. The device of claim 1, wherein the first color microcavity has a first color optical path length between the DBR and the top electrode through the first color electrode and the second color microcavity has a second color optical path length between the DBR and the top electrode through the second color electrode.

4. The device of claim 1, wherein the first color optical path length and the second first color optical path length are tuned to provide desired first color and second color pixels, respectively.

5. The device of claim 1, wherein the first optical filler layer and the second optical filler layer comprises a transparent polymer.

6. The device of claim 1, wherein the first optical filler layer and the second optical filler layer comprises a transparent inorganic dielectric.

7. The device of claim 1, further comprising a pixel definition layer insulating the first color electrode from the second color electrode.

8. The device of claim 7, wherein the pixel definition layer comprises one or more of an inorganic insulating dielectric and an organic material.

9. The device of claim 1, wherein the substrate is a thin film transistor (TFT) substrate.

10. The device of claim 1, further comprising a second DBR on top of the top electrode.

11. The device of claim 1, wherein the top electrode is a cathode and the bottom electrode is an anode.

12. The device of claim 1, wherein the top electrode is an anode and the bottom electrode is a cathode.

13. The device of claim 1, further comprising, on top of the second color electrode and under the white OLED stack:
   a third optical filler layer on the first optical filler layer defining a third color microcavity;
   a fourth optical filler layer on the third optical filler layer, the fourth optical filler layer partially overlapping the second color electrode; and
   a third color electrode on the fourth optical filler layer and partially overlapping the second color electrode, the third color electrode connected to the substrate through a third via.

14. A method for fabricating a multi-colored microcavity organic light emitting diode (OLED) array, the method comprising:

depositing a distributed Bragg reflector (DBR) on a substrate;

depositing a first color electrode on the DBR defining a first color microcavity, the first color electrode connected to the substrate through a first via;

depositing a first optical filler layer on the DBR, the first optical filler layer adjacent the first color electrode on the DBR;

depositing a second optical filler layer on the first optical filler layer partially overlapping the first color electrode at an overlap region;

depositing a second color electrode on the second optical filler layer defining a second color microcavity, the second color electrode connected to the substrate through a second via;

depositing a white organic light emitting diode (OLED) stack on top of the first color electrode and the second color electrode; and depositing a top electrode on top of the white OLED stack.

15. The method of claim 14, wherein the white OLED stack is deposited over the entire OLED array.

16. The method of claim 14, wherein the white OLED stack is deposited using thermal evaporation, spin casting, or inkjet printing.

17. The method of claim 14, wherein the top electrode is deposited using thermal evaporation or sputtering.

18. The method of claim 14, further comprising depositing a pixel definition layer insulating the first color electrode from the second color electrode.

19. The method of claim 18, wherein the pixel definition layer is deposited using sputtering, spin coating, thermal evaporation, chemical vapor deposition, atomic layer deposition, or spin casting.

20. The method of claim 14, further comprising depositing a second DBR on the top electrode.

21. The method of claim 14, wherein the first color electrode, the second color electrode, and the top electrode are deposited using sputtering, thermal evaporation, or spin coating.

22. The method of claim 14, wherein the first optical filler layer and the second optical filler layer are deposited using sputtering, thermal evaporation, chemical vapor deposition, or atomic layer deposition.

23. The method of claim 14, wherein the DBR is deposited using sputtering, thermal evaporation, chemical vapor deposition, or atomic layer deposition.

24. The method of claim 14, further comprising, prior to depositing the white OLED stack:

depositing a third optical filler layer selected for a third color on top of the first optical filler layer, the third optical filler layer overlapping the first color electrode;

depositing a fourth optical filler layer selected for a third color on top of the third optical filler layer, the fourth optical filler layer overlapping the second color electrode; and depositing a series of third color electrodes on the fourth optical filler layer.

* * * * *